(12) United States Patent
Hold et al.

(10) Patent No.: US 8,369,177 B2
(45) Date of Patent: Feb. 5, 2013

(54) TECHNIQUES FOR READING FROM AND/OR WRITING TO A SEMICONDUCTOR MEMORY DEVICE

(75) Inventors: Betina Hold, El Dorado Hills, CA (US); Robert Murray, Matthews, NC (US)

(73) Assignee: Micron Technology, Inc., Boise, ID (US)

( * ) Notice: Subject to any disclaimer, the term of this patent is extended or adjusted under 35 U.S.C. 154(b) by 317 days.

(21) Appl. No.: 12/718,310

(22) Filed: Mar. 5, 2010

(65) Prior Publication Data

US 2011/0216608 A1 Sep. 8, 2011

(51) Int. Cl.
*G11C 8/00* (2006.01)

(52) U.S. Cl. .......... 365/230.03; 365/205; 365/203; 365/177

(58) Field of Classification Search .......... 365/177, 365/203, 205, 230.03
See application file for complete search history.

(56) References Cited

U.S. PATENT DOCUMENTS

| | | |
|---|---|---|
| 3,439,214 A | 4/1969 | Kabell |
| 3,997,799 A | 12/1976 | Baker |
| 4,032,947 A | 6/1977 | Kesel et al. |
| 4,250,569 A | 2/1981 | Sasaki et al. |
| 4,262,340 A | 4/1981 | Sasaki et al. |
| 4,298,962 A | 11/1981 | Hamano et al. |
| 4,371,955 A | 2/1983 | Sasaki |
| 4,527,181 A | 7/1985 | Sasaki |
| 4,630,089 A | 12/1986 | Sasaki et al. |
| 4,658,377 A | 4/1987 | McElroy |
| 4,791,610 A | 12/1988 | Takemae |
| 4,807,195 A | 2/1989 | Busch et al. |
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |

(Continued)

FOREIGN PATENT DOCUMENTS

| | | |
|---|---|---|
| CA | 272437 | 7/1927 |
| EP | 0 030 856 | 6/1981 |

(Continued)

OTHER PUBLICATIONS

Arimoto et al., A Configurable Enhanced T2RAM Macro for System-Level Power Management Unified Memory, 2006, VLSI Symposium.

(Continued)

*Primary Examiner* — Hoai V Ho
(74) *Attorney, Agent, or Firm* — Wilmer Cutler Pickering Hale and Dorr LLP

(57) ABSTRACT

Techniques for reading from and/or writing to a semiconductor memory device are disclosed. In one particular exemplary embodiment, the techniques may be realized as an apparatus including a first memory cell array having a first plurality of memory cells arranged in a matrix of rows and columns and a second memory cell array having a second plurality of memory cells arranged in a matrix of row and columns. The apparatus may also include a data sense amplifier latch circuitry having a first input node and a second input node. The apparatus may further include a first bit line input circuitry configured to couple the first memory cell array to the first input node of the data sense amplifier latch circuitry and a second bit line input circuitry configured to couple the second memory cell array to the second input node of the data sense amplifier latch circuitry.

22 Claims, 25 Drawing Sheets

U.S. PATENT DOCUMENTS

| | | | |
|---|---|---|---|
| 5,258,635 A | 11/1993 | Nitayama et al. | |
| 5,313,432 A | 5/1994 | Lin et al. | |
| 5,315,541 A | 5/1994 | Harari et al. | |
| 5,350,938 A | 9/1994 | Matsukawa | |
| 5,355,330 A | 10/1994 | Hisamoto et al. | |
| 5,388,068 A | 2/1995 | Ghoshal et al. | |
| 5,397,726 A | 3/1995 | Bergemont et al. | |
| 5,432,730 A | 7/1995 | Shubat et al. | |
| 5,446,299 A | 8/1995 | Acovic et al. | |
| 5,448,513 A | 9/1995 | Hu et al. | |
| 5,466,625 A | 11/1995 | Hsieh et al. | |
| 5,489,792 A | 2/1996 | Hu et al. | |
| 5,506,436 A | 4/1996 | Hayashi et al. | |
| 5,515,383 A | 5/1996 | Katoozi | |
| 5,526,307 A | 6/1996 | Yiu et al. | |
| 5,528,062 A | 6/1996 | Hsieh et al. | |
| 5,568,356 A | 10/1996 | Schwartz | |
| 5,583,808 A | 12/1996 | Brahmbhatt | |
| 5,593,912 A | 1/1997 | Rajeevakumar | |
| 5,606,188 A | 2/1997 | Bronner et al. | |
| 5,608,250 A | 3/1997 | Kalnitsky | |
| 5,627,092 A | 5/1997 | Alsmeier et al. | |
| 5,631,186 A | 5/1997 | Park et al. | |
| 5,677,867 A | 10/1997 | Hazani | |
| 5,696,718 A | 12/1997 | Hartmann | |
| 5,740,099 A | 4/1998 | Tanigawa | |
| 5,754,469 A | 5/1998 | Hung et al. | |
| 5,774,411 A | 6/1998 | Hsieh et al. | |
| 5,778,243 A | 7/1998 | Aipperspach et al. | |
| 5,780,906 A | 7/1998 | Wu et al. | |
| 5,784,311 A | 7/1998 | Assaderaghi et al. | |
| 5,798,968 A | 8/1998 | Lee et al. | |
| 5,811,283 A | 9/1998 | Sun | |
| 5,847,411 A | 12/1998 | Morii | |
| 5,877,978 A | 3/1999 | Morishita et al. | |
| 5,886,376 A | 3/1999 | Acovic et al. | |
| 5,886,385 A | 3/1999 | Arisumi et al. | |
| 5,897,351 A | 4/1999 | Forbes | |
| 5,929,479 A | 7/1999 | Oyama | |
| 5,930,648 A | 7/1999 | Yang | |
| 5,936,265 A | 8/1999 | Koga | |
| 5,939,745 A | 8/1999 | Park et al. | |
| 5,943,258 A | 8/1999 | Houston et al. | |
| 5,943,581 A | 8/1999 | Lu et al. | |
| 5,960,265 A | 9/1999 | Acovic et al. | |
| 5,968,840 A | 10/1999 | Park et al. | |
| 5,977,578 A | 11/1999 | Tang | |
| 5,982,003 A | 11/1999 | Hu et al. | |
| 5,986,914 A | 11/1999 | McClure | |
| 6,018,172 A | 1/2000 | Hidada et al. | |
| 6,048,756 A | 4/2000 | Lee et al. | |
| 6,081,443 A | 6/2000 | Morishita | |
| 6,096,598 A | 8/2000 | Furukawa et al. | |
| 6,097,056 A | 8/2000 | Hsu et al. | |
| 6,097,624 A | 8/2000 | Chung et al. | |
| 6,111,778 A | 8/2000 | MacDonald et al. | |
| 6,121,077 A | 9/2000 | Hu et al. | |
| 6,133,597 A | 10/2000 | Li et al. | |
| 6,157,216 A | 12/2000 | Lattimore et al. | |
| 6,171,923 B1 | 1/2001 | Chi et al. | |
| 6,177,300 B1 | 1/2001 | Houston et al. | |
| 6,177,698 B1 | 1/2001 | Gruening et al. | |
| 6,177,708 B1 | 1/2001 | Kuang et al. | |
| 6,214,694 B1 | 4/2001 | Leobandung et al. | |
| 6,222,217 B1 | 4/2001 | Kunikiyo | |
| 6,225,158 B1 | 5/2001 | Furukawa et al. | |
| 6,245,613 B1 | 6/2001 | Hsu et al. | |
| 6,252,281 B1 | 6/2001 | Yamamoto et al. | |
| 6,262,935 B1 | 7/2001 | Parris et al. | |
| 6,292,424 B1 | 9/2001 | Ohsawa | |
| 6,297,090 B1 | 10/2001 | Kim | |
| 6,300,649 B1 | 10/2001 | Hu et al. | |
| 6,320,227 B1 | 11/2001 | Lee et al. | |
| 6,333,532 B1 | 12/2001 | Davari et al. | |
| 6,333,866 B1 | 12/2001 | Ogata | |
| 6,350,653 B1 | 2/2002 | Adkisson et al. | |
| 6,351,426 B1 | 2/2002 | Ohsawa | |
| 6,359,802 B1 | 3/2002 | Lu et al. | |
| 6,384,445 B1 | 5/2002 | Hidaka et al. | |
| 6,391,658 B1 | 5/2002 | Gates et al. | |
| 6,403,435 B1 | 6/2002 | Kang et al. | |
| 6,421,269 B1 | 7/2002 | Somasekhar et al. | |
| 6,424,011 B1 | 7/2002 | Assaderaghi et al. | |
| 6,424,016 B1 | 7/2002 | Houston | |
| 6,429,477 B1 | 8/2002 | Mandelman et al. | |
| 6,432,769 B1 | 8/2002 | Fukuda et al. | |
| 6,440,872 B1 | 8/2002 | Mandelman et al. | |
| 6,441,435 B1 | 8/2002 | Chan | |
| 6,441,436 B1 | 8/2002 | Wu et al. | |
| 6,466,511 B2 | 10/2002 | Fujita et al. | |
| 6,479,862 B1 | 11/2002 | King et al. | |
| 6,480,407 B1 | 11/2002 | Keeth | |
| 6,492,211 B1 | 12/2002 | Divakaruni et al. | |
| 6,518,105 B1 | 2/2003 | Yang et al. | |
| 6,531,754 B1 | 3/2003 | Nagano et al. | |
| 6,537,871 B2 | 3/2003 | Forbes | |
| 6,538,916 B2 | 3/2003 | Ohsawa | |
| 6,544,837 B1 | 4/2003 | Divakaruni et al. | |
| 6,548,848 B2 | 4/2003 | Horiguchi et al. | |
| 6,549,450 B1 | 4/2003 | Hsu et al. | |
| 6,552,398 B2 | 4/2003 | Hsu et al. | |
| 6,552,932 B1 | 4/2003 | Cernea | |
| 6,556,477 B2 | 4/2003 | Hsu et al. | |
| 6,560,142 B1 | 5/2003 | Ando | |
| 6,563,733 B2 | 5/2003 | Liu et al. | |
| 6,566,177 B1 | 5/2003 | Radens et al. | |
| 6,567,330 B2 | 5/2003 | Fujita et al. | |
| 6,573,566 B2 | 6/2003 | Ker et al. | |
| 6,574,135 B1 | 6/2003 | Komatsuzaki | |
| 6,590,258 B2 | 7/2003 | Divakauni et al. | |
| 6,590,259 B2 | 7/2003 | Adkisson et al. | |
| 6,617,651 B2 | 9/2003 | Ohsawa | |
| 6,621,725 B2 | 9/2003 | Ohsawa | |
| 6,632,723 B2 | 10/2003 | Watanabe et al. | |
| 6,650,565 B1 | 11/2003 | Ohsawa | |
| 6,653,175 B1 | 11/2003 | Nemati et al. | |
| 6,686,624 B2 | 2/2004 | Hsu | |
| 6,703,673 B2 | 3/2004 | Houston | |
| 6,707,118 B2 | 3/2004 | Muljono et al. | |
| 6,714,436 B1 | 3/2004 | Burnett et al. | |
| 6,721,222 B2 | 4/2004 | Somasekhar et al. | |
| 6,825,524 B1 | 11/2004 | Ikehashi et al. | |
| 6,861,689 B2 | 3/2005 | Burnett | |
| 6,870,225 B2 | 3/2005 | Bryant et al. | |
| 6,882,566 B2 | 4/2005 | Nejad et al. | |
| 6,888,770 B2 | 5/2005 | Ikehashi | |
| 6,894,913 B2 | 5/2005 | Yamauchi | |
| 6,897,098 B2 | 5/2005 | Hareland et al. | |
| 6,903,984 B1 | 6/2005 | Tang et al. | |
| 6,909,151 B2 | 6/2005 | Hareland et al. | |
| 6,912,150 B2 | 6/2005 | Portmann et al. | |
| 6,913,964 B2 | 7/2005 | Hsu | |
| 6,936,508 B2 | 8/2005 | Visokay et al. | |
| 6,969,662 B2 | 11/2005 | Fazan et al. | |
| 6,975,536 B2 | 12/2005 | Maayan et al. | |
| 6,982,902 B2 | 1/2006 | Gogl et al. | |
| 6,987,041 B2 | 1/2006 | Ohkawa | |
| 7,030,436 B2 | 4/2006 | Forbes | |
| 7,037,790 B2 | 5/2006 | Chang et al. | |
| 7,041,538 B2 | 5/2006 | Ieong et al. | |
| 7,042,765 B2 | 5/2006 | Sibigtroth et al. | |
| 7,061,806 B2 | 6/2006 | Tang et al. | |
| 7,085,153 B2 | 8/2006 | Ferrant et al. | |
| 7,085,156 B2 | 8/2006 | Ferrant et al. | |
| 7,170,807 B2 | 1/2007 | Fazan et al. | |
| 7,177,175 B2 | 2/2007 | Fazan et al. | |
| 7,187,581 B2 | 3/2007 | Ferrant et al. | |
| 7,230,846 B2 | 6/2007 | Keshavarzi | |
| 7,233,024 B2 | 6/2007 | Scheuerlein et al. | |
| 7,256,459 B2 | 8/2007 | Shino | |
| 7,301,803 B2 | 11/2007 | Okhonin et al. | |
| 7,301,838 B2 | 11/2007 | Waller | |
| 7,317,641 B2 | 1/2008 | Scheuerlein | |
| 7,324,387 B1 | 1/2008 | Bergemont et al. | |
| 7,335,934 B2 | 2/2008 | Fazan | |
| 7,341,904 B2 | 3/2008 | Willer | |
| 7,416,943 B2 | 8/2008 | Figura et al. | |

| | | |
|---|---|---|
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee |
| 2004/0029335 A1 | 2/2004 | Lee et al. |
| 2004/0075143 A1 | 4/2004 | Bae et al. |
| 2004/0108532 A1 | 6/2004 | Forbes et al. |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 | 11/2007 | Morishita et al. |
| 2007/0278578 A1 | 12/2007 | Yoshida et al. |
| 2008/0049486 A1 | 2/2008 | Gruening-von Schwerin |
| 2008/0049529 A1* | 2/2008 | Ohsawa ........................ 365/205 |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Demi et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2008/0316848 A1* | 12/2008 | Ohsawa ........................ 365/222 |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0168576 A1* | 7/2009 | Fujita et al. ................... 365/207 |
| 2009/0201723 A1 | 8/2009 | Okhonin et al. |
| 2009/0262587 A1* | 10/2009 | Park et al. ................. 365/189.09 |
| 2010/0085813 A1 | 4/2010 | Shino |
| 2010/0091586 A1 | 4/2010 | Carman |
| 2010/0110816 A1 | 5/2010 | Nautiyal et al. |
| 2010/0177573 A1* | 7/2010 | Matsuoka et al. ........ 365/189.05 |

FOREIGN PATENT DOCUMENTS

| | | |
|---|---|---|
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |
| EP | 0 606 758 | 9/2000 |
| EP | 0 682 370 | 9/2000 |

| | | |
|---|---|---|
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto, A High-Density Scalable Twin Transistor RAM (TTRAM) With Verify Control for SOI Platform Memory IPs, Nov. 2007, Solid-State Circuits.

Asian Technology Information Program (ATIP) Scoops™, "Novel Capacitorless 1T-DRAM From Single-Gate PD-SOI to Double-Gate FinDRAM", May 9, 2005, 9 pages.

Assaderaghi et al., "A Dynamic Threshold Voltage MOSFET (DTMOS) for Ultra-Low Voltage Operation", IEEE IEDM, 1994, pp. 809-812.

Assaderaghi et al., "A Dynamic Threshold Voltage MOSFET (DTMOS) for Very Low Voltage Operation", IEEE Electron Device Letters, vol. 15, No. 12, Dec. 1994, pp. 510-512.

Assaderaghi et al., "A Novel Silicon-On-Insulator (SOI) MOSFET for Ultra Low Voltage Operation", 1994 IEEE Symposium on Low Power Electronics, pp. 58-59.

Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.

Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.

Avci, Floating Body Cell (FBC) Memory for 16-nm Technology with Low Variation on Thin Silicon and 10-nm BOX, Oct. 2008, SOI Conference.

Bae, Evaluation of 1T RAM using Various Operation Methods with SOONO (Silicon-On-ONO) device, Dec. 2008, IEDM.

Ban, A Scaled Floating Body Cell (FBC) Memory with High-k+Metal Gate on Thin-Silicon and Thin-BOX for 16-nm Technology Node and Beyond, Jun. 2008, VLSI Symposium.

Ban, Ibrahim, et al., "Floating Body Cell with Independently-Controlled Double Gates for High Density Memory," Electron Devices Meeting, 2006. IEDM '06. International, IEEE, Dec. 11-13, 2006.

Bawedin, Maryline, et al., A Capacitorless 1T DRAM on SOI Based on Dynamic Coupling and Double-Gate Operation, IEEE Electron Device Letters, vol. 29, No. 7, Jul. 2008.

Blagojevic et al., Capacitorless 1T DRAM Sensing Scheme Automatice Reference Generation, 2006, IEEE J.Solid State Circuits.

Blalock, T., "A High-Speed Clamped Bit-Line Current-Mode Sense Amplifier", IEEE Journal of Solid-State Circuits, vol. 26, No. 4, Apr. 1991, pp. 542-548.

Butt, Scaling Limits of Double Gate and Surround Gate Z-RAM Cells, 2007, IEEE Trans. on El. Dev.

Chan et al., "Effects of Floating Body on Double Polysilicon Partially Depleted SOI Nonvolatile Memory Cell", IEEE Electron Device Letters, vol. 24, No. 2, Feb. 2003, pp. 75-77.

Chan, et al., "SOI MOSFET Design for All-Dimensional Scaling with Short Channel, Narrow Width and Ultra-thin Films", IEEE IEDM, 1995, pp. 631-634.

Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.

Cho et al., "Novel DRAM Cell with Amplified Capacitor for Embedded Application", IEEE, Jun. 2009.

Cho, A novel capacitor-less DRAM cell using Thin Capacitively-Coupled Thyristor (TCCT), 2005, IEDM.

Choi et al., Current Flow Mechanism in Schottky-Barrier MOSFET and Application to the 1T-DRAM, 2008, SSDM.

Choi, High Speed Flash Memory and 1T-DRAM on Dopant Segregated Schottky Barrier (DSSB) FinFET SONOS Device for Multifunctional SoC Applications, Dec. 2008, IEDM.

Clarke, Junctionless Transistors Could Simply Chip Making, Say Researchers, EE Times, Feb. 2010, www.eetimes.com/showArticle.jhtml?articleID=223100050.

Colinge, J.P., "An SOI voltage-controlled bipolar-MOS device", IEEE Transactions on Electron Devices, vol. ED-34, No. 4, Apr. 1987, pp. 845-849.

Colinge, Nanowire Transistors Without Junctions, Nature NanoTechnology, vol. 5, 2010, pp. 225-229.

Collaert et al., Optimizing the Readout Bias for the Capacitorless 1T Bulk FinFET RAM Cell, 2009, IEEE EDL.

Collaert, Comparison of scaled floating body RAM architectures, Oct. 2008, SOI Conference.

Ershov, Optimization of Substrate Doping for Back-Gate Control in SOI T-RAM Memory Technology, 2005, SOI Conference.

Ertosun et al., A Highly Scalable Capacitorless Double Gate Quantum Well Single Transistor DRAM: 1T-QW DRAM, 2008, IEEE EDL.

Fazan et al., "A Simple 1-Transistor Capacitor-Less Memory Cell for High Performance Embedded DRAMs", IEEE 2002 Custom Integrated Circuits Conference, Jun. 2002, pp. 99-102.

Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-RAM Floating Body Memory, 2006, SOI Conference.

Fisch, Carman, Customizing SOI Floating Body Memory Architecture for System Performance and Lower Cost, 2006, Same.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. on El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI Flash Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces Responsible for Junction Leakage on SOI, May 2009, ICSI.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two- Transistor Floating Body/Gate Cell for Low Power Nanoscale Embedded DRAM, 2008, IEEE Trans. on El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMO Devices, Oct. 2009, SOI conference.

Morishita, A Capacitorless Twin-Transistor Random Access Memory (TTRAM) on SOI, 2005, CICC.

Morishita, F. et al., "A Configurable Enhanced TTRAM Macro for System-Level Power Management Unified Memory", IEEE Journal of Solid -State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.
Nemati, Embedded Volatile Memories-Embedded Tutorial: The New Memory Revolution, New Drives Circuits and Systems, ICCAD 2008, Nov. 2008.
Nemati, Fully Planar 0.562µm2 T-RAM Cell in a 130nm SOI CMOS Logic Technology for High-Density High-Performance SRAMs, 2004, IEDM.
Nemati, The New Memory Revolution. New Devices, Circuits and Systems, 2008, ICCAD.
Nemati, Thyristor RAM (T-RAM): A High-Speed High-Density Embedded Memory Technology for Nano-scale CMOS, 2007, Hot Chips.
Nemati, Thyristor-RAM: A Novel Embedded Memory Technology that Outperforms Embedded S RAM/DRAM, 2008, Linley Tech Tour.
Nishiguchi et al., Long Retention of Gain-Cell Dynamic Random Access Memory with Undoped Memory Node, 2007, IEEE EDL.
Oh, Floating Body DRAM Characteristics of Silicon-On-ONO (SOONO) Devices for System-on-Chip (SoC) Applications, 2007, VLSI Symposium.
Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.
Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).
Ohsawa et al., "Memory Design Using a One-Transistor Gain Cell on SOI", IEEE Journal of Solid-State Circuits, vol. 37, No. 11, Nov. 2002, pp. 1510-1522.
Ohsawa, A 128Mb Floating Body RAM (FBRAM) on SOI with a Multi-Averaging Scheme of Dummy Cell, 2006 Symposium of VLSI Circuits Digest of Tech Papers, (2006).
Ohsawa, An 18.5ns 128Mb SOI DRAM with a Floating Body Cell, 2005, ISSCC.
Ohsawa, Autonomous Refresh of Floating Body Cell (FBC), Dec. 2008, IEDM.
Ohsawa, Design of a 128-Mb SOI DRAM Using the Floating Body Cell (FBC), Jan. 2006, Solid-State Circuits.
Okhonin, A Capacitor-Less 1T-DRAM Cell, Feb. 2002, Electron Device Letters.
Okhonin, A SOI Capacitor-less 1T-DRAM Concept, 2001, SOI Conference.
Okhonin, Charge Pumping Effects in Partially Depleted SOI MOSFETs, 2003, SOI Conference.
Okhonin, New characterization techniques for SOI and related devices, 2003, ECCTD.
Okhonin, New Generation of Z-RAM, 2007, IEDM.
Okhonin, Principles of Transient Charge Pumping on Partially Depleted SOI MOSFETs, May 2002, Electron Device Letters.
Okhonin, Transient Charge Pumping for Partially and Fully Depleted SOI MOSFETs, 2002, SOI Conference.
Okhonin, Transient effects in PD SOI MOSFETs and potential DRAM applications, 2002, Solid-State Electronics.
Okhonin, Ultra-scaled Z-RAM cell, 2008, SOI Conference.
Okhonin, Z-RAM® (Limits of DRAM), 2009, ESSDERC.
Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.
Park, Fully Depleted Double-Gate 1T-DRAM Cell with NVM Function for High Performance and High Density Embedded DRAM, 2009, IMW.
Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.
Portmann et al., "A SOI Current Memory for Analog Signal Processing at High Temperature", 1999 IEEE International SOI Conference, Oct. 1999, pp. 18-19.
Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.
Puget, FDSOI Floating Body Cell eDRAM Using Gate-Induced Drain-Leakage (GIDL) Write Current for High Speed and Low Power Applications, 2009, IMW.
Ranica et al., 1T-Bulk DRAM cell with improved performances: the way to scaling, 2005, ICMTD.
Ranica, A capacitor-less DRAM cell on 75nm gate length, 16nm thin Fully Depleted SOI device for high density embedded memories, 2004, IEDM.
Ranica, A One Transistor Cell on Bulk Substrate (1T-Bulk) for Low-Cost and High Density eDRAM, 2004, VLSI Symposium.
Rodder et al., "Silicon-On-Insulator Bipolar Transistors", IEEE Electron Device Letters, vol. EDL-4, No. 6, Jun. 1983, pp. 193-195.
Rodriguez, Noel, et al., A-RAM Novel Capacitor-less Dram Memory, SOI Conference, 2009 IEEE International, Oct. 5-8, 2009 pp. 1-2.
Roy, Thyristor-Based Volatile Memory in Nano-Scale CMOS, 2006, ISSCC.
Salling et al., Reliability of Thyristor Based Memory Cells, 2009, IRPS.
Sasaki et al., Charge Pumping in SOS-MOS Transistors, 1981, IEEE Trans. on El. Dev.
Sasaki et al., Charge Pumping SOS-MOS Transistor Memory, 1978, IEDM.
Schloesser et al., "A 6F2 Buried Wordline DRAM Cell for 40nm and Beyond", IEEE, Qimonda Dresden GmbH & Co., pp. 809-812 (2008).
Shino et al., Floating Body RAM technology and its scalability to 32 nm node and beyond, 2006, IEDM.
Shino et al., Operation Voltage Dependence of Memory Cell Characteristics in Fully Depleted FBC, 2005, IEEE Trans. on El. Dev.
Shino, Fully-Depleted FBC (Floating Body Cell) with Enlarged Signal Window and Excellent Logic Process Compatibility, 2004, IEDM.
Shino, Highly Scalable FBC (Floating Body Cell) with 25nm BOX Structure for Embedded DRAM Applications, 2004, VLSI Symposium.
Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.
Singh, A 2ns-Read-Latency 4Mb Embedded Floating-Body Memory Macro in 45nm SOI Technology, Feb. 2009, ISSCC.
Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.
Song, 55 nm Capacitor-less 1T DRAM Cell Transistor with Non-Overlap Structure, Dec. 2008, IEDM.
Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.
Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).
Suma et al., "An SOI-DRAM with Wide Operating Voltage Range by CMOS/SIMOX Technology", 1994 IEEE International Solid-State Circuits Conference, pp. 138-139.
Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.
Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.
Tack et al., "The Multistable Charge-Controlled Memory Effect in SOI MOS Transistors at Low Temperatures", IEEE Transactions on Electron Devices, vol. 37, No. 5, May 1990, pp. 1373-1382.
Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15 μm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. on El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. on El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Tanabe et al., A 30-ns. 64-MB DRAM with Built-in-Self-Test and Self-Repair Function, IEEE Journal of Solid State Circuits, vol. 27, No. 11, pp. 1525-1533, Nov. 1992.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

* cited by examiner

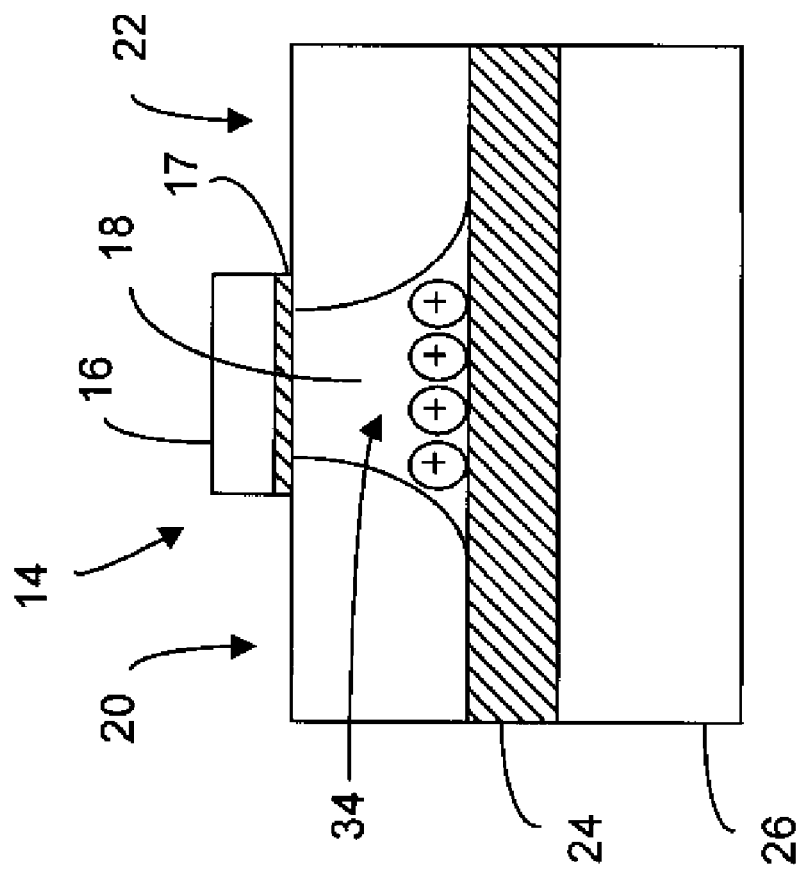

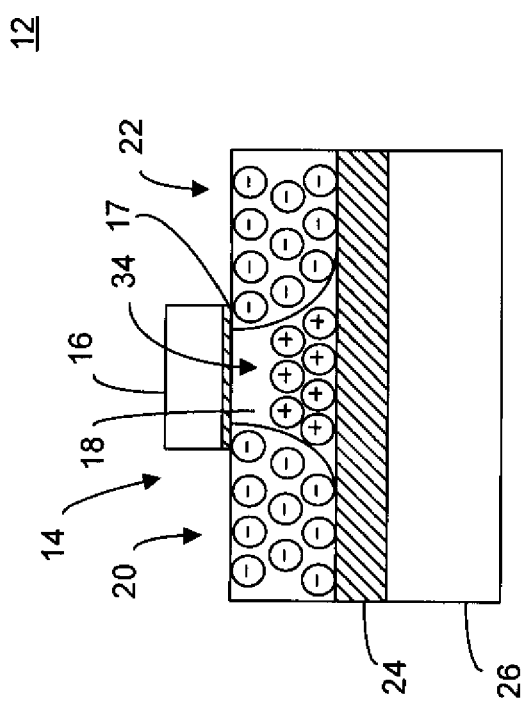
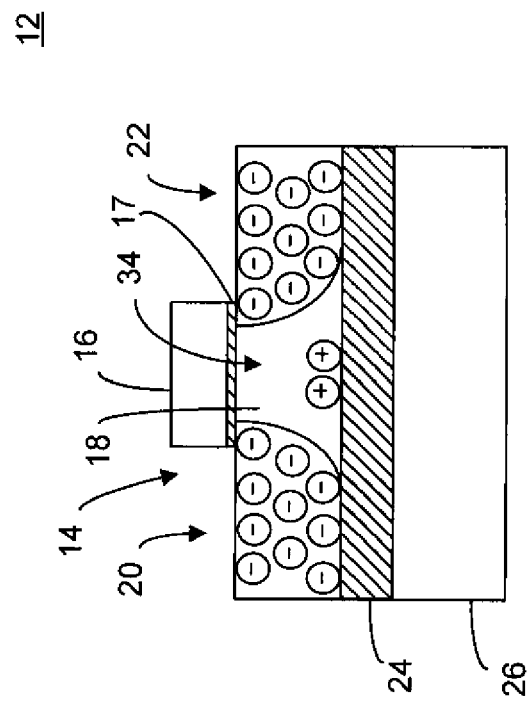

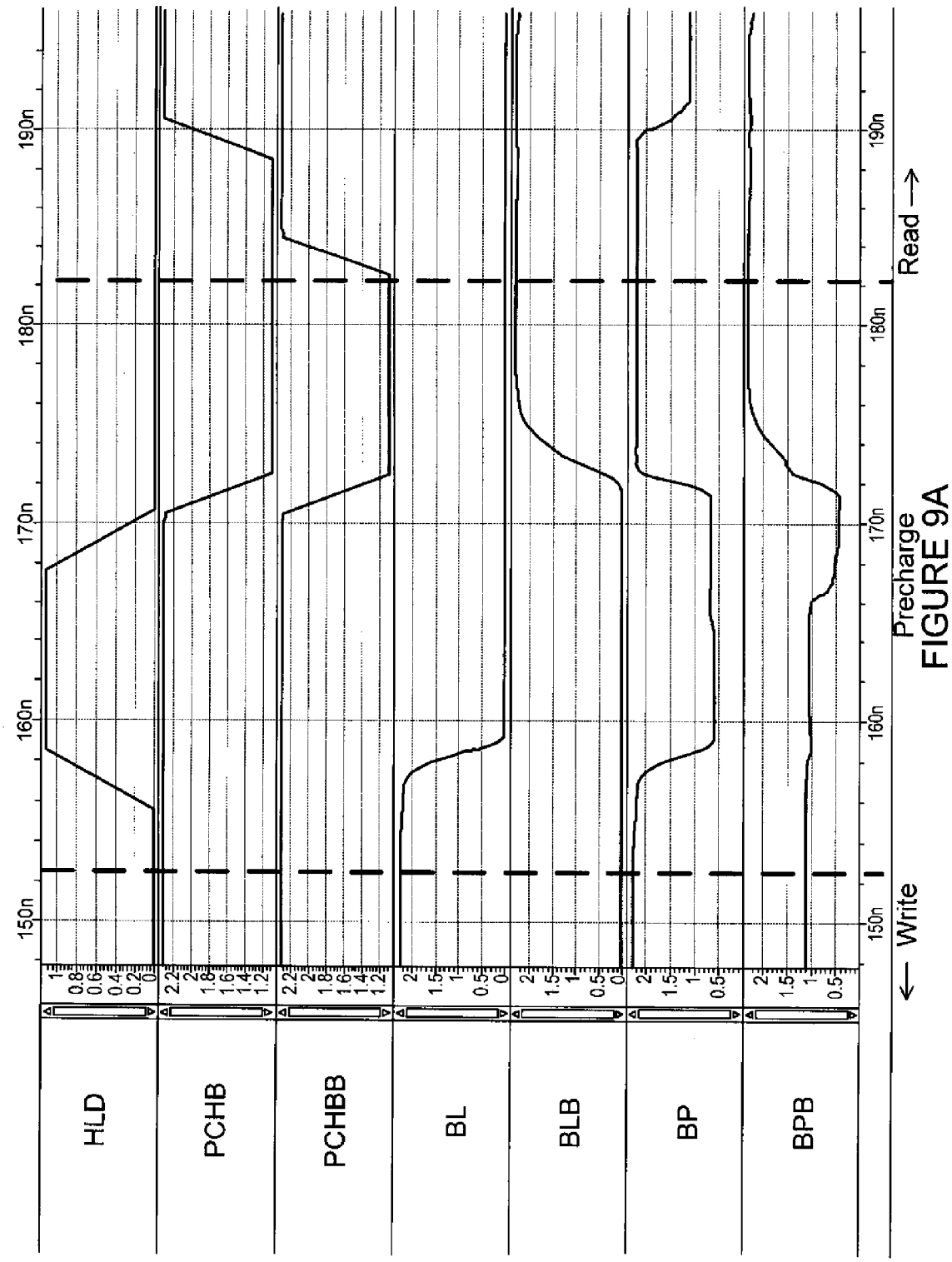

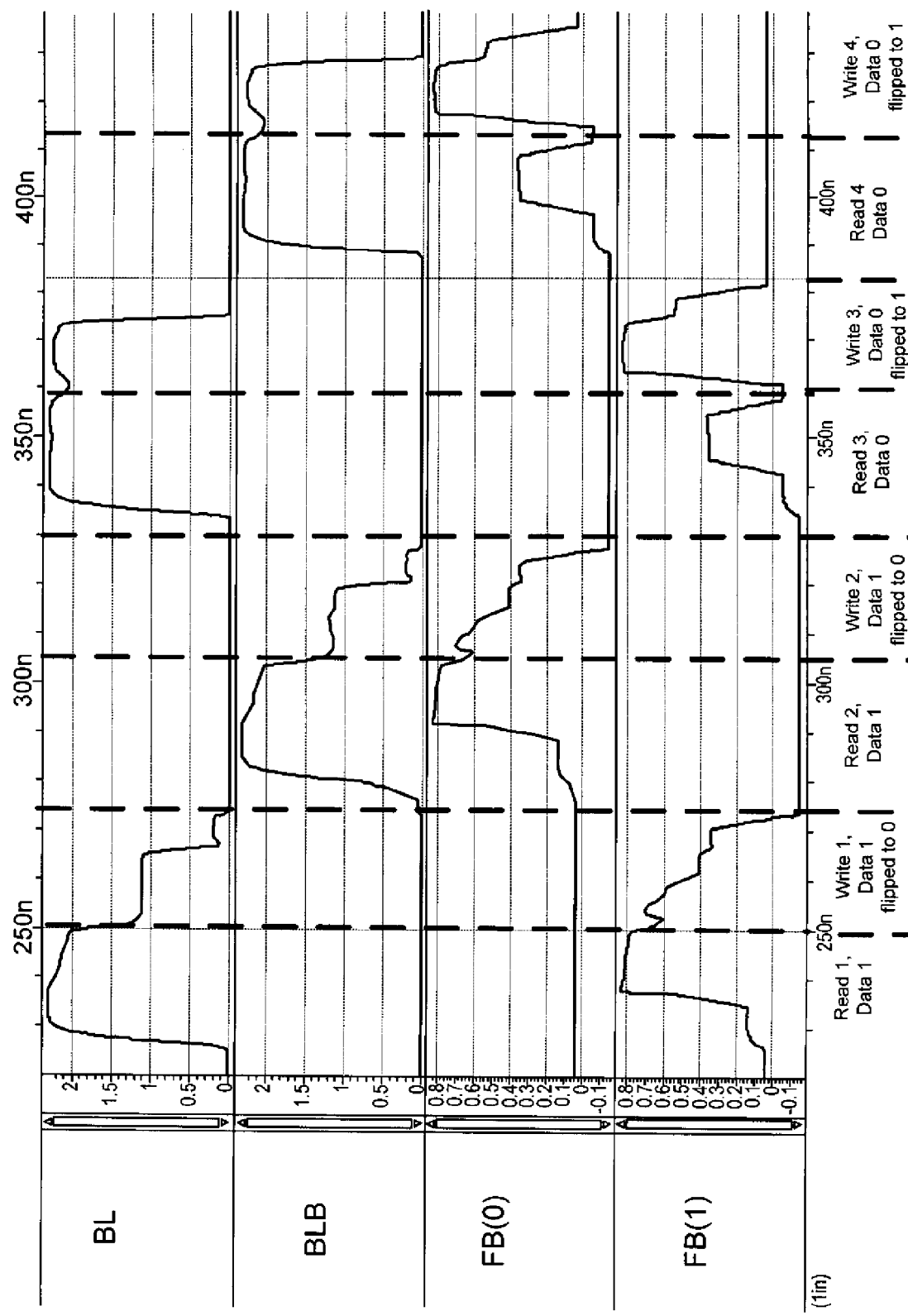

TECHNIQUES FOR READING FROM AND/OR WRITING TO A SEMICONDUCTOR MEMORY DEVICE

FIELD OF THE DISCLOSURE

The present disclosure relates generally to semiconductor memory devices and, more particularly, to techniques for reading from and/or writing to a semiconductor memory device.

BACKGROUND OF THE DISCLOSURE

A semiconductor memory device may include an electrically floating body in which an electrical charge is stored. The electrical charge stored in the electrically floating body may represent a logic high or "1" data state or a logic low or "0" data state.

Various techniques may be employed to read data from and/or write data to a semiconductor memory device having an electrically floating body. In one conventional technique, a semiconductor memory device having a memory cell with a memory transistor may be read by applying a bias to a drain region of the memory transistor, as well as a bias to a gate of the memory transistor that is above a threshold voltage of the memory transistor. As such, this conventional reading technique may sense an amount of channel current provided/generated in response to the application of the bias to the gate of the memory transistor to determine a state of the memory cell. For example, an electrically floating body region of the memory cell may have two or more different current conditions/states corresponding to two or more different logical states (e.g., two different current conditions/states corresponding to two different logic states: a binary "0" data state and a binary "1" data state).

Also, conventional write techniques for semiconductor memory devices having memory cells with N-Channel type memory transistors typically result in an excess of majority charge carriers in electrically floating body regions of the memory transistors by channel impact ionization or by band-to-band tunneling (gate-induced drain leakage "GIDL"). The majority charge carriers may be removed via drain side hole removal, source side hole removal, or drain and source side hole removal by, for example, using back gate pulsing.

Often, conventional read and write techniques may utilize a large number of voltage drivers (for example, a voltage driver per source line (SL)) which may occupy a large amount of area on a circuit board or die. Also, pulsing between positive and negative gate biases during read and write operations may reduce a net quantity of charge carriers in a body region of a memory cell of a semiconductor memory device, which, in turn, may gradually eliminate data stored in the memory cell. In the event that a negative voltage is applied to a gate of a memory cell transistor, thereby causing a negative gate bias, a channel of minority charge carriers beneath the gate may be eliminated. However, some of the minority charge carriers may remain "trapped" in interface defects. Some of the trapped minority charge carriers may recombine with majority charge carriers, which may be attracted to the gate, and net charge majority charge carriers located in the floating body region may decrease over time. This phenomenon may be characterized as charge pumping, which is a problem because the net quantity of charge carriers may be reduced in the memory cell, which, in turn, may gradually eliminate data stored in the memory cell.

In addition, conventional read and write techniques may utilize multiplexer circuitry to selectively apply one or more bit lines to the input of a sense amplifier. The multiplexer circuitry may add complexity and latency to read and/or write operations. Additionally, the multiplexer circuitry may introduce unwanted capacitance and inductance which may reduce margins of the read and/or write operations.

In view of the foregoing, it may be understood that there may be significant problems and shortcomings associated with conventional read and write techniques involving semiconductor memory devices.

SUMMARY OF THE DISCLOSURE

Techniques for reading from and/or writing to a semiconductor memory device are disclosed. In one particular exemplary embodiment, the techniques may be realized as an apparatus for reading from and/or writing to a semiconductor memory device. The apparatus may comprise a first memory cell array having a first plurality of memory cells arranged in a matrix of rows and columns and a second memory cell array having a second plurality of memory cells arranged in a matrix of row and columns. The apparatus may also comprise a data sense amplifier latch circuitry having a first input node and a second input node. The apparatus may further comprise a first bit line input circuitry configured to couple the first memory cell array to the first input node of the data sense amplifier latch circuitry and a second bit line input circuitry configured to couple the second memory cell array to the second input node of the data sense amplifier latch circuitry.

In accordance with other aspects of this particular exemplary embodiment, wherein the data sense amplifier latch circuitry may further comprise a plurality of transistors arranged in a cross-coupled configuration that may be configured to amplify a voltage or current difference between the first input node and the second input node.

In accordance with further aspects of this particular exemplary embodiment, wherein the first bit line input circuitry may be configured to couple the first memory cell array to the first input node of the data sense amplifier latch circuitry via a first bit line.

In accordance with additional aspects of this particular exemplary embodiment, wherein the second bit line input circuitry may be configured to couple the second memory cell array to the second input node of the data sense amplifier latch circuitry via a second bit line.

In accordance with yet another aspect of this particular exemplary embodiment, wherein the first bit line input circuitry may comprise a switch circuitry configured to couple the data sense amplifier latch circuitry to the first memory cell array and a hold circuitry coupled to the first memory cell array to maintain one or more data states stored in the first memory cell array.

In accordance with other aspects of this particular exemplary embodiment, wherein the second bit line input circuitry may comprise a switch circuitry configured to couple the data sense amplifier latch circuitry to the second memory cell array and a hold circuitry coupled to the second memory cell array to maintain one or more data states stored in the second memory cell array.

In accordance with further aspects of this particular exemplary embodiment, the apparatus may further comprise a pre-charge circuitry having a first transistor configured to pre-charge the first input node of the data sense amplifier latch circuitry and a second transistor configured to pre-charge the second input node of the data sense amplifier latch circuitry.

In accordance with additional aspects of this particular exemplary embodiment, the apparatus may further comprise an input/output circuitry coupled to the data sense amplifier latch circuitry configured to output one or more data states of at least one of the first memory cell array and the second memory cell array detected by the data sense amplifier latch circuitry.

In accordance with yet another aspect of this particular exemplary embodiment, wherein the input/output circuitry may comprise a first transistor coupled to the first input node of the data sense amplifier latch circuitry and a second transistor coupled to the second input node of the data sense amplifier latch circuitry.

In accordance with other aspects of this particular exemplary embodiment, the apparatus may further comprise a keeper circuitry coupled to the first bit line input circuitry and the second bit line input circuitry.

In accordance with further aspects of this particular exemplary embodiment, wherein the keeper circuitry may comprise a first transistor coupled to the first bit line input circuitry and the first memory cell array and a second transistor coupled to the second bit line input circuitry and the second memory cell array.

In accordance with additional aspects of this particular exemplary embodiment, the apparatus may further comprise a first writeback circuitry coupled to the first memory cell array and the data sense amplifier latch circuitry.

In accordance with yet another aspect of this particular exemplary embodiment, the apparatus may further comprise a second writeback circuitry coupled to the second memory cell array and the data sense amplifier latch circuitry.

In accordance with other aspects of this particular exemplary embodiment, wherein the first bit line input circuitry may be configured to couple the first memory cell array to the data sense amplifier latch circuitry via a bit line and the second bit line input circuitry may be configured to couple the second memory cell array to the data sense amplifier latch circuitry via the bit line.

In another exemplary embodiment, the techniques may be realized as a method for reading from and/or writing to a semiconductor memory device. The method may comprise arranging a first plurality of memory cells in a matrix of rows and columns in a first memory cell array and a second plurality of memory cells in a matrix of row and columns in a second memory cell array. The method may also comprise coupling the first memory cell array to a first input node of a data sense amplifier latch circuitry via a first bit line input circuitry and coupling the second memory cell array to a second input node of the data sense amplifier latch circuitry via a second bit line input circuitry.

In accordance with other aspects of this particular exemplary embodiment, the method further comprise coupling an input/output circuitry to the data sense amplifier latch circuitry to output one or more data states of at least one of the first memory cell array and the second memory cell array detected by the data sense amplifier latch circuitry.

In accordance with further aspects of this particular exemplary embodiment, the method may further comprise coupling a keeper circuitry to the first bit line input circuitry and the second bit line input circuitry to maintain a voltage at the first bit line input circuitry and a voltage at the second bit line input circuitry within a predetermined range.

In accordance with additional aspects of this particular exemplary embodiment, the method may further comprise coupling a first writeback circuitry to the first memory cell array and the data sense amplifier latch circuitry to perform a write operation.

In accordance with yet another aspect of this particular exemplary embodiment, the method may further comprise coupling a second writeback circuitry to the second memory cell array and the data sense amplifier latch circuitry to perform a write operation.

In accordance with other aspects of this particular exemplary embodiment, wherein coupling the first memory cell array to the first input node of the data sense amplifier latch circuitry via a bit line and coupling the second memory cell array to the second input node of the data sense amplifier latch circuitry via the bit line.

In another particular exemplary embodiment, the techniques may be realized as an apparatus for reading from and/or writing to a semiconductor memory device. The apparatus may comprise a first memory cell array having a first plurality of memory cells arranged in a matrix of rows and columns and a second memory cell array having a second plurality of memory cells arranged in a matrix of row and columns. The apparatus may also comprise a data sense amplifier latch circuitry having a first input node and a second input node. The apparatus may further comprise a first bit line input circuitry configured to couple the first memory cell array to the first input node of the data sense amplifier latch circuitry via a bit line and a second bit line input circuitry configured to couple the second memory cell array to the second input node of the data sense amplifier latch circuitry via the bit line.

In another exemplary embodiment, the techniques may be realized as a method for reading from and/or writing to a semiconductor memory device. The method may comprise arranging a first plurality of memory cells in a matrix of rows and columns in a first memory cell array and a second plurality of memory cells in a matrix of row and columns in a second memory cell array. The method may also comprise coupling the first memory cell array to a first input node of a data sense amplifier latch circuitry via a bit line and coupling the second memory cell array to a second input node of the data sense amplifier latch circuitry via the bit line.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 1A shows a cross-sectional view of a memory cell in accordance with an embodiment of the present disclosure.

FIGS. 2A and 2B show charge relationships, for given data states, of a memory cell in accordance with embodiments of the present disclosure.

FIGS. 9A and 9B show precharge operation timing control signal voltage waveforms in accordance with an embodiment of the present disclosure.

FIGS. 11A and 11B show control signal voltage waveforms for refresh operations in accordance with an embodiment of the present disclosure.

DETAILED DESCRIPTION OF EXEMPLARY EMBODIMENTS

Figure 1B:
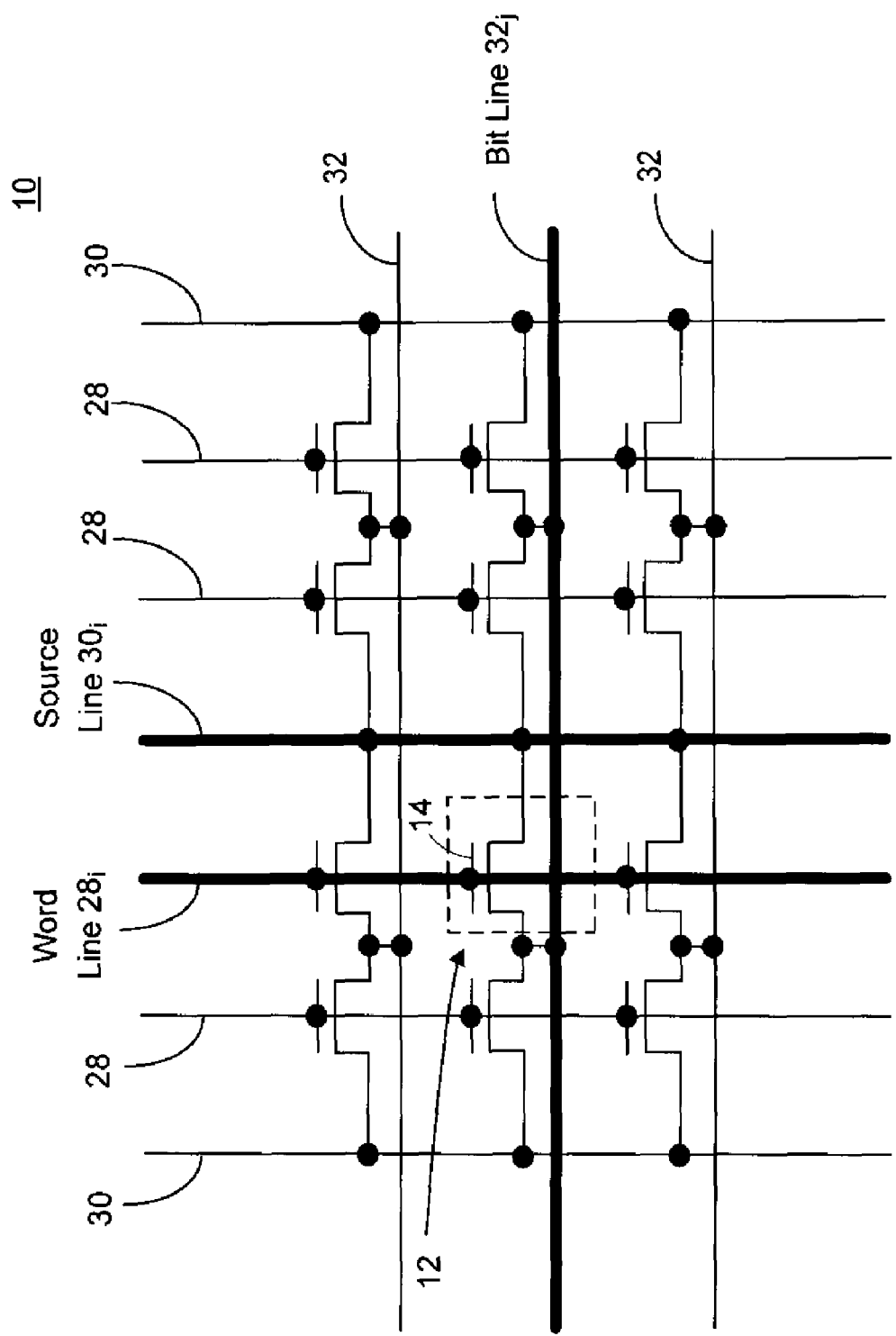
FIG. 1B shows a schematic representation of a semiconductor memory device array including a plurality of memory cells arranged in an array of rows and columns in accordance with an embodiment of the present disclosure.

There are many embodiments described and illustrated herein. In a first aspect, the present disclosure is directed to a semiconductor memory device and techniques for reading data from and writing data to memory cells of the semiconductor memory device. In this regard, in one embodiment of this aspect of the present disclosure, techniques are disclosed for reading, writing, sensing, and/or sampling data states from memory cells of the semiconductor memory device.

Referring to FIG. 1A, there is a shown a cross-sectional view of a memory cell 12 in accordance with an embodiment of the present disclosure. The memory cell 12 may comprise a memory transistor 14 (e.g., an N-channel type transistor or a P-channel type transistor) including a gate 16, an electrically floating body region 18, a source region 20, and a drain region 22. An insulating film 17 may be disposed between the gate 16 and the electrically floating body region 18. Moreover, the electrically floating body region 18 may be disposed on or above region 24, which may be an insulation region (e.g., in an SOI material/substrate) or a non-conductive region (e.g., in a bulk-type material/substrate). The insulation or non-conductive region 24 may be disposed on a substrate 26. The electrically floating body region 18 may be disposed between the source region 20 and the drain region 22. Charge carriers 34 may accumulate in or may be emitted/ejected from the electrically floating body region 18. A data state of the memory cell 12 may be defined by an amount of charge carriers 34 present in the electrically floating body region 18.

Referring to FIG. 1B, there is shown a schematic representation of a semiconductor memory device array 10 including a plurality of memory cells 12 arranged in an array of rows and columns in accordance with an embodiment of the present disclosure. The semiconductor memory device array 10 also includes a plurality of word lines (WL) 28, a plurality of source lines (SL) 30, and a plurality of bit lines (BL) 32, each electrically coupled to corresponding ones of the plurality of memory cells 12. Each memory cell 12 may include a memory transistor 14, as described above with reference to FIG. 1A, wherein the source region 20 may be coupled to an associated source line (SL) 30, the drain region 22 may be coupled to an associated bit line (BL) 32, and the gate 16 may be coupled to an associated word line (WL) 28. In an exemplary embodiment, the source region 20 of the memory transistor 14 of each memory cell 12 of a first row of memory cells 12 may be coupled (e.g., via physical diffusion and/or a source line (SL) plane) to a first source line (SL) 30. Also, the source region 20 of the memory transistor 14 of each memory cell 12 of a second row of memory cells 12 may be coupled to the first source line (SL) 30. In another exemplary embodiment, the source region 20 of the memory transistor 14 of each memory cell 12 of a second row of memory cells 12 may be coupled to a second source line (SL) 30, and the source region 20 of the memory transistor 14 of each memory cell 12 of a third row of memory cells may be coupled to a third source line (SL) 30.

Data may be written into a selected memory cell 12 of the semiconductor memory device array 10 by applying suitable control signals to a selected word line (WL) 28, a selected source line (SL) 30, and/or a selected bit line (BL) 32. The memory cell 12 may exhibit (1) a first data state which is representative of a first amount of charge carriers 34 in the electrically floating body region 18 of the memory transistor 14, and (2) a second data state which is representative of a second amount of charge carriers 34 in the electrically floating body region 18 of the memory transistor 14. Additional data states are also possible.

The semiconductor memory device array 10 may further include data write circuitry (not shown), coupled to the selected memory cell 12, to apply (i) first write control signals to the memory cell 12 to write the first data state therein and (ii) second write control signals to the memory cell 12 to write the second data state therein. In response to the first write control signals applied to the selected memory cell 12, the memory transistor 14 may generate a first transistor current which may substantially provide a first amount of charge carriers 34 in the electrically floating body region 18 of the memory transistor 14. In this case, charge carriers 34 may accumulate in or may be emitted/ejected from the electrically floating body region 18. As discussed above, a data state may be defined by an amount of charge carriers 34 present in the electrically floating body region 18. For example, the amount of charge carriers 34 present in the electrically floating body region 18 may represent a logic high (binary "1" data state) or a logic low (binary "0" data state). Additional data states are also possible.

The first write control signals may include a signal applied to the gate 16 and a signal applied to the source region 20, wherein the signal applied to the source region 20 may include a first voltage potential having a first amplitude and a second voltage potential having a second amplitude. In another exemplary embodiment, the first write control signals may include a signal applied to the gate 16 and a signal applied to the drain region 22, wherein the signal applied to the drain region 22 may include a third voltage potential having a third amplitude and a fourth voltage potential having a fourth amplitude.

Also, the second write control signals may include a signal applied to the gate 16, a signal applied to the source region 20, and a signal applied to the drain region 22. The signal applied to the drain region 22 may include a block voltage potential to prevent the first data state from being written into the memory transistor 14.

Referring to FIGS. 2A and 2B, there are shown charge relationships, for given data states, of the memory cell 12 in accordance with exemplary embodiments of the present disclosure. In exemplary embodiments, each memory cell 12 of the semiconductor memory device 10 may operate by accumulating or emitting/ejecting majority charge carriers 34 (e.g., electrons or holes) in/from the electrically floating body region 18. FIGS. 2A and 2B illustrate this with an N-Channel memory transistor 14. More specifically, various write techniques may be employed to accumulate majority charge carriers 34 (in this example, holes) in the electrically floating body region 18 of the memory cell 12 by, for example, impact ionization or hole injection near the source region 20 and/or drain region 22 (see FIG. 2A). Also, the majority charge carriers 34 may be emitted/ejected from the electrically floating body region 18 by, for example, forward biasing a junction between the source region 20 and the electrically floating body region 18 and/or a junction between the drain region 22 and the electrically floating body region 18 (see FIG. 2B).

As shown in FIG. 2A, a logic high (binary "1" data state) may correspond to an increased concentration of majority charge carriers 34 (e.g., holes) in the electrically floating body region 18 relative to an unwritten memory cell 12 and/or a memory cell 12 that is written with a logic low (binary "0" data state). In contrast, as shown in FIG. 2B, a logic low (binary "0" data state) may correspond to a reduced concentration of majority charge carriers 34 (e.g., holes) in the electrically floating body region 18 relative to an unwritten memory cell 12 and/or a memory cell 12 that is written with a logic high (binary "1" data state).

The semiconductor memory device array 10 may further include data sense circuitry (not shown), coupled to the memory cell 12, to sense a data state of the memory cell 12. More specifically, in response to read control signals (first current) applied to the memory cell 12, the memory cell 12 may generate a second transistor current that is representative of a data state of the memory cell 12. The data sense circuitry may determine a data state of the memory cell 12 based at least substantially on the second transistor current (e.g., for a binary "1" data state) or a lack of the second transistor current (e.g., for a binary "0' data state).

The read control signals may include signals (first current) applied to the gate 16, source region 20, and drain region 22 to cause, force, and/or induce the second transistor current, which is representative of a data state of the memory cell 12. The read control signals applied to the gate 16, source region 20, and drain region 22 may include a positive voltage or a negative voltage. One or more of the read control signals may include a constant or unchanging voltage amplitude.

Figure 3:
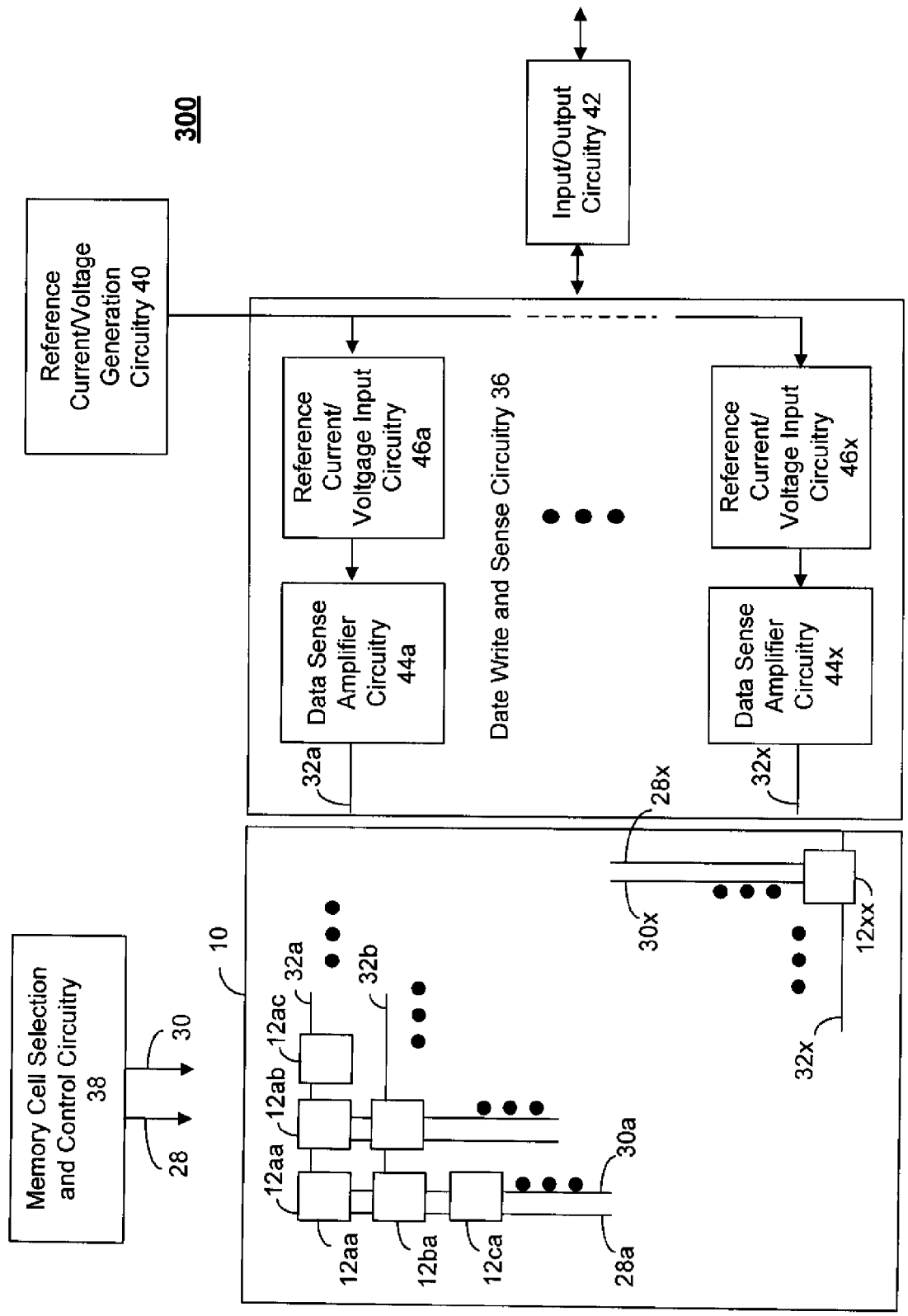
FIG. 3 shows a schematic block diagram of a semiconductor memory device in accordance with an embodiment of the present disclosure.

Referring to FIG. 3, there is shown a schematic block diagram of a semiconductor memory device 300 in accordance with an embodiment of the present disclosure. The semiconductor memory device 300 may include a memory cell array 10, data write and sense circuitry 36, memory cell selection and control circuitry 38, reference current and/or voltage generation circuitry 40, and input/output circuitry 42. The memory cell array 10 may include a plurality of memory cells 12 arranged in a matrix of rows and columns including a plurality of word lines (WL) 28, a plurality of source lines (SL) 30, and a plurality of bit lines (BL) 32. The memory cell array 10 may be coupled to the memory cell selection and control circuitry 38 via the word lines (WL) 28, and/or the source lines (SL) 30. Also, the memory cell array 10 may be coupled to the data write and sense circuitry 36 via the bit lines 32 (BL).

In an exemplary embodiment, the data write and sense circuitry 36 may include a plurality of data sense amplifier circuitry 44 (e.g., 44a-44x) and a plurality of reference current and/or voltage input circuitry 46 (e.g., 46a-46x). Each data sense amplifier circuitry 44 may receive at least one bit line (BL) 32 and an output of the reference current and/or voltage generator circuitry 40 (for example, a current or voltage reference signal) via a corresponding reference current and/or voltage input circuitry 46. For example, each data sense amplifier circuitry 44 may be a cross-coupled type of sense amplifier to detect, determine, sense, and/or sample a data state of a memory cell 12. Each data sense amplifier circuitry 44 may detect a data state of one or more memory cells 12 (e.g., along bit lines $32a$-$32x$ (BL)) by comparing voltages or currents on a bit line (BL) 32 with voltages or currents of the output of the reference current and/or voltage generator circuitry 40. Also, each data sense amplifier circuitry 44 may detect a data state of one or more memory cells 12 (e.g., along bit lines $32a$-$32x$ (BL)) by comparing voltage or current on a bit line (BL) 32 with an unselected pre-charged bit line (BL) voltage or current. For example, the pre-charged bit line (BL) voltage or current may be a hold voltage or current associated with the one or more memory cells in order to retain a data state for a predetermined amount of time. Also, a predetermined voltage may be applied to a bit line 32 (BL) based at least in part on a data state determined by the data sense amplifier circuitry 44 to write-back the data state to one or more memory cells 12. In another exemplary embodiment, predetermined voltages (e.g., voltage data and state) may be applied to a bit line 32 (BL) to write-back a plurality of data states stored in the one or more memory cells 12.

The data sense amplifier circuitry 44 may employ voltage and/or current sensing circuitry and/or techniques. In an exemplary embodiment, the data sense amplifier circuitry 44 may employ current sensing circuitry and/or techniques wherein the data sense amplifier circuitry 44 may compare current from a selected memory cell 12 to a reference current from the reference current and/or voltage input circuitry 46, for example, the current of one or more reference cells. From that comparison, it may be determined whether the memory cell 12 contains a logic high (binary "1" data state, relatively more majority charge carriers 34 contained within the body region 18) or a logic low (binary "0" data state, relatively less majority charge carriers 34 contained within the body region 18). In another exemplary embodiment, the data sense amplifier circuitry may employ voltage sensing circuitry and/or techniques wherein the data sense amplifier circuitry 44 may compare voltage from a selected memory cell 12 to a reference voltage from the reference current and/or voltage input circuitry 46, for example, the voltage of one or more reference cells. From that comparison, it may be determined whether the memory cell 12 contains a logic high (binary "1" data state, relatively more majority charge carriers 34 contained within the body region 18) or a logic low (binary "0" data state, relatively less majority charge carriers 34 contained within the body region 18).

The memory cell selection and control circuitry 38 may select and/or enable one or more predetermined memory cells 12 to facilitate reading data therefrom and/or writing data thereto by applying control signals on one or more word lines (WL) 28 and/or source lines (SL) 30. The memory cell selection and control circuitry 38 may generate such control signals using address signals, for example, row address signals. Moreover, memory cell selection and control circuitry 38 may include a word line decoder and/or driver (not shown). For example, memory cell selection and control circuitry 38 may include one or more different control/selection techniques (and circuitry therefore) to implement memory cell selection techniques. Such techniques, and circuitry therefore, are well known to those skilled in the art. Notably, all such control/selection techniques, and circuitry therefore, whether now known or later developed, are intended to fall within the scope of the present disclosures.

In an exemplary embodiment, the semiconductor memory device 300 may implement a two step write operation whereby selected memory cells 12 of a given row are written to a predetermined data state by first executing a "clear" operation, whereby all of the memory cells 12 of the given row may be written to a logic low (binary "0" data state), and thereafter the selected memory cells 12 of the given row may be selectively written to the predetermined data state (e.g., a logic high (binary "1" data state)). In another exemplary embodiment, selected memory cells 12 of a given row are written to a predetermined data state by first executing a "clear" operation, whereby all of the memory cells 12 of the given row may be written to a logic high (binary "1" data state), and thereafter the selected memory cells 12 of the given row may be selectively written to the predetermined data state (e.g., a logic low (binary "0" data state)). In still another exemplary embodiment, a one step write operation may be implemented, whereby selective memory cells 12 of a given row are selectively written to either a logic high (binary "1" data state) or a logic low (binary "0" data state) without first implementing a "clear" operation.

The semiconductor memory device 300 may employ any of the exemplary writing, holding, and/or reading techniques described herein. Moreover, exemplary voltage values for each of the control signals for a given operation (for example, writing, holding, or reading) may be employed in the semiconductor memory device 300 according to exemplary embodiments of the present disclosure.

The memory transistors 14 may comprise N-channel, P-channel, or a combination of both types of transistors. For example, the memory transistors 12 may be made from an SOI material/substrate or a bulk-type material/substrate. Also, the memory transistors 14 may comprise non-planar transistors, such as, vertical pillar transistors, cylindrical thin-pillar transistors, vertical gated access transistor, fin field effect transistors (FETs), multi-gate field effect transistors (MuGFETs), multiple independent gate field effect transistors (MIGFETs) and/or other multi-gate transistors. In addition, circuitry that is peripheral to the memory array (for example, sense amplifiers or comparators, row and column address decoders, as well as line drivers (not illustrated herein)) may include P-channel, N-channel type transistors, and/or other devices as discussed above. In the event that P-channel type transistors are employed as memory transistors 14 in the memory cells 12, suitable write and read voltages (for example, negative voltages) may be well known to those skilled in the art in light of this disclosure. Accordingly, for sake of brevity, a discussion of these voltages will not be included herein.

Figure 4:
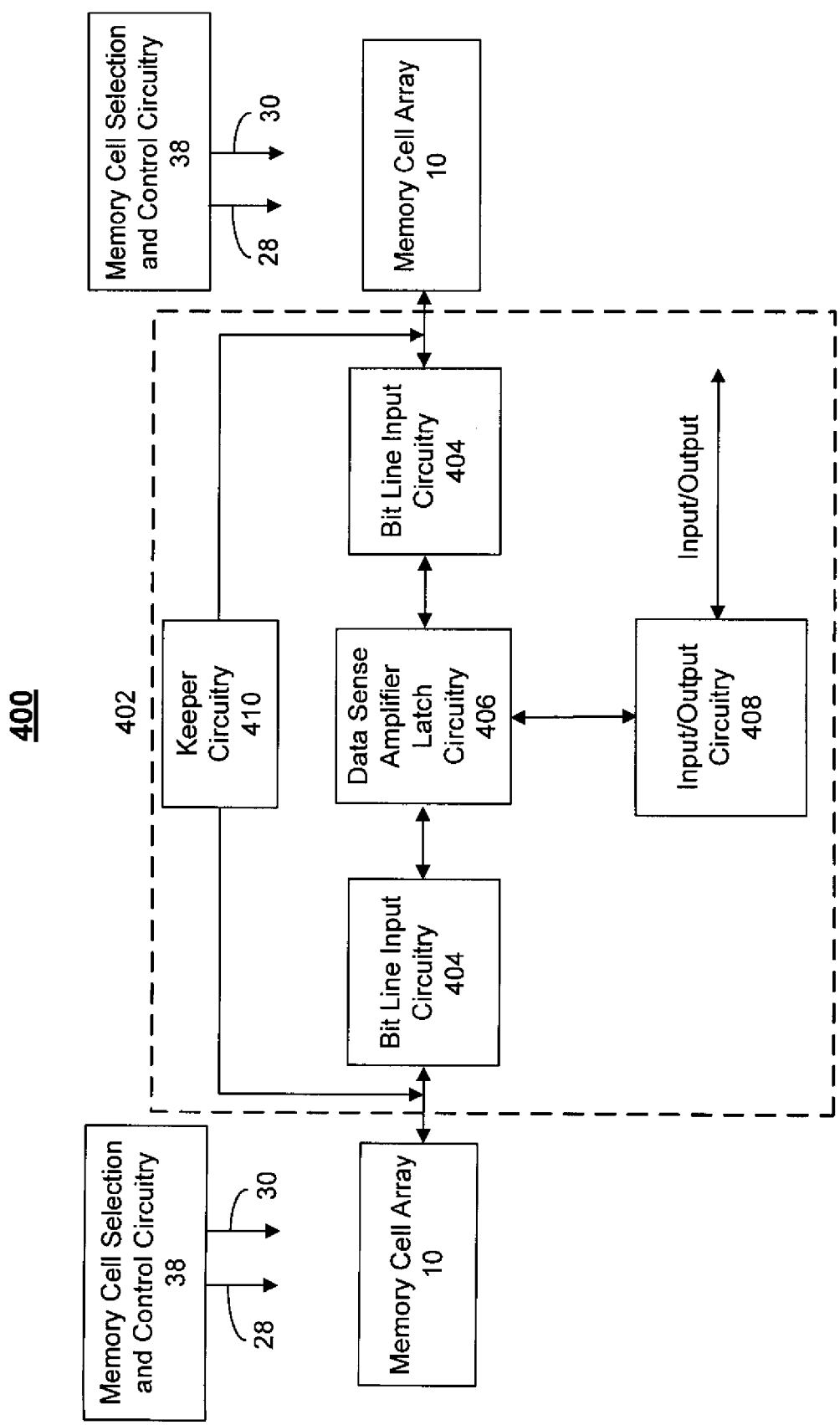
FIG. 4 shows a schematic block diagram of a portion of a semiconductor memory device 400 in accordance with an embodiment of the present disclosure.

Referring to FIG. 4, there is shown a schematic block diagram of a portion of a semiconductor memory device 400 in accordance with an embodiment of the present disclosure. The semiconductor memory device 400 may include data sense circuitry 402 controllable and/or selectively coupled to one or more memory cell arrays 10 via one or more bit lines 32 (shown in FIG. 3). The data sense circuitry 402 may include one or more bit line input circuitry 404 coupled to each memory cell array 10, data sense amplifier latch circuitry 406, input/output circuitry 408, and/or keeper circuitry 410.

The one or more bit line input circuitry 404 may couple the data sense amplifier latch circuitry 406 to one or more memory cell arrays 10. Also, the one or more bit line input circuitry 404 may apply a hold voltage to the memory cell arrays 10 in order to hold data states (e.g., logic high (binary "1" data state) and logic low (binary "0" data state)) stored in the memory cell arrays 10. In an exemplary embodiment, the one or more bit line input circuitry 404 may include one or more pass gate transistors and/or column switch circuitry to couple the data sense amplifier latch circuitry 406 to the plurality of memory cells 12.

The data sense amplifier latch circuitry 406 may sample, sense, read, and/or determine a logic low (binary "0" data state) or a logic high (binary "1" data state) stored in one or more memory cells 12 (shown in FIG. 3) of one or more memory cell arrays 10. A reference voltage and/or current may be applied to pre-charge the data sense amplifier latch circuitry 406 before a sample, sense, read, and/or data state determining operation. For example, during a sample, sense, read, and/or data state determining operation, the data sense amplifier latch circuitry 406 may compare a current generated by a memory cell 12 with an applied pre-charged reference current. In an exemplary embodiment, the pre-charged reference voltage and/or current applied to the data sense amplifier latch circuitry 406 may have a magnitude between a magnitude of voltage/current that may represent a logic low (binary "0" data state) and a magnitude of voltage/current that may represent a logic high (binary "1" data state) stored in the memory cell 12. In another exemplary embodiment, the pre-charged reference voltage and/or current applied to the data sense amplifier latch circuitry 406 may have a magnitude equal to the magnitude of the voltage/current that may represent a logic low (binary "0" data state) or a magnitude of voltage/current that may represent a logic high (binary "1" data state) stored in the memory cell 12.

The input/output circuitry 408 may allow external access to the plurality of memory cells 12 in the plurality of memory cell arrays 10 via the data sense amplifier latch circuitry 406. The input/output circuitry 408 may selectively and/or controllably output a data state stored in the memory cells 12 of the memory cell arrays 10. Also, the input/output circuitry 408 may selectively and/or controllably input (e.g., write or write-back) a data state to the memory cells 12 of the memory cell arrays 10. In an exemplary embodiment, the input/output circuitry 408 may include pass gates and/or column switch circuitry to facilitate and/or implement various operations on the memory cells 12 of the memory cell arrays 10.

The keeper circuitry 410 may include voltage and/or current stabilizing circuitry coupled to the bit lines (BL) 32 associated with disparate memory cell arrays 10. In an exemplary embodiment, the bit lines (BL) 32 associated with disparate memory cell arrays 10 may have different voltages and/or currents, and the keeper circuitry 410 may maintain the voltages and/or currents on the bit lines (BL) 32 associated with the disparate memory cell arrays 10 within a predetermined range. For example, the keeper circuitry 410 may maintain the voltages and/or current on the bit lines (BL) 32 before, during, and/or after various operations (e.g., sense operation).

The memory cell selection and control circuitry 38 may control one or more selected memory cells 12 of the memory cell arrays 10 coupled to the data sense circuitry 402. In an exemplary embodiment, the memory cell selection and control circuitry 38 may include a plurality of word lines (WL) 28, a plurality of source lines (SL) 30, word line (WL) decoders and/or drivers, and/or source line (SL) decoders and/or drivers. The memory cell selection and control circuitry 38 may apply one or more control signals via the plurality of word lines (WL) 28 and/or the plurality of source lines (SL) 30. Also, the memory cell selection and control circuitry 38 may include pass gates and/or row switch circuitry (not shown) to selectively activate the memory cells 12 in order to perform various operations.

Figure 5:
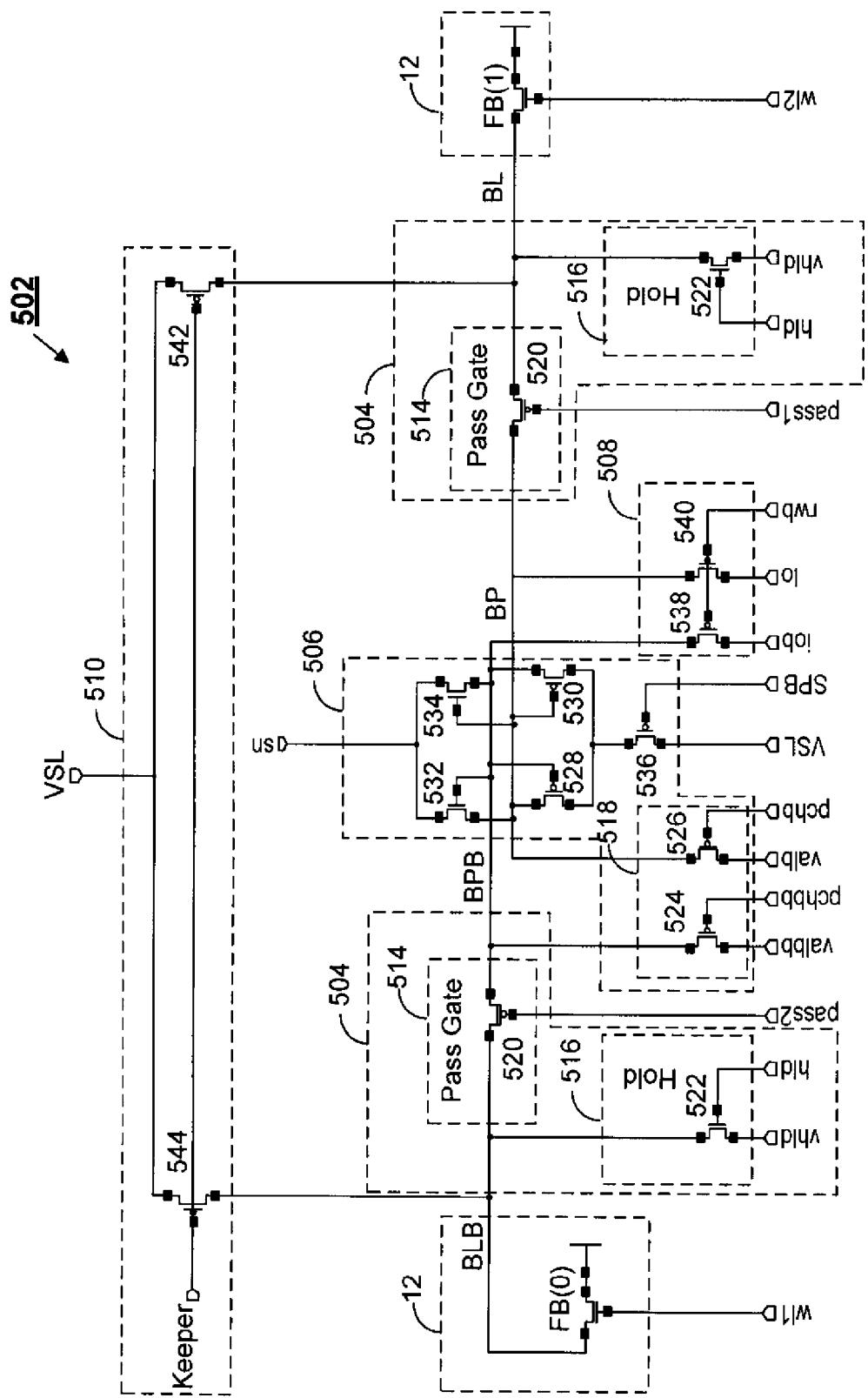
FIG. 5 shows a schematic diagram of data sense circuitry in accordance with an embodiment of the present disclosure.

Referring to FIG. 5, there is shown a schematic diagram of data sense circuitry 502 in accordance with an embodiment of the present disclosure. The data sense circuitry 502 may include one or more bit line input circuitry 504 coupled to one or more memory cells 12, data sense amplifier latch circuitry 506, input/output circuitry 508, and/or keeper circuitry 510.

Each bit line input circuitry 504 may include switch circuitry 514 having a pass gate transistor 520 coupling the data sense amplifier latch circuitry 506 to one or more memory cells 12, and hold circuitry 516 having a transistor 522 coupled to one or more memory cells 12 in order to achieve predetermined retention time for a data state stored in the one or more memory cells 12.

The data sense amplifier latch circuitry 506 may include pre-charge circuitry 518 having one or more transistors 524 and 526 for charging the data sense amplifier latch circuitry 506 to a reference voltage and/or current before a sample, sense, read, and/or data state determining operation. Also, the data sense amplifier latch circuitry 506 may include an input node (BPB) coupled to bit line (BLB) 32 and an input node (BP) coupled to a bit line (BL) 32 via the one or more bit line input circuitry 504. In an exemplary embodiment, the input node (BPB) may be set to and/or maintained at a voltage and/or current provided by a memory cell 12 (e.g., FB(0)), while the input node (BP) may be set to and/or maintained at a reference voltage and/or current provided by the pre-charge circuitry 518. In another exemplary embodiment, the input node (BP) may be set to and/or maintained at a voltage and/or current provided by a memory cell 12 (e.g., FB(1)), while the input node (BPB) may be set to and/or maintained at a reference voltage and/or current provided by the pre-charge circuitry 518. The data sense amplifier latch circuitry 506 may determine a data state based on the difference between the voltage or current at the input node (BPB) and the voltage or current at the input node (BP).

The voltage and/or current provided by the memory cell 12 at the input node (BPB) and the reference voltage and/or current provided by the pre-charge circuitry 518 at the input node (BP) may produce a voltage and/or a current differential between the input node (BPB) and the input node (BP). The data sense amplifier latch circuitry 506 may include a plurality of transistors 528-534 arranged in a cross-coupled configuration that may amplify the voltage and/or current difference between the input node (BPB) and the input node (BP).

The pre-charge circuitry 518 may pre-charge a reference node and/or a sense node (e.g., input node BP may be the reference node and then input node BPB may be the sense node or input node BP may be the sense node and then input node BPB may be the reference node). The pre-charge circuitry 518 may pre-charge the reference node and the sense node to the same voltage potential or a different voltage potential. In an exemplary embodiment, the pre-charge circuitry 518 may pre-charge the reference node and the sense node to the same voltage potential. When the pre-charge circuitry 518 pre-charges the reference node and the sense node to the same reference voltage potential, the voltage potential/current detected by the data amplifier latch circuitry 506 from the memory cell 12 may be higher than the reference voltage potential in the event that a logic high (binary "1" data state) is stored in the memory cell 12 or lower than the reference voltage potential in the event that a logic low (binary "0" data state) is stored in the memory cell 12.

In another exemplary embodiment, the pre-charge circuitry 518 may pre-charge the reference node and the sense node to a different voltage potential. The pre-charge circuitry 518 may pre-charge the reference node to a lower voltage potential than the pre-charged voltage potential at the sense node when the data amplifier latch circuitry 506 senses high. The pre-charge circuitry 518 may pre-charge the reference node to a higher voltage potential than the pre-charged voltage potential at the sense node when the data amplifier latch circuitry 506 senses low. In an exemplary embodiment, assuming that a logic high (binary "1" data state) is stored in the memory cell 12. When the data amplifier latch circuitry 506 senses low, the sense node (SN) may be pre-charged to a voltage potential of approximately 0V and the reference node (RN) may be pre-charged to a voltage potential of approximately 100 mV. The logic high (binary "1" data state) stored in the memory cell 12 may cause the voltage potential at the sense node (SN) to rise to approximately 200 mV. The data amplifier latch circuitry 506 may read a logic high (binary "1" data state) is stored in the memory cell 12.

In another exemplary embodiment, assuming that a logic low (binary "0" data state) is stored in the memory cell 12. When the data amplifier latch circuitry 506 senses high, the sense node (SN) may be pre-charged to a voltage potential of approximately VDD voltage potential and the reference node (RN) may be pre-charged to a voltage potential of approximately VDD voltage potential minus 100 mV. The logic low (binary "0" data state) stored in the memory cell 12 may not cause the voltage potential at the sense node to change and the voltage potential at the sense node may maintain at approximately VDD voltage potential. The data amplifier latch circuitry 506 may read a logic low (binary "0" data state) is stored in the memory cell 12. Also, the pre-charged voltage potential at the sense node may change (e.g., rise or fall) to a voltage potential either higher than (e.g., when a logic high (binary "1" data state) is stored in the memory cell 12 and the data amplifier latch circuitry 506 senses low) or below (e.g., when a logic high (binary "1" data state) is stored in the memory cell and the data amplifier latch circuitry 506 senses high) the pre-charged voltage potential at the reference node.

The pre-charged voltage potential at the reference node may be selected based on when the data amplifier latch circuitry 506 senses high or low. For example, the pre-charged voltage potential at the reference node may be selected to be lower than the pre-charged voltage potential at the sense node when the data amplifier latch circuitry 506 senses high. Also, the pre-charged voltage potential at the reference node may be selected to be higher than the pre-charged voltage potential at the sense node when the data amplifier latch circuitry 506 senses low. In an exemplary embodiment, the pre-charged reference voltage at the reference node may be 50 mV lower than the pre-charged voltage potential at the sense node when the data amplifier latch circuitry 506 senses high or 50 mV higher than the pre-charged voltage potential at the sense node when the data amplifier latch circuitry 506 senses low.

In an exemplary embodiment, in the event that a logic high (binary "1" data state) is stored in the memory cell 12, the voltage detected by the data amplifier latch circuitry 506 may be higher than the reference voltage/current when the bit line (BL) 32 is pre-charged to a low voltage (e.g., 0V). In contrast, in the event that a logic high (binary "1" data state) is stored in the memory cell 12, the voltage detected by the data amplifier latch circuitry 506 may be lower than the reference voltage/current when the bit line (BL) 32 is pre-charged to a high voltage (e.g., 2.2V). In another exemplary embodiment, in the event that a logic high (binary "1" data state) is stored in the memory cell 12, the voltage and/or current sunk or provided by the memory cell 12 at the input node (BPB) may be lower or higher than the reference voltage and/or current provided by the pre-charge circuitry 518 at the reference input node (BP). For example, the voltage provided by the memory cell 12 at input node (BPB) may be raised to a threshold voltage (Vt) level and may turn on transistor 532 to "pull" the input node (BP) low and may turn off transistor 534 and may turn on transistor 530. The input node (BPB) may be "pulled" to a voltage potential (e.g., VSL voltage potential) when transistor 536 is turned on via a signal line (SPB). For example, the transistor 530 may not turn on until the transistor 536 is turned on. In other exemplary embodiments, the signal applied via the signal line (SPB) may be pulsed low before the input node (BPB) is switched above a threshold voltage level.

In another exemplary embodiment, in the event that a logic low (binary "0" data state) is stored in the memory cell 12, the voltage and/or current provided by the memory cell 12 at the input node (BPB) may be lower or higher than the reference voltage and/or current provided by the pre-charge circuitry 518 at the reference input node (BP). For example, the voltage provided by the pre-charge circuitry 518 at input node (BP) may be raised to a threshold voltage (Vt) level, and may turn on transistor 534 to "pull" the input node (BPB) low and may turn off transistor 532 and may turn on transistor 528. The input node (BP) may be "pulled" to a voltage potential (e.g., VSL voltage potential) when transistor 536 is turned on via a signal line (SPB). For example, the transistor 528 may not turn on until the transistor 536 is turned on. In other exemplary embodiments, the signal applied via the signal line (SPB) may be pulsed low before the input node (BP) is switched above a threshold voltage level.

The data sense amplifier latch circuitry 506 may sense, sample, and/or determine the data state of a memory cell 12, and store the data state in the data sense amplifier latch circuitry 506. The data state stored in the data sense amplifier latch circuitry 506 may be read or accessed via transistors 538 and 540 of the input/output circuitry 508.

The keeper circuitry 510 may have transistors 542 and 544 coupled to each other and a predetermined voltage source via a signal source line (Keeper). As discussed above, the pre-charge circuitry 518 may pre-charge the input node (BPB) and input node (BP), the keeper circuitry 510 may supply a small amount of current to the input node (BPB) and input node (BP) in order to maintain the pre-charged voltage potential at input node (BPB) and input node (BP). For example, due to leakage effect, charges stored in the electrically floating body region 18 may be depleted via the bit line (BL) 32 and cause a variance in the pre-charged voltage potential at the input node (BPB) and/or input node (BP). By supplying a small amount of current to the input node (BPS) and input node (BP) the variance in the pre-charged voltage potential at the input node (BPS) and/or input node (BP) may be prevented and the pre-charged voltage potential at the input node (BPB) and/or input node (BP) may be maintained. In another exemplary embodiment, in the event that a current of 10 μA is applied at the input node (BPB) and a current of 20 μA is applied at the input node (BP), the voltage at the input node (BP) may be twice the voltage relative to the voltage at the input node (BPB) because twice the current is applied to the input node (BP) as is applied to the input node (BPB).

Figure 6:
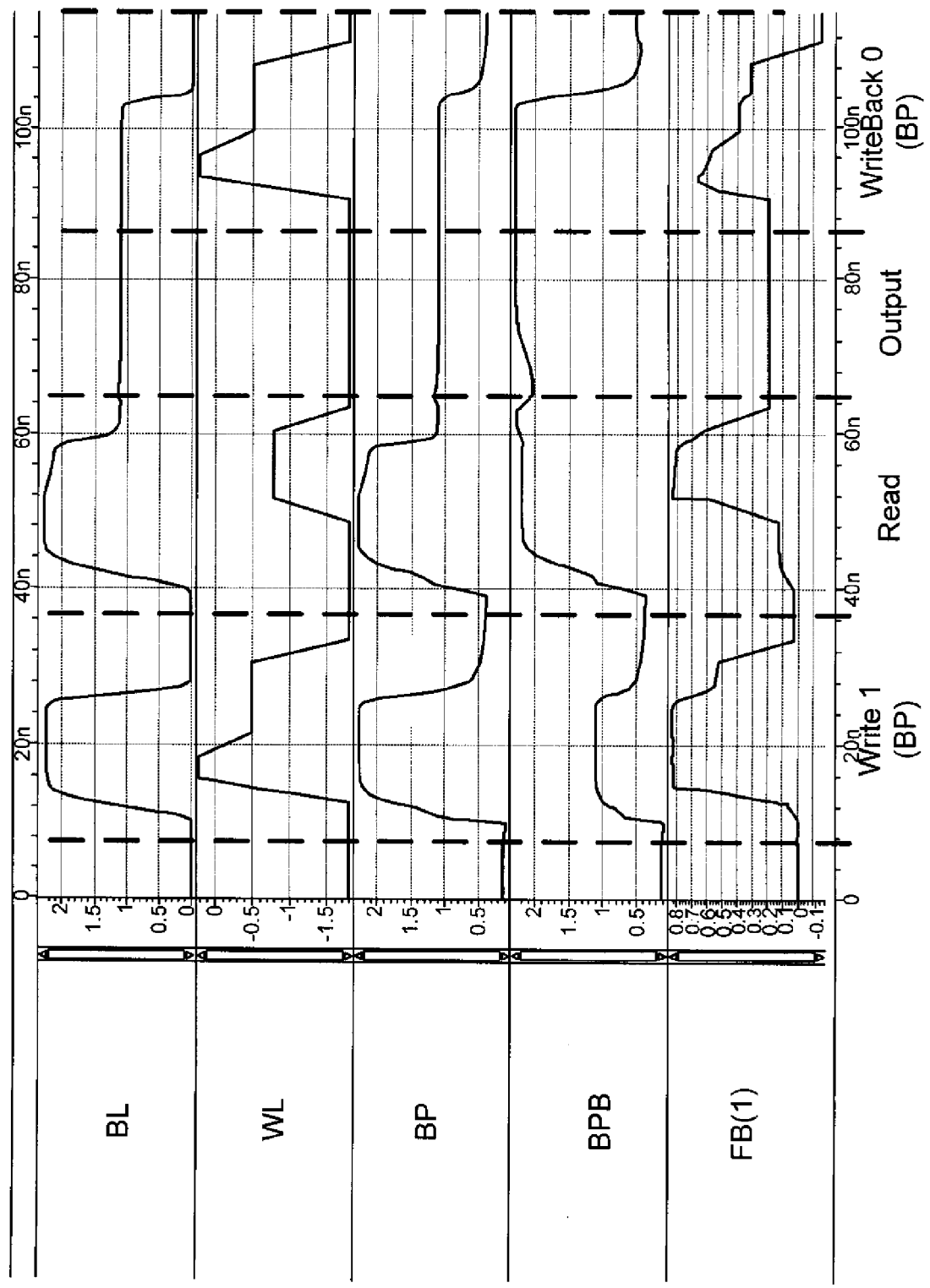
FIG. 6 shows control signal voltage waveforms for read, write, output, and writeback operations in accordance with an embodiment of the present disclosure.

Referring to FIG. 6, there are shown control signal voltage waveforms for read, write, output, and writeback operations in accordance with an embodiment of the present disclosure. The control signals may be configured to perform a write operation whereby one or more selected memory cells 12 of one or more selected rows of memory cells 12 may be selectively written or programmed to either a logic high (i.e., a binary "1" data state) or a logic low (i.e., a binary "0" date state). As shown in FIG. 6, control signals may be configured to implement a write operation (e.g., logic high (binary "1" data state)) to a memory cells 12 (e.g., a memory cell 12 having a floating body (0) shown in FIG. 5). The temporally varying control signals to implement write a logic high (i.e., a binary "1" data state) operation include a voltage potential applied to the drain region 22 of the memory transistor 14 via the bit line (BL) 32 and/or a voltage potential applied to the gate 16 of the memory transistor 14 via the word line (WL) 28. The logic high (binary "1" data state) may be written to one or more selected memory cells 12 by applying appropriate source line (SL) voltages, word line (WL) voltages, and/or bit line (BL) voltages. For example, the voltage potential applied to the drain region 22 of the memory transistor 14 via the bit line (BL) 32 may raise to a desired predetermined voltage potential level. In an exemplary embodiment, the voltage potential applied to the drain region 22 of the memory transistor 14 via the bit line (BL) 32 may be approximately 2.3V. The input node (BP) of the data sense amplifier latch circuitry 506 may be coupled to the bit line (BL) 32 and the voltage potential at the input node (BP) may raise to the same voltage potential as the bit line (BL) 32. In an exemplary embodiment, the voltage potential at the input node (BP) of the data sense amplifier latch circuitry 506 may be approximately 2.3V.

Also, the voltage potential applied to the gate 16 of the memory transistor 14 may raise to a predetermined voltage potential level. Also, the voltage potential applied to the gate 16 of the memory transistor 14 may vary during a write operation. In an exemplary embodiment, the voltage potential applied to the gate 16 of the memory transistor 14 may initially raise to approximately 0.2V and may subsequently fall to approximately −0.5V. Also, the voltage potential applied to the input node (BPB) of the data sense amplifier latch circuitry 506 may raise to a predetermined voltage potential level. In an exemplary embodiment, the voltage potential at the input node (BPB) of the data sense amplifier latch circuitry 506 may raise to approximately 1.0V. It is preferred that the source voltage potential include an amplitude which may be sufficient to maintain a bipolar current that is suitable for programming the memory cell 12 to a logic high (binary "1" data state). Therefore, majority charge carriers 34 may be generated in the electrically floating body region 18 (e.g., electrically floating body (0) shown in FIG. 5) of the memory transistor 14 via a bipolar current and majority charge carriers 34 may accumulate (and be stored) in a portion of the electrically floating body region 18 of the memory transistor 14 of the memory cell 12 that may be juxtaposed or near the gate dielectric (which is disposed between the gate 16 and the electrically floating body region 18). In an exemplary embodiment, a voltage potential of the floating body region 18 storing the majority charge carriers 34 may be approximately 0.8V.

The control signals may also be configured to perform a read operation whereby one or more selected memory cells 12 of one or more selected rows of memory cells 12 may be selectively read to determine a logic high (i.e., a binary "1"

data state) or a logic low (i.e., a binary "0" date state) is stored in the memory cells 12. The voltage potentials on the bit line (BL) 32, the word line (WL) 28, may be raised to a predetermined voltage potential to implement a read operation. As described above, the input node (BP) of the data sense amplifier latch circuitry 506 may be coupled to the bit line (BL) 32 and the voltage potential at the input node (BP) may be raised along with the bit line (BL) 32. Also, the input node (BPB) of the data sense amplifier latch circuitry 506 may be precharged to a predetermined voltage potential level, which may be used as a reference voltage potential to read a data state stored in the memory cell 12. In an exemplary embodiment, the voltage potential on the bit line (BL) 32 and at the input node (BP) of the data sense amplifier latch circuitry 506 may be raised to approximately 2.3V. Also, the input node (BPB) of the data sense amplifier latch circuitry 506 may be precharged to approximately 2.2V. Subsequently, the voltage potential on the word line (WL) 28 may be raised to approximately −0.3V. The voltage potential at the floating body region 18 of the memory cell 12 may be raised to approximately 0.8V and the data sense amplifier latch circuitry 506 may determine a data state stored in the memory cell 12 based at least in part on the voltage potential of the floating body region 18. The data state detected by the data sense amplifier latch circuitry 506 may be outputted via the input/output circuitry 508.

The control signals may also be configured to perform a writeback operation whereby one or more selected memory cells 12 of one or more selected rows of memory cells 12 may be selectively writeback a logic high (i.e., a binary "1" data state) or a logic low (i.e., a binary "0" date state) stored in the memory cells 12. The voltage potentials on the bit line (BL) 32, the word line (WL) 28, may be raised to a predetermined voltage potential to implement a writeback operation. The voltage potentials on the word line (WL) 28 may vary during the writeback operation. As described above, the input node (BP) of the data sense amplifier latch circuitry 506 may be coupled to the bit line (BL) 32 and the voltage potential at the input node (BP) may be raised along with the bit line (BL) 32. Also, the input node (BPB) of the data sense amplifier latch circuitry 506 may be precharged to a predetermined voltage potential level in order to writeback a data state stored in the memory cell 12. In an exemplary embodiment, the voltage potential on the bit line (BL) 32 and at the input node (BP) of the data sense amplifier latch circuitry 506 may be raised to approximately 1.2V. Also, the input node (BPB) of the data sense amplifier latch circuitry 506 may be precharged to approximately 2.3V. Subsequently, the voltage potential on the word line (WL) 28 may be raised to approximately 0.3V and lowered to −0.5V at a later time during the writeback operation. The voltage potential at the floating body region 18 of the memory cell 12 may be raised to approximately 0.6V to approximately −0.1V and the data state detected by the data sense amplifier latch circuitry 506 may be writeback to the memory cell 12.

Figure 7A:
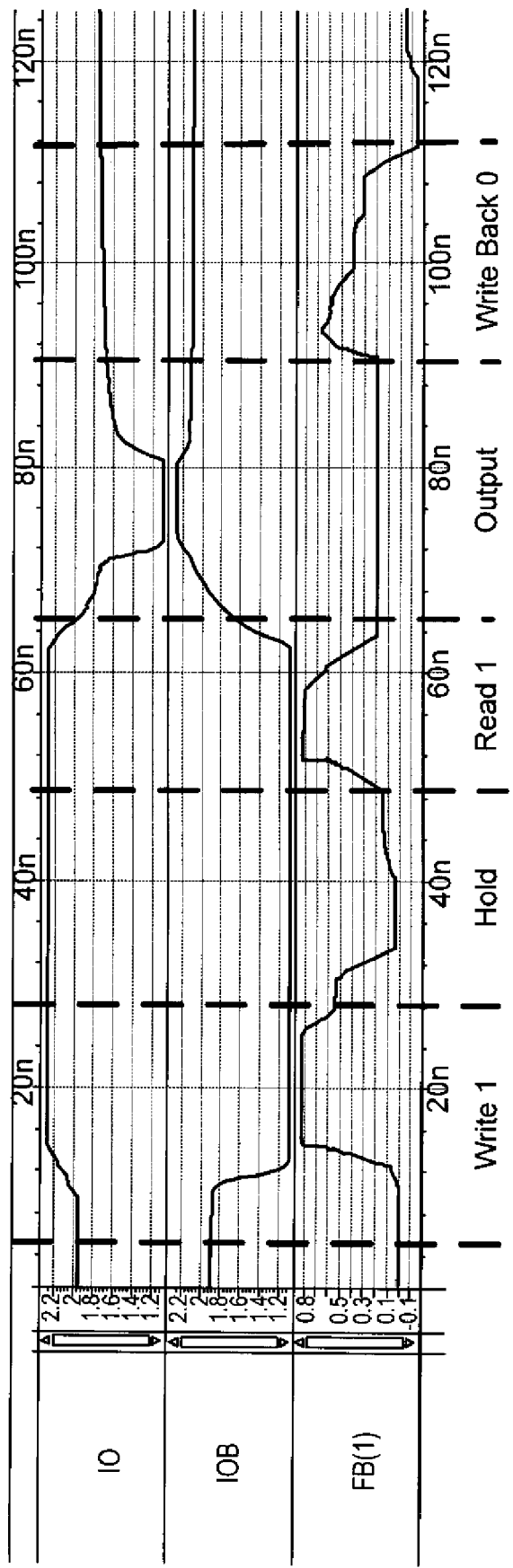
FIGS. 7A and 7B show data input/output operation control signal voltage waveforms at different timing stages of Write 1, Hold, Read 1, Output, and Write Back in accordance with an embodiment of the present disclosure.
Figure 7B:
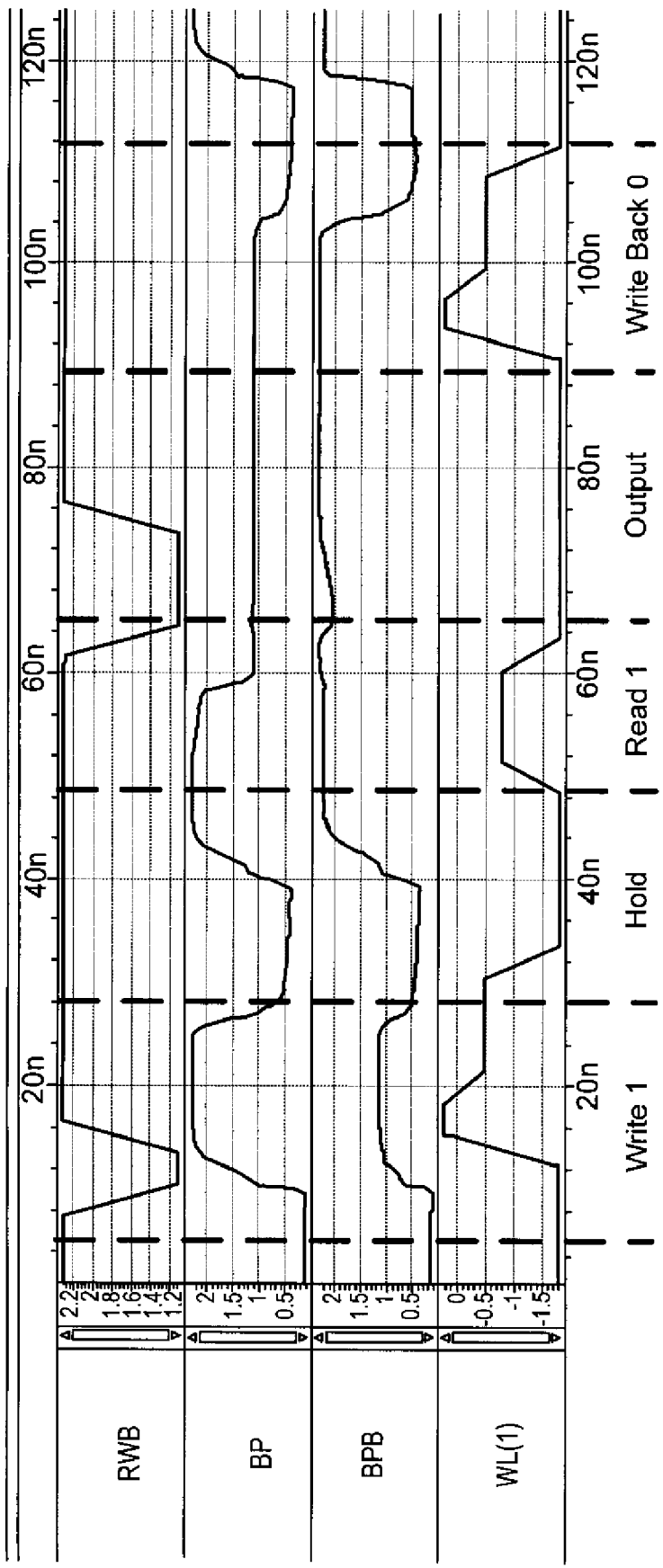

Referring to FIGS. 7A and 7B, there are shown data input/output operation control signal voltage waveforms at different timing stages of Write 1, Hold, Read 1, Output, and Write Back in accordance with an embodiment of the present disclosure. The data stored in the data sense amplifier latch circuitry 506 may be read or accessed via transistors 538 and 540 of the input/output circuitry 508. The a voltage potential (IOB) may be applied to the transistor 538 and a voltage potential (IO) may be applied to the transistor 540 in order to output a data state detected by the data sense amplifier latch circuitry 506. The voltage potential (IO) applied to the transistor 540 may be raised during a write, a hold, and a read operation to properly bias the transistor 540. Also, the voltage potential (IOB) applied to the transistor 538 may be lower during a write, a hold, and a read operation to properly bias the transistor 540. In an exemplary embodiment, the voltage potential (IO) may be raised to approximately 2.3V during a write, a hold, and a read operation. During an output operation, the voltage potential (IO) applied to the transistor 540 may be lowered, while the voltage potential (IOB) applied to the transistor 538 may be raised. In an exemplary embodiment, the voltage potential (IO) applied to the transistor 540 may be lowered to approximately 1V, while the voltage potential (IOB) applied to the transistor 538 may be raised to approximately 2.3V. Also, during a writeback operation, the voltage potential (IO) applied to the transistor 540 may be raised and the voltage potential (IOB) applied to the transistor 538 may be lowered. In an exemplary embodiment, the voltage potential (IO) applied to the transistor 540 may be raised to approximately 1.6V and the voltage potential (IOB) applied to the transistor 538 may be lowered to approximately 2V.

Also, shown in FIG. 7B, during the write operation, read operation, output operation, and the writeback operation, the voltage potentials on the word line (WL) 28 and at the input nodes (BP) and (BPB) of the data sense amplifier latch circuitry 506 may be similar to the voltage potentials illustrated in FIG. 6, as described above. A voltage potential (RWB) may be applied to the gate 16 of the transistors 538 and 540 in order to control an operation of the transistors 538 and 540. As shown in FIG. 7B, the voltage potential (RWB) applied to the gate 16 of the transistor 538 and 540 may be lowered during a write operation and/or an output operation. In an exemplary embodiment, the voltage potential (RWB) applied to the gate 16 of the transistors 538 and 540 may be lowered to approximately 1.1V during a write operation and/or an output operation.

Figure 8A:
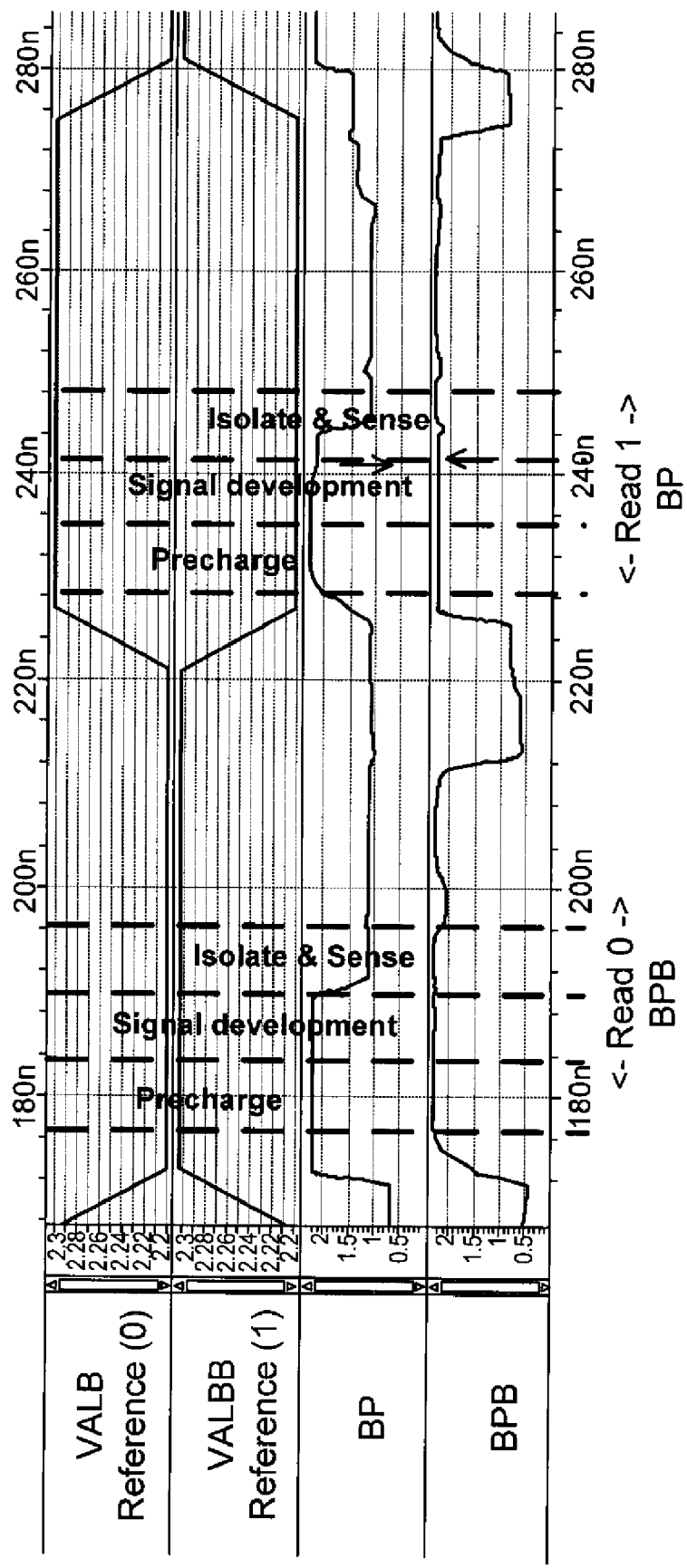
FIGS. 8A and 8B show sense control signal voltage waveforms for performing one or more read operations in accordance with an embodiment of the present disclosure.
Figure 8B:
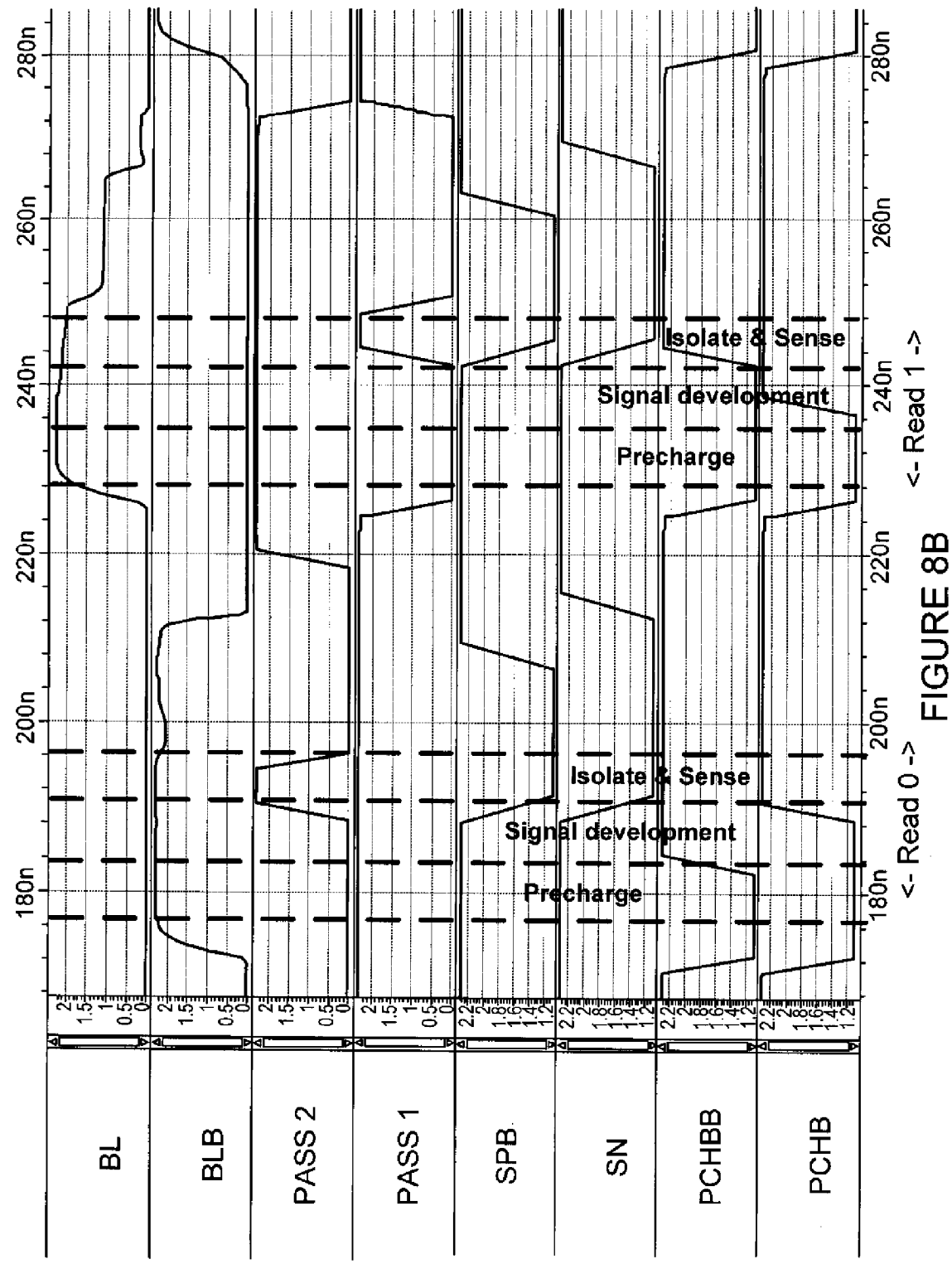

Referring to FIGS. 8A and 8B, there are shown sense control signal voltage waveforms for performing one or more read operations in accordance with an embodiment of the present disclosure. For example, one or more read operations may include a read logic low (binary "0" data state) operation and/or a read logic high (binary "1" data state) operation. The voltage potentials applied to the data sense circuitry 502 (shown in FIG. 5) may be different for a read logic low (binary "0" data state) operation and a read logic high (binary "1" data state) operation. Each of the read logic low (binary "0" data state) and the read logic high (binary "1" data state) may be divided into one or more segments. For example, each of the read logic low (binary "0" data state) and the read logic high (binary "1" data state) may include a precharge segment, a signal development segment, and/or an isolate and sense segment.

During a reading logic low (binary "0" data state), input nodes (BP) and (BPB) of the data sense amplifier latch circuitry 506 may be precharged to a predetermined voltage potential level during the precharge segment. In an exemplary embodiment, the input node (BP) (e.g., reference node) of the data sense amplifier latch circuitry 506 may be precharged to a voltage potential of approximately 2.2V and the input node (BPB) (e.g., sense node) of the data sense amplifier latch circuitry 506 may be precharged to a voltage potential of approximately 2.3V. As discussed above, the input nodes of the data sense amplifier latch circuitry 506 may be precharged by the precharge circuitry 518. For example, the input node (BP) of the data sense amplifier latch circuitry 506 may be precharged to a predetermined voltage potential level via the transistor 526. The input node (BPB) of the data sense amplifier latch circuitry 506 may be precharged to a predetermined voltage potential level via the transistor 524. A voltage potential (VALBB) may be applied the transistor 524 in order to precharge the input node (BPB) of the data sense amplifier latch circuitry 506. A voltage potential (VALB) may be applied to the transistor 526 in order to precharge the input node (BP) of the data sense amplifier latch circuitry 506. In an exemplary embodiment, during the precharge segment of a read logic low (binary "0" data state), a voltage potential (VALBB) applied to the transistor 524 may be raised to approximately 2.3V from 2.2V and a voltage potential (VALB) applied to the transistor 526 may be lowered to approximately 2.2V from 2.3V.

During a signal development segment of a read logic low (binary "0" data state") operation, a voltage potential at input nodes (BP) and (BPB) of the data sense amplifier latch circuitry 506 may remain the same as the voltage potential during the precharge segment. In an exemplary embodiment, a voltage potential at the input node (BPB) of the data sense amplifier latch circuitry 506 may remain at approximately 2.3V and a voltage potential at the input node (BP) of the data sense amplifier latch circuitry 506 may remain at approximately 2.2V. Also, the voltage potential (VALB) and the voltage potential (VALBB) during the signal development segment may remain the same as during the precharge segment of the read logic low (binary "0" data state) operation. In an exemplary embodiment, a voltage potential (VALB) applied to the transistor 526 may remain at approximately 2.2V and a voltage potential (VALBB) applied to the transistor 524 may remain at approximately 2.3V.

During the isolate and sense segment of a read logic low (binary "0" data state) operation, the voltage potential at the input node (BP) of the data sense amplifier latch circuitry 506 may be lowered while the voltage potential at the input node (BPB) of the data sense amplifier latch circuitry 506 may remain constant. In an exemplary embodiment, the voltage potential at the input node (BP) of the data sense amplifier latch circuitry 506 may be lowered to approximately 1.1V from 2.3V while the voltage potential at the input node (BPB) of the data sense amplifier latch circuitry 506 may remain constant at approximately 2.3V. Also, the voltage potential (VALB) applied to the transistor 526 and the voltage potential (VALBB) applied to the transistor 524 may remain constant. In an exemplary embodiment, the voltage potential (VALB) applied to the transistor 526 may remain constant at approximately 2.2V and the voltage potential (VALBB) applied to the transistor 524 may remain constant at approximately 2.3V.

During a reading logic high (binary "1" data state), input nodes (BP) (e.g., sense node) and input node (BPB) (e.g., reference node) of the data sense amplifier latch circuitry 506 may be precharged to a predetermined voltage potential level during the precharge segment. In an exemplary embodiment, the input node (BP) of the data sense amplifier latch circuitry 506 may be precharged to a voltage potential of approximately 2.3V and the input node (BPB) of the data sense amplifier latch circuitry 506 may be precharged to a voltage potential of approximately 2.2V. As discussed above, the input nodes of the data sense amplifier latch circuitry 506 may be precharged by the precharge circuitry 518 comprising transistors 524 and 526. For example, the input node (BP) of the data sense amplifier latch circuitry 506 may be precharged to a predetermined voltage potential level via the transistor 526. The input node (BPB) of the data sense amplifier latch circuitry 506 may be precharged to a predetermined voltage potential level via the transistor 524. A voltage potential (VALBB) may be applied the transistor 524 in order to precharge the input node (BPB) of the data sense amplifier latch circuitry 506. A voltage potential (VALB) may be applied to the transistor 526 in order to precharge the input node (BP) of the data sense amplifier latch circuitry 506. In an exemplary embodiment, during the precharge segment of a read logic high (binary "1" data state), a voltage potential (VALBB) applied to the transistor 524 may be lowered to approximately 2.2V from 2.3V and a voltage potential (VALB) applied to the transistor 526 may be raised to approximately 2.3V from 2.2V.

During a signal development segment of a read logic high (binary "1" data state") operation, a voltage potential at input nodes (BP) and (BPB) of the data sense amplifier latch circuitry 506 may not remain the same as the voltage potential during the precharge segment. In an exemplary embodiment, a voltage potential at the input node (BP) of the data sense amplifier latch circuitry 506 may be pulled low to approximately 2.1V by the voltage and/or current generated by the memory cell 12 and a voltage potential at the input node (BPB) of the data sense amplifier latch circuitry 506 may remain at approximately 2.2V. Also, the voltage potential (VALB) and the voltage potential (VALBB) during the signal development segment may remain the same as during the precharge segment of the read logic high (binary "1" data state) operation. In an exemplary embodiment, a voltage potential (VALB) applied to the transistor 526 may remain at approximately 2.3V and a voltage potential (VALBB) applied to the transistor 524 may remain at approximately 2.2V.

During the isolate and sense segment of a read logic high (binary "1" data state) operation, the voltage potential at the input node (BP) of the data sense amplifier latch circuitry 506 may be lowered while the voltage potential at the input node (BPB) of the data sense amplifier latch circuitry 506 may remain constant. In an exemplary embodiment, the voltage potential at the input node (BP) of the data sense amplifier latch circuitry 506 may be lowered to approximately 1.1V from 2.3V while the voltage potential at the input node (BPB) of the data sense amplifier latch circuitry 506 may remain constant at approximately 2.2V. Also, the voltage potential (VALB) applied to the transistor 526 and the voltage potential (VALBB) applied to the transistor 524 may remain constant. In an exemplary embodiment, the voltage potential (VALB) applied to the transistor 526 may remain constant at approximately 2.3V and the voltage potential (VALBB) applied to the transistor 524 may remain constant at approximately 2.2V.

The data sense amplifier latch circuitry 506 may detect data states of a plurality of memory cells 12 (e.g., memory cell (FB(0) and memory cell (FB(1)). The input node (BP) of the data sense amplifier latch circuitry 506 may be coupled to a memory cell 12 via a bit line (BL) 32 and the input node (BPB) of the data sense amplifier latch circuitry 506 may be coupled to a memory cell 12 via a bit line (BLB) 32. A read logic low (binary "0" data state) operation or a read logic high (binary "1" data state) operation may be performed for the memory cells via the bit line (BL) 32 or the bit line (BLB) 32. As illustrated in FIG. 8B, a read logic low (binary "0" data state) operation may be performed for the memory cell 12 coupled to the bit line (BLB) 32 and a read logic high (binary "1" data state) operation may be performed for the memory cell 12 coupled to the bit line (BL) 32. In an exemplary embodiment, a voltage potential on the bit line (BLB) 32 may be raised to approximately 2.3V from 0V, during a read logic low (binary "0" data state) and a voltage potential on the bit line (BL) 32 may be raised to approximately 2.3V from 0V, during a read logic high (binary "1" data state).

As discussed above, the data sense amplifier latch circuitry 506 may detect data states of a plurality of memory cells 12. The data sense amplifier latch circuitry 506 may select to detect data states of memory cells 12 via the plurality of switch circuitries 514. A voltage potential (PASS1) may be applied to a first switch circuitry 514 and a second voltage potential (PASS2) may be applied to a second switch circuitry 514 in order to couple the memory cells 12 to the data sense amplifier latch circuitry 506. In an exemplary embodiment, a voltage potential (PASS2) may remain low (e.g., approximately 0V) during a precharge segment and/or a signal development segment of a read logic low (binary "0" data state). Subsequently, the voltage potential (PASS2) may raise to approximately 2.3V from 0V during the isolation and sense segment of the read logic low (binary "0" data state) operation. Also, a voltage potential (PASS1) may remain constant at approximately 2.3V during a read logic low (binary "0" data state). In another exemplary embodiment, a voltage potential (PASS2) may remain constant at approximately 2.3V. A voltage potential (PASS1) may be lowered to approximately 0V from 2.3V during the precharge segment and/or the signal development segment of the read logic high (binary "1" data state) operation. The voltage potential (PASS1) may be raised to approximately 2.3V from 0V, during the isolate and sense segment of a read logic high (binary "1" data state) operation.

One or more voltage potentials may be applied to the data sense amplifier latch circuitry 506 in order to perform a read logic low (binary "0" data state) operation and/or a read logic high (binary "0" data state) operation. For example, a voltage potential (SPB) may be applied to the transistor 536 of the data sense amplifier latch circuitry 506 to control a voltage potential at the transistors 528 and 530. A voltage potential (SN) may be applied to the data sense amplifier latch circuitry 506 to control a voltage potential at the transistors 532 and 534. The voltage potential (SPB) and the voltage potential (SN) applied to the data sense amplifier latch circuitry 506 may be similar during a read logic low (binary "0" data state) operation. In an exemplary embodiment, a voltage potential (SPB) applied to the data sense amplifier latch circuitry 506 may remain high (e.g., at approximately 2.3V) during the precharge segment and/or the signal development segment of a read logic low (binary "0" data state) operation. The voltage potential (SPB) may be lowered to approximately 1V from 2.3V during the isolate and sense segment of a read logic low (binary "0" data state) operation. A voltage potential (SN) may be configured in a similar manner as the voltage potential (SPB) during a read logic low (binary "0" data state) operation.

During a read logic high (binary "1" data state) operation, a voltage potential (SPB) may remain high during the precharge segment and/or the signal development segment and may be lowered during the isolate and sense segment. Also, a voltage potential (SN) may be configured in a similar manner as the voltage potential (SPB) during a read logic high (binary "1" data state) operation. In an exemplary embodiment, a voltage potential (SPB) applied to the data sense amplifier latch circuitry 506 may be approximately 2.3V during the precharge segment and/or the signal development segment of a read logic high (binary "1" data state) operation. The voltage potential (SPB) may be lowered to approximately 1V from 2.3V during the isolate and sense segment of the read logic high (binary "1" data state) operation. The voltage potential (SN) may be configured in a similar manner as the voltage potential (SPB) during the read logic high (binary "1" data state) operation.

As discussed above, the input node (BP) and the input node (BPB) of the data sense amplifier latch circuitry 506 may be precharged by the precharge circuitry 518. A voltage potential (PCHBB) may be applied to the transistor 524 of the precharge circuitry 518 to bias the input node (BPB) of the data sense amplifier latch circuitry 506. A voltage potential (PCHB) may be applied to the transistor 526 of the precharge circuitry 518 to bias the input node (BP) of the data sense amplifier latch circuitry 506. During a read logic low (binary "0" data state) operation, the voltage potential (PCHBB) and the voltage potential (PCHB) may be varied to bias the input nodes (BPB) and (BP) of the data sense amplifier latch circuitry 506. In an exemplary embodiment, a voltage potential (PCHBB) may be lowered to approximately 1V from 2.3V, during the precharge segment of a read logic low (binary "0" data state) operation. The voltage potential (PCHBB) may be raised to approximately 2.3V from 1V, during the signal development segment and/or the isolate and sense segment of the read logic low (binary "0" data state) operation. A voltage potential (PCHB) may be lowered to approximately 1V from 2.3V, during the precharge segment and/or the signal development segment of a read logic low (binary "0" data state) operation. The voltage potential (PCHB) may be raised to approximately 2.3V from 1V, during the isolate and sense segment of the read logic low (binary "0" data state) operation.

In another exemplary embodiment, a voltage potential (PCHBB) may be lowered to approximately 1V from 2.3V, during the precharge segment and/or the signal development segment of a read logic high (binary "1" data state) operation. The voltage potential (PCHBB) may be raised to approximately 2.3V from 1V, during the isolate and sense segment of the read logic high (binary "1" data state) operation. A voltage potential (PCHB) may be lowered to approximately 1V from 2.3V, during the precharge segment of a read logic high (binary "1" data state) operation. The voltage potential (PCHB) may be raised to approximately 2.3V from 1V, during the signal development segment and/or the isolate and sense segment of the read logic high (binary "1" data state) operation.

Figure 9B:
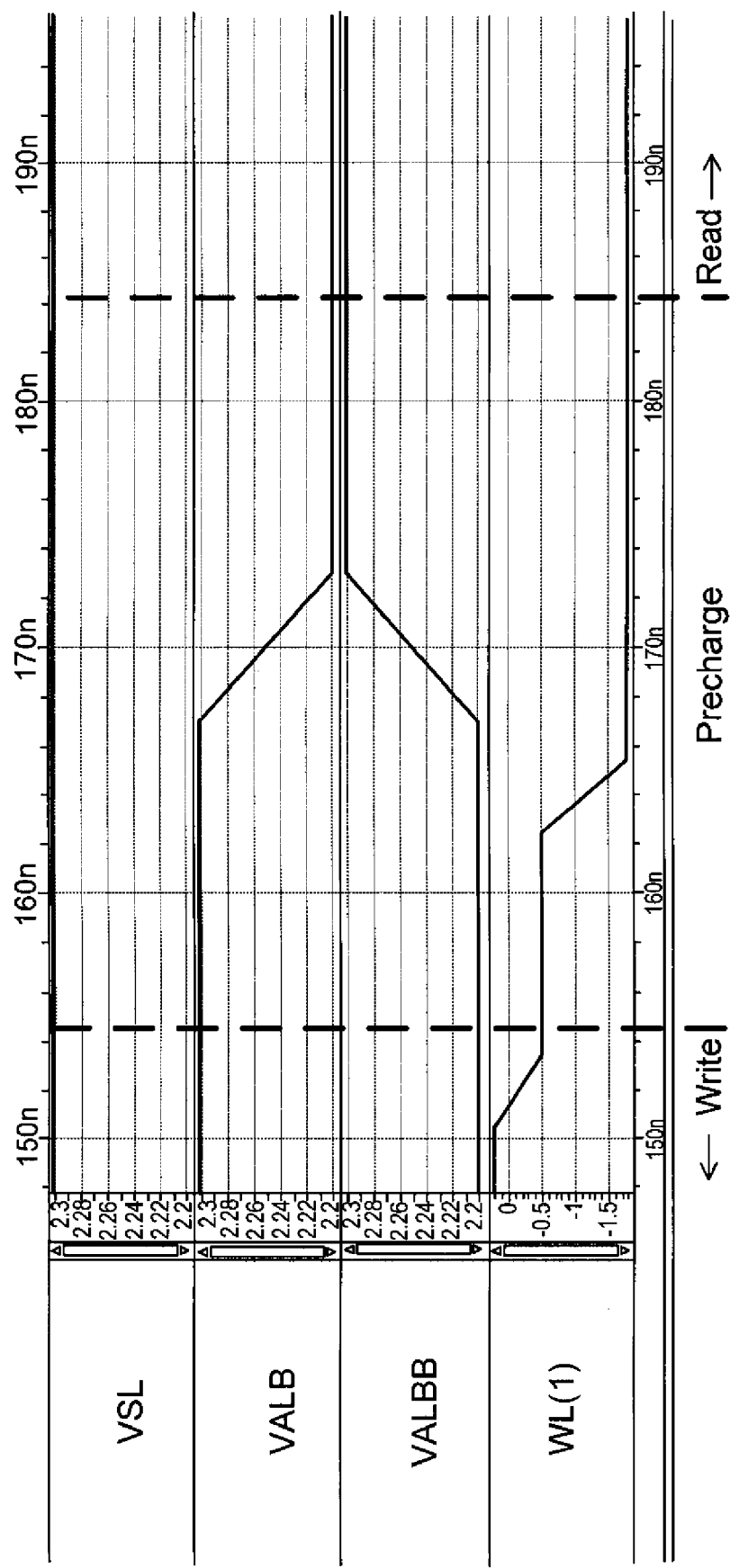

Referring to FIGS. 9A and 9B, there are shown precharge operation timing control signal voltage waveforms in accordance with an embodiment of the present disclosure. An exemplary precharge operation may follow a write operation and follow by a read operation. As illustrated in FIGS. 9A and 9B, the precharge operation may begin at approximately 151 nanoseconds and may end at approximately 181 nanoseconds. During a precharge operation, a voltage potential (HLD) applied to the hold circuitry 516 having a transistor 522 may be varied. For example, the voltage potential (HLD) applied to the hold circuitry 516 may raise to 1V from 0V for approximately 10 ns. Subsequently, the voltage potential (HLD) may fall back down to 0V for the remainder of the precharge operation. The change in the voltage potential (HLD) may cause a corresponding change in the bit line (BL) and (BLB) voltage potentials. For example, a raise in the voltage potential (HLD) for the hold circuitry 516 may cause a corresponding fall in the bit line (BL) and (BLB) voltage potential. In an exemplary embodiment, the raise in the voltage potential (HLD) for the hold circuitry 516 may cause the bit line (BL) voltage potential to fall to approximately 0V from 2.3V. The bit line (BL) voltage potential may remain at 0V for the remainder of the precharge operation. The voltage potential at the input node (BP) may fall corresponding to the fall in the bit line (BL) voltage potential. In an exemplary embodiment, the fall of the bit line (BL) voltage potential may cause the voltage potential at the input node (BP) of the data sense amplifier latch circuitry 506 to fall to approximately 0.5V from 2.3V.

As discussed above, the data sense amplifier latch circuitry 506 may be precharged by the precharge circuitry 518. Also, a voltage potential (VSL) may be applied to the data sense amplifier latch circuitry 506 during the precharge operation. In an exemplary embodiment, the voltage potential (VSL)

applied to the data sense amplifier latch circuitry 506 may be approximately 2.3V for the duration of the precharge operation. The precharge circuitry 518 may comprise transistors 524 and 526. The transistor 524 may precharge the first input node (BPB) of the data sense amplifier latch circuitry 506 and the transistor 526 may precharge the second input node (BP) of the data sense amplifier latch circuitry 506. A voltage potential (PCHBB) may be applied to the gate 16 of the transistor 524 and a voltage potential (VALBB) may be applied to the source region 20 of the transistor 524. The voltage potential (VALBB) (e.g., shown in FIG. 9B) may raise first followed by a fall in the voltage potential (PCHBB) during the precharge operation to properly bias the transistor 524.

In an exemplary embodiment, the voltage potential (VALBB) may start to raise at approximately 168 ns to approximately 2.3V from 2.2V. Subsequently, the voltage potential (PCHBB) may start to fall at approximately 171 ns to approximately 1.1V from 2.3V. In other exemplary embodiments, a voltage potential (PCHB) may be applied to the gate 16 of the transistor 526 and a voltage potential (VALB) may be applied to the source region 20 of the transistor 526. The voltage potential (VALB) (e.g., shown in FIG. 9B) may fall first follow by a fall in the voltage potential (PCHB) during the precharge operation to properly bias the transistor 526. In an exemplary embodiment, the voltage potential (VALB) may start to fall at approximately 168 ns to approximately 2.2V from 2.3V. Subsequently, the voltage potential (PCHB) may start to fall at approximately 171 ns to approximately 1.1V from 2.3V.

After applying proper voltage potential to the transistors 524 and 526 of the precharge circuitry 516, the first input nodes (BP) and the second input node (BPB) of the data sense amplifier latch circuitry 506 may be properly precharged. In an exemplary embodiment, the voltage potential at the first input node (BP) of the data sense amplifier latch circuitry 506 may be precharged to approximately 2.2V from 0.5V and the voltage potential at the second input node (BPB) of the data sense amplifier latch circuitry 506 may be precharged to approximately 2.3V from 0.5V. The raise in the voltage potential at the input node (BPB) of the data sense amplifier latch circuitry 506 may cause a corresponding raise in voltage potential on the bit line (BLB). In an exemplary embodiment, the raise in the voltage potential at the input node (BPB) of the data sense amplifier latch circuitry 506 may cause the voltage potential on the bit line (BLB) to raise to approximately 2.3V from 0V.

As illustrated in FIG. 9B, the voltage potential on the word line (WL) 28 may vary to properly bias the memory cell 12 during the precharge operation. In an exemplary embodiment, the voltage potential on the word line (WL) 28 may start to fall at approximately 165 ns to approximately −1.5V from −0.5V.

Figure 10A:
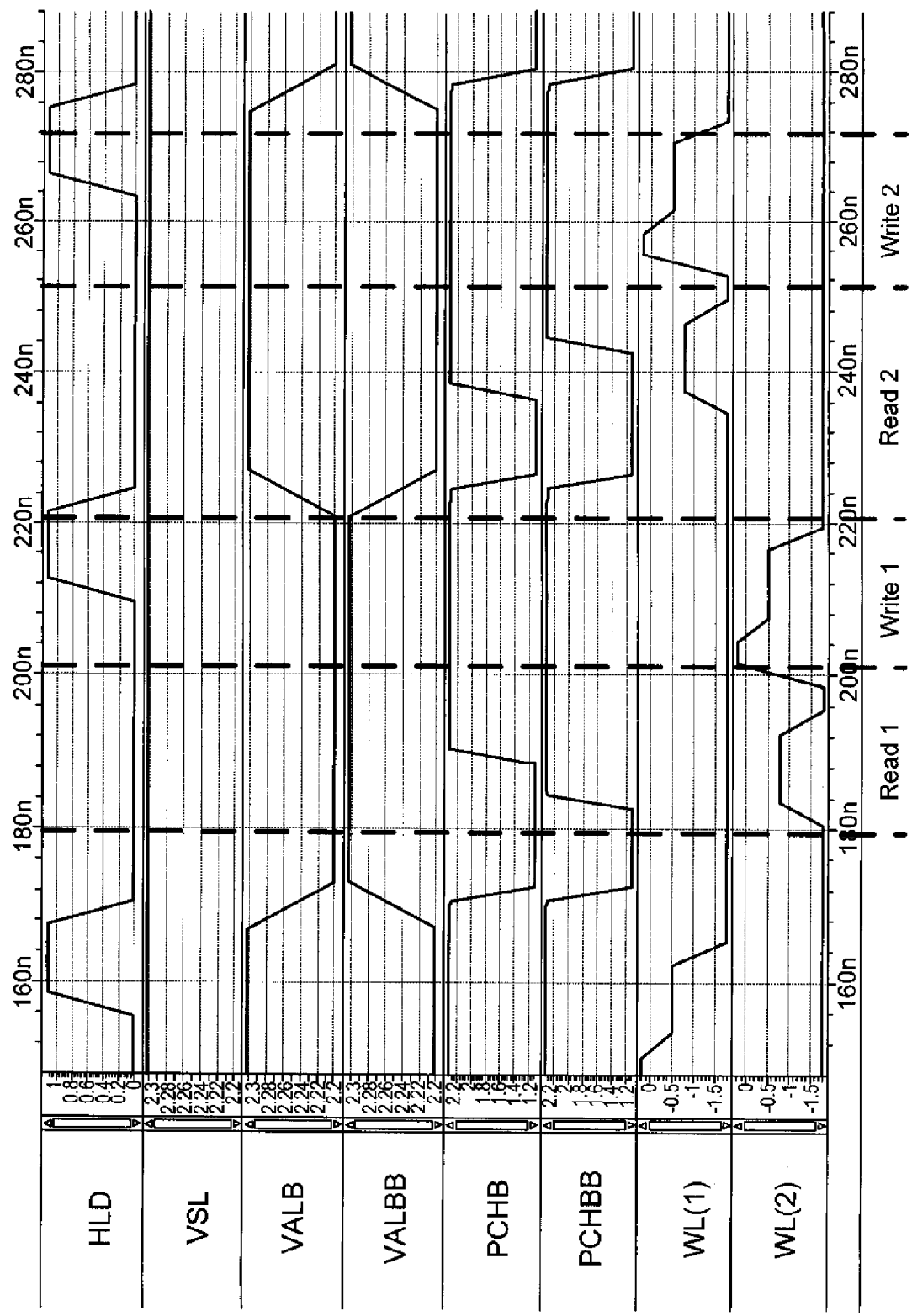
FIGS. 10A and 10B show control signal voltage waveforms for read and write operations in accordance with an embodiment of the present disclosure.
Figure 10B:
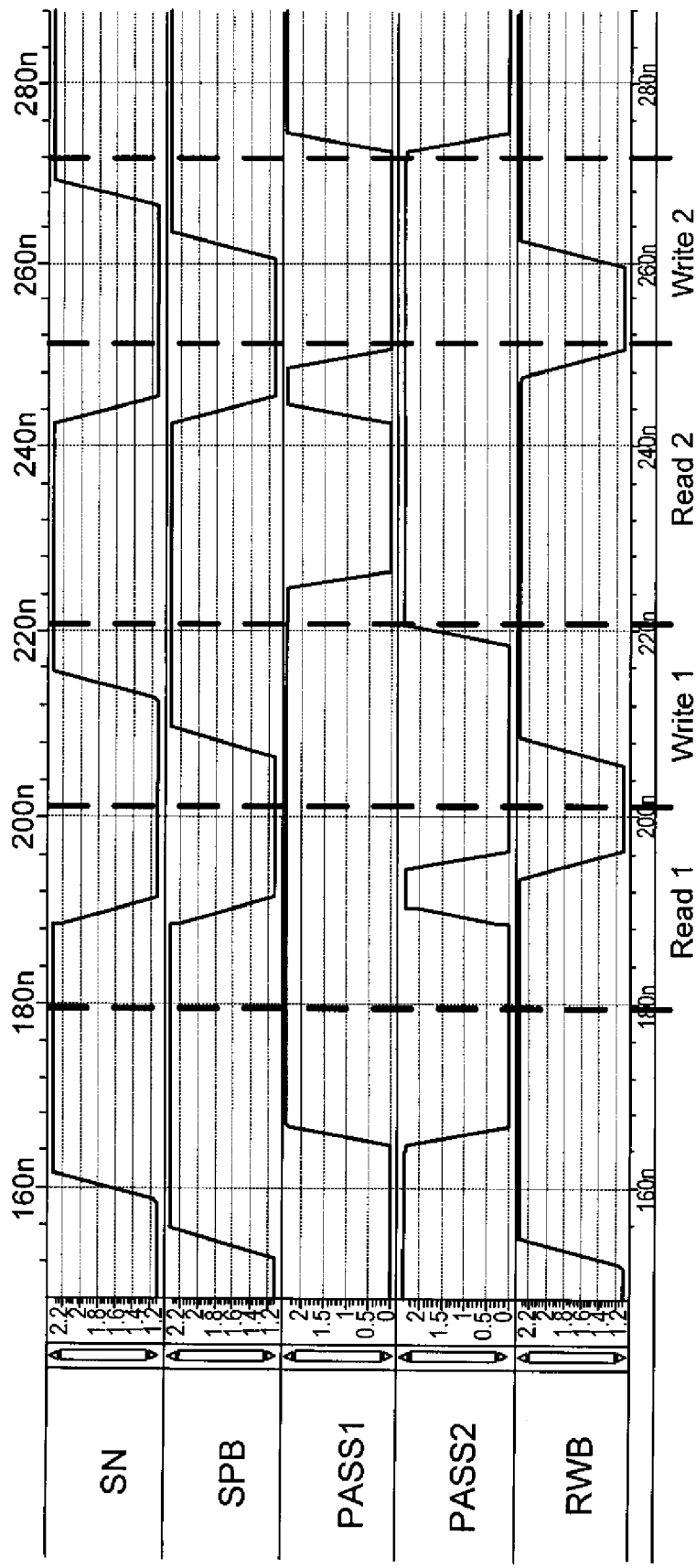

Referring to FIGS. 10A and 10B, there are shown control signal voltage waveforms for read and write operations in accordance with an embodiment of the present disclosure. One or more read operations may be performed wherein the data sense amplifier latch circuitry 506 may detect one or more data states stored in the memory cells 12. As illustrated in FIG. 10A, a first read operation (Read 1) may be performed follow by a first write operation (Write 1) for a memory cell 12. Also, a second read operation (Read 2) may be performed follow by a second write operation (Write 2) for another memory cell 12. During a first read operation, a word line (WL) 28 associated with a first memory cell 12 may remain inactive while a word line (WL) 28 associated with a second memory cell 12 may vary to bias the second memory cell 12 for the read operation. In an exemplary embodiment, a voltage potential (WL(1)) on the word line (WL) 28 associated with a first memory cell 12 may remain constant at approximately −1.5V. A voltage potential (WL(2)) on the word line (WL) 28 associated with a second memory cell 12 may raise from approximately −1.5V to −0.075V for 4 ns before fall back down to approximately −1.5V during the read operation. During a second read operation, a word line (WL) 28 associated with a first memory cell 12 may vary to bias the first memory cell 12 for the read operation while a word line (WL) 28 associated with a second memory cell 12 may remain inactive. In an exemplary embodiment, a voltage potential (WL(1)) on the word line (WL) 28 associated with a first memory cell 12 may raise from approximately −1.5V to −0.075V for 4 ns before fall back down to approximately −1.5V during the read operation. A voltage potential (WL(2)) on the word line (WL) 28 associated with a second memory cell 12 may remain constant at approximately −1.5V.

During the first read operation (Read 1), a voltage potential (HLD) applied to the hold circuitry 516 may remain constant. In an exemplary embodiment, the voltage potential (HLD) may remain at approximately 0V during a first read operation. The voltage potential (HLD) applied during the second read operation (Read 2) may vary. In an exemplary embodiment, the voltage potential (HLD) may fall to approximately 0V from 1.1V during the second read operation (Read 2).

During a read operation, different voltage potentials may be applied to the precharge circuitry 518. A voltage potential (VALBB) may be applied to the source region 20 of the transistor 524 and a voltage potential (PCHBB) may be applied to the gate 16 of the transistor 524. For example, during the first read operation (Read 1) the voltage potential (VALBB) may remain constant, while the voltage potential (PCHBB) may vary during the read operation. In an exemplary embodiment, the voltage potential (VALBB) may remain at approximately 2.3V, while the voltage potential (PCHBB) may increase from approximately 1.2V to 2.3V. Also, a voltage potential (VALB) may be applied to the source region 20 of the transistor 526 and a voltage potential (PCHB) may be applied to the gate 16 of the transistor 526. The voltage potential (VALB) may remain constant, while the voltage potential (PCHB) may vary during the read operation. In an exemplary embodiment, the voltage potential (VALB) may remain at approximately 2.2V, while the voltage potential (PCHB) may increase from approximately 1.2V to 2.3V.

During the second read operation (Read 2) the voltage potential (VALBB) may remain constant, while the voltage potential (PCHBB) may vary during the read operation. In an exemplary embodiment, the voltage potential (VALBB) may remain at approximately 2.2V, while the voltage potential (PCHBB) may fall to approximately 1.2V from 2.3V for approximately 20 ns before raise back to approximately 2.3V. Also, the voltage potential (VALB) may remain constant, while the voltage potential (PCHB) may vary during the second read operation (Read 2). In an exemplary embodiment, the voltage potential (VALB) may remain at approximately 2.3V, while the voltage potential (PCHB) may fall to approximately 1.2V from 2.3V for approximately 15 ns before raise back to approximately 2.3V.

Also, various voltage potentials may be applied to the data sense amplifier latch circuitry 506 during a read operation. For example, a voltage potential (VSL) may be applied to the source region 20 of the transistor 536 and a voltage potential (SPD) may be applied to the gate 16 of the transistor 536. The voltages potentials (VSL) and (SPD) may properly bias the transistor 536 of the data sense amplifier latch circuitry 506 for a read operation. The voltage potential (VSL) may remain constant during one or more read operations (e.g., first read operation (Read 1) and a second read operation (Read 2)). In an exemplary embodiment, the voltage potential (VSL) may remain approximately 2.3V during the first read operation (Read 1) and the second read operation (Read 2). The voltage potential (SPD) may vary during a read operation. In an exemplary embodiment, the voltage potential (SPD) may fall from approximately 2.3V to approximately 1.1V during a first read operation (Read 1) and/or a second read operation (Read 2). Another voltage potential (SN) may be applied to the transistors 532 and 534 of the data sense amplifier latch circuitry 506. The voltage potential (SN) applied to the transistors 532 and 534 may vary during a read operation. In an exemplary embodiment, the voltage potential (SN) may fall from approximately 2.3V to approximately 1.1V during a first read operation (Read 1) and/or a second read operation (Read 2).

During a read operation, switch circuitry 514 may be biased in order to couple the data sense amplifier latch circuitry 506 to one or more memory cells 12. During a first read operation (Read 1), a first voltage potential (PASS1) applied to the first switch circuitry 514 may remain constant while a second voltage potential (PASS 2) applied to the second switch circuitry 514 may vary. In an exemplary embodiment, the first voltage potential (PASS1) applied to the first switch circuitry 514 may remain at approximately 2.3V during a first read operation. The second voltage potential (PASS 2) applied to the second switch circuitry 514 may raise to approximately 2.3V from 0V for approximately 5 ns before fall back down to 0V.

During a second read operation (Read 2), the first voltage potential (PASS1) applied to the first switch circuitry 514 may vary while a second voltage potential (PASS 2) applied to the second switch circuitry 514 may remain constant. In an exemplary embodiment, the first voltage potential (PASS1) applied to the first switch circuitry 514 may fall to approximately 0V from 2.3V and raise to approximately 2.3V from 0V for approximately 5 ns before fall back down to 0V. The second voltage potential (PASS 2) applied to the second switch circuitry 514 may remain at approximately 2.3V during a second read operation (Read 2).

One or more write operations may be performed wherein the data sense amplifier latch circuitry 506 may write one or more data states (e.g., logic low (binary "0" data state) and/or logic high (binary "1" data state)) to the memory cells 12. During a first read operation, a word line (WL) 28 associated with a first memory cell 12 may remain inactive while a word line (WL) 28 associated with a second memory cell 12 may vary to bias the second memory cell 12 for the write operation. In an exemplary embodiment, a voltage potential (WL(1)) on the word line (WL) 28 associated with a first memory cell 12 may remain constant at approximately −1.5V. A voltage potential (WL(2)) on the word line (WL) 28 associated with a second memory cell 12 may raise from approximately −1.5V to 0.0V for approximately 4 ns before fall down to approximately −0.5V for approximately 10 ns and back down to approximately −1.5V. During a second write operation, a word line (WL) 28 associated with a first memory cell 12 may vary to bias the first memory cell 12 for the write operation while a word line (WL) 28 associated with a second memory cell 12 may remain inactive. In an exemplary embodiment, a voltage potential (WL(1)) on the word line (WL) 28 associated with a first memory cell 12 may raise from approximately −1.5V to 0.0V for approximately 4 ns before fall back down to approximately −0.5V for approximately 10 ns and back down to approximately −1.5V. A voltage potential (WL (2)) on the word line (WL) 28 associated with a second memory cell 12 may remain constant at approximately −1.5V during the second write operation.

During the first write operation (Write 1), a voltage potential (HLD) applied to the hold circuitry 516 may vary. In an exemplary embodiment, the voltage potential (HLD) may raise to approximately 2.3V from 0.0V during a first write operation. The voltage potential (HLD) applied during the second write operation (Write 2) may vary in a similar manner as the first write operation. In an exemplary embodiment, the voltage potential (HLD) may raise to approximately 2.3V from 0.0V during the second write operation (Write 2).

During a write operation, different voltage potentials may be applied to the precharge circuitry 518. A voltage potential (VALBB) may be applied to the source region 20 of the transistor 524 and a voltage potential (PCHBB) may be applied to the gate 16 of the transistor 524. For example, during the first write operation (Write 1), the voltage potential (VALBB) and the voltage potential (PCHBB) may remain constant during the read operation. In an exemplary embodiment, the voltage potential (VALBB) may remain at approximately 2.3V and the voltage potential (PCHBB) may remain at approximately 2.3V. Also, a voltage potential (VALB) may be applied to the source region 20 of the transistor 526 and a voltage potential (PCHB) may be applied to the gate 16 of the transistor 526. The voltage potential (VALB) and the voltage potential (PCHB) may remain constant during the first write operation. In an exemplary embodiment, the voltage potential (VALB) may remain at approximately 2.2V and the voltage potential (PCHB) may remain at approximately 2.3V.

During the second write operation (Write 2) the voltage potential (VALBB) and the voltage potential (PCHBB) may remain constant during the second write operation. In an exemplary embodiment, the voltage potential (VALBB) may remain at approximately 2.2V and the voltage potential (PCHBB) may remain at approximately 2.3V. Also, the voltage potential (VALB) and the voltage potential (PCHB) may remain constant during the second write operation (Write 2). In an exemplary embodiment, the voltage potential (VALB) may remain at approximately 2.3V and the voltage potential (PCHB) may remain at approximately 2.3V.

Also, various voltage potentials may be applied to the data sense amplifier latch circuitry 506 during a write operation. For example, a voltage potential (VSL) may be applied to the source region 20 of the transistor 536 and a voltage potential (SPD) may be applied to the gate 16 of the transistor 536. The voltages potentials (VSL) and (SPD) may properly bias the transistor 536 of the data sense amplifier latch circuitry 506 for a write operation. The voltage potential (VSL) may remain constant during one or more write operations (e.g., first write operation (Write 1) and a second write operation (Write 2)). In an exemplary embodiment, the voltage potential (VSL) may remain at approximately 2.3V during the first write operation (Write 1) and the second write operation (Write 2). The voltage potential (SPD) may vary during a write operation. In an exemplary embodiment, the voltage potential (SPD) may raise from approximately 1.1V to approximately 2.3V during a first write operation (write 1) and/or a second write operation (Write 2). Another voltage potential (SN) may be applied to the transistors 532 and 534 of the data sense amplifier latch circuitry 506. The voltage potential (SN) applied to the transistors 532 and 534 may vary during a write operation. In an exemplary embodiment, the voltage potential (SN) may raise from approximately 1.1V to approximately 2.3V during a first write operation (Write 1) and/or a second write operation (Write 2).

During a write operation, switch circuitry 514 may be biased in order to couple the data sense amplifier latch circuitry 506 to one or more memory cells 12. During a first write operation (Write 1), a first voltage potential (PASS1) applied to the first switch circuitry 514 may remain constant while a second voltage potential (PASS 2) applied to the second switch circuitry 514 may vary. In an exemplary embodiment, the first voltage potential (PASS1) applied to the first switch circuitry 514 may remain at approximately 2.3V during a first write operation (Write 1). The second voltage potential (PASS 2) applied to the second switch circuitry 514 may raise to approximately 2.3V from 0V.

During a second write operation (Write 2), the first voltage potential (PASS1) applied to the first switch circuitry 514 and a second voltage potential (PASS 2) applied to the second switch circuitry 514 may remain constant. In an exemplary embodiment, the first voltage potential (PASS1) applied to the first switch circuitry 514 may remain at approximately 0V. The second voltage potential (PASS 2) applied to the second switch circuitry 514 may remain at approximately 2.3V during a second write operation (Write 2).

Figure 11B:
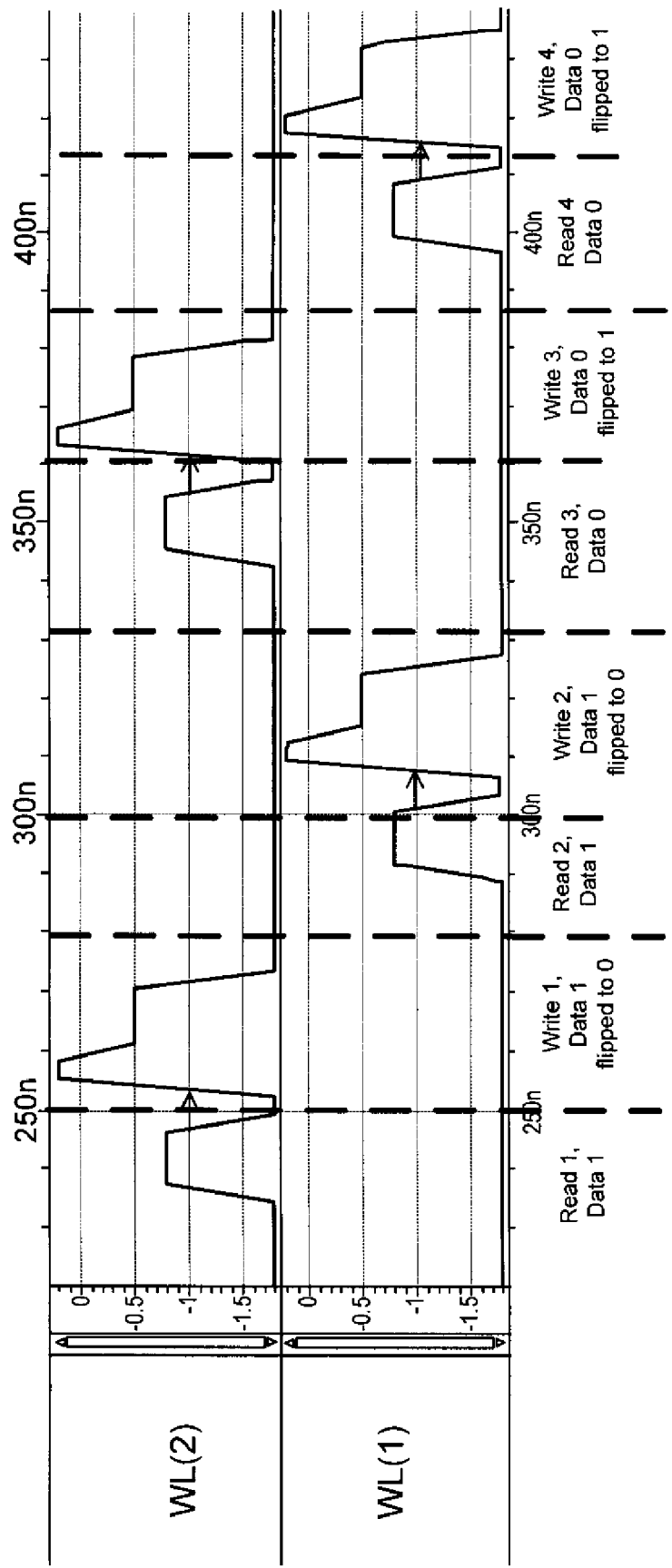

Referring to FIGS. 11A and 11B, there are shown control signal voltage waveforms for refresh operations in accordance with an embodiment of the present disclosure. The control signals may be configured to perform a number of read operations and write operations whereby one or more selected memory cells of one or more selected rows of memory cells 12 may be selectively refreshed. As shown in FIGS. 11A and 11B, the temporally varying control signals to implement four read operations and four write operations including voltage potentials applied to the drain region 22 of the first memory transistor 14 via the bit line (BL) 32 and/or a voltage potential applied to the gate 16 of the first memory transistors 14 via the word line (WL(2)) 28. During a first read operation (Read 1), a data state stored in the electrically floating body region 18 (e.g., FB(1)) of the first memory transistor 14 may be read by applying a voltage potential applied to the drain region 22 of a first memory transistor 14 via the bit line (BL) 32. In an exemplary embodiment, the voltage potential applied to the drain region 22 of a first memory transistor 14 via the bit line (BL) 32 may fall to approximately 2.0V from 2.3V (Read 1). Also, a voltage potential applied to a first memory transistor 14 via a first word line (WL(2)) 28 may vary. In an exemplary embodiment, the voltage potential applied to the gate 16 of a first memory transistor 14 via a first word line (WL(2)) 28 may initially raise to approximately −0.7V for approximately 10 ns before falling to approximately −1.8V for a first read operation.

By properly biasing the memory cells 12 via the bit line (BL) 32 and the word line (WL(2)) 28, majority charge carriers 34 may be generated in the electrically floating body region 18 (e.g., first floating body (FB(1)) shown in FIG. 11A). In an exemplary embodiment, during a first read operation (Read 1), the voltage potential generated at the first floating body region 18 (FB(1)) of the first memory transistor 14 may gradually rise to approximately 0.8V.

During a first write operation, voltage potentials on the bit line (BL) 32 and the word line (WL(2)) 28 may be varied to a predetermined voltage potential to implement the first write operation. In an exemplary embodiment, an opposite data state (e.g., logic low (binary "0" data state)) detected during the first read operation (e.g., logic high (binary "1" data state)) may be written back to the first memory transistor 14. The voltage potentials on the bit line (BL) 32 may vary during a write operation. In an exemplary embodiment, a voltage potential applied to a first memory transistor 14 via a first bit line (BL) 32 may gradually fall to approximately 1.1V for approximately 20 ns before fall again to approximately 0.2V. Also, a voltage potential applied to the first word line (WL(2)) 28 may raise to approximately 0.2V from −1.8V for approximately 5 ns before falling to −0.5V for approximately 10 ns and may subsequently fall back to approximately −1.8V.

The first write operation may be accomplished via a bipolar current and majority charge carriers 34 may be depleted from the electrically floating body region 18 (e.g., FB(1)) of the memory transistor 14 of the memory cell 12 that may be juxtaposed or near the gate dielectric (which is disposed between the gate 16 and the electrically floating body region 18 (e.g., FB(1))). In an exemplary embodiment, a voltage potential at a first floating body region 18 (FB(1)) may fall to approximately 0V from 0.7V.

During a second read operation (Read 2), a data state stored in the electrically floating body region 18 (e.g., FB(0)) of the second memory transistor 14 may be read by applying a voltage potential applied to the drain region 22 of a second memory transistor 14 via the bit line (BLB) 32 may vary. In an exemplary embodiment, the voltage potential applied to the drain region 22 of the second memory transistor 14 via the bit line (BLB) 32 may fall to approximately 2.0V from 2.3V (Read 2). Also, a voltage potential applied to the second memory transistor 14 via a second word line (WL(1)) 28 may vary. In an exemplary embodiment, the voltage potential applied to the gate 16 of a first memory transistor 14 via the second word line (WL(1)) 28 may raise to approximately −0.7V from −1.8V.

By properly biasing the memory cells 12 via the bit line (BLB) 32 and the word line (WL(1)) 28, majority charge carriers 34 may be generated in the electrically floating body region 18 (e.g., second floating body (FB(0)) shown in FIG. 11A). In an exemplary embodiment, during the second read operation (Read 2), the voltage potential generated at the second floating body region 18 (FB(0)) of the second memory transistor 14 may gradually rise to approximately 0.8V.

During a second write operation, voltage potentials on the bit line (BLB) 32 and the word line (WL(1)) 28 may be varied to a predetermined voltage potential to implement the second write operation. In an exemplary embodiment, an opposite data state (e.g., logic low (binary "0" data state)) detected during the second read operation (e.g., logic high (binary "1" data state)) may be written back to the second memory transistor 14. The voltage potentials on the bit line (BLB) 32 may vary during a write operation. In an exemplary embodiment, a voltage potential applied to a second memory transistor 14 via the bit line (BLB) 32 may gradually fall to approximately 1.1V for approximately 20 ns before fall again to approximately 0.2V. Also, a voltage potential applied to the second word line (WL(1)) 28 may raise to approximately 0.2V from −1.8V for approximately 5 ns before falling to −0.5V for approximately 10 ns and may subsequently fall back to approximately −1.8V.

The second write operation may be accomplished via a bipolar current and majority charge carriers 34 may be depleted from the electrically floating body region 18 (e.g., FB(0)) of the memory transistor 14 of the memory cell 12 that may be juxtaposed or near the gate dielectric (which is disposed between the gate 16 and the electrically floating body region 18 (e.g., FB(0))). In an exemplary embodiment, a voltage potential at a second floating body region 18 (FB(0)) may fall to approximately 0V from 0.7V.

During a third read operation (Read 3), a data state stored in the electrically floating body region 18 (e.g., FB(1)) of the first memory transistor 14 may be read by applying a voltage potential applied to the drain region 22 of a first memory transistor 14 via the bit line (BL) 32. In an exemplary embodiment, the voltage potential applied to the drain region 22 of a first memory transistor 14 via the bit line (BL) 32 may rise to approximately 2.3V from 0V (Read 3) and may remain at approximately 2.3V for the third read operation. Also, a voltage potential applied to a first memory transistor 14 via a first word line (WL(2)) 28 may vary. In an exemplary embodiment, the voltage potential applied to the gate 16 of a first memory transistor 14 via a first word line (WL(2)) 28 may initially raise to approximately −0.7V for approximately 10 ns before falling to approximately −1.8V for the third read operation.

By properly biasing the memory cells 12 via the bit line (BL) 32 and the word line (WL(2)) 28, majority charge carriers 34 may be generated in the electrically floating body region 18 (e.g., first floating body (FB(1)) shown in FIG. 11A). For In an exemplary embodiment, during a third read operation (Read 3), the voltage potential generated at the first floating body region 18 (FB(1)) of the first memory transistor 14 may gradually rise to approximately 0.3V. The voltage potential generated at the first electrically floating body 18 (e.g., FB(1)) may indicate that a logic low (binary "0" data state) is stored in the first floating body region 18 (FB(1)).

During a third write operation, voltage potentials on the bit line (BL) 32 and the word line (WL(2)) 28 may be varied to a predetermined voltage potential to implement the third write operation. In an exemplary embodiment, an opposite data state (e.g., logic high (binary "1" data state)) detected during the third read operation (e.g., logic low (binary "0" data state)) may be written back to the first memory transistor 14. The voltage potentials on the bit line (BL) 32 may vary during a write operation. In an exemplary embodiment, a voltage potential applied to a first memory transistor 14 via a first bit line (BL) 32 may maintain a voltage potential of 2.3V for approximately 10 ns before fall to approximately 0V. Also, a voltage potential applied to the first word line (WL(2)) 28 may raise to approximately 0.2V from −1.8V for approximately 5 ns before falling to −0.5V for approximately 10 ns and may subsequently fall back to approximately −1.8V.

The third write operation may be accomplished via a bipolar current and majority charge carriers 34 may be accumulated in the electrically floating body region 18 (e.g., FB(1)) of the memory transistor 14 of the memory cell 12 that may be juxtaposed or near the gate dielectric (which is disposed between the gate 16 and the electrically floating body region 18 (e.g., FB(1))). In an exemplary embodiment, a voltage potential at a first floating body region 18 (FB(1)) may raise to approximately 0.7V.

During a fourth read operation (Read 4), a data state stored in the electrically floating body region 18 (e.g., FB(0)) of the second memory transistor 14 may be read by applying a voltage potential applied to the drain region 22 of the second memory transistor 14 via the bit line (BLB) 32. In an exemplary embodiment, the voltage potential applied to the drain region 22 of the second memory transistor 14 via the bit line (BLB) 32 may rise to approximately 2.3V (Read 4) and may remain at approximately 2.3V for the fourth read operation. Also, a voltage potential applied to a second memory transistor 14 via a second word line (WL(1)) 28 may vary. In an exemplary embodiment, the voltage potential applied to the gate 16 of the second memory transistor 14 via a second word line (WL(1)) 28 may initially raise to approximately −0.7V for approximately 10 ns before falling to approximately −1.8V for a fourth read operation.

By properly biasing the memory cells 12 via the bit line (BLB) 32 and the word line (WL(1)) 28, majority charge carriers 34 may be generated in the electrically floating body region 18 (e.g., first floating body (FB(0)) shown in FIG. 11A). In an exemplary embodiment, during a fourth read operation (Read 4), the voltage potential generated at the second floating body region 18 (FB(0)) of the second memory transistor 14 may gradually rise to approximately 0.3V.

During a fourth write operation, voltage potentials on the bit line (BLB) 32 and the word line (WL(1)) 28 may be varied to a predetermined voltage potential to implement the fourth write operation. In an exemplary embodiment, an opposite data state (e.g., logic high (binary "1" data state)) detected during the fourth read operation (e.g., logic low (binary "0" data state)) may be written back to the second memory transistor 14. The voltage potentials on the bit line (BLB) 32 may vary during a write operation. In an exemplary embodiment, a voltage potential applied to a second memory transistor 14 via a second bit line (BLB) 32 may fall to approximately 0V from 2.3V. Also, a voltage potential applied to the second word line (WL(1)) 28 may raise to approximately 0.2V from −1.8V for approximately 5 ns before falling to −0.5V for approximately 10 ns and may subsequently fall back to approximately −1.8V.

The fourth write operation may be accomplished via a bipolar current and majority charge carriers 34 may be accumulated in the electrically floating body region 18 (e.g., FB(0)) of the second memory transistor 14 of the memory cell 12 that may be juxtaposed or near the gate dielectric (which is disposed between the gate 16 and the electrically floating body region 18 (e.g., FB(0))). In an exemplary embodiment, a voltage potential at a second floating body region 18 (FB(0)) may raise to approximately 0.7V.

Figure 12:
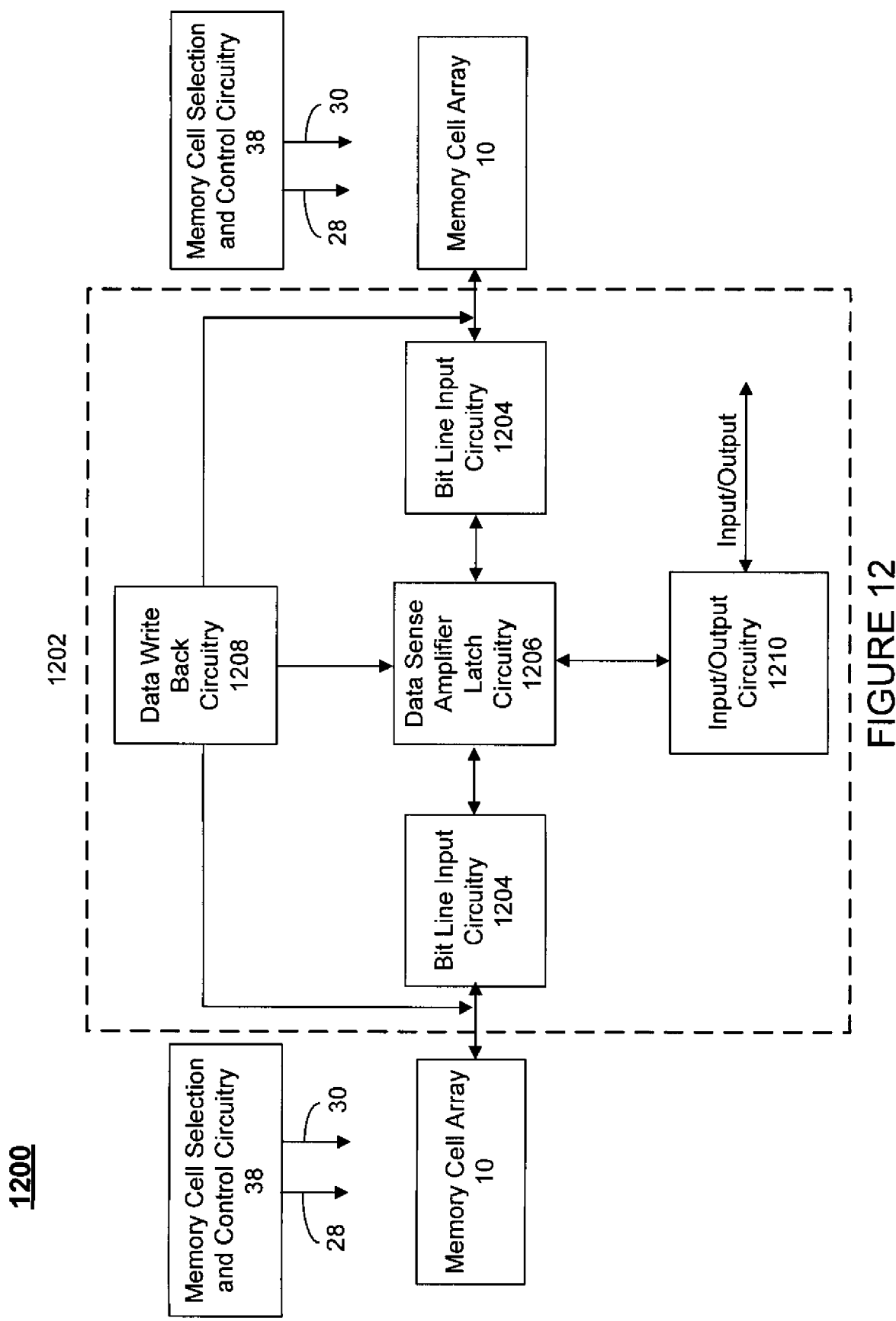
FIG. 12 shows a schematic block diagram of a portion of a semiconductor memory device in accordance with an alternate embodiment of the present invention.

Referring to FIG. 12, there is shown a schematic block diagram of a portion of a semiconductor memory device 1200 in accordance with an alternate embodiment of the present disclosure. The semiconductor memory device 1200 may include data sense circuitry 1202 controllable and/or selectively coupled to one or more memory cell arrays 10 via one or more bit lines 32 (shown in FIG. 3). The data sense circuitry 1202 may include one or more bit line input circuitry 1204 coupled to each memory cell array 10, data sense amplifier latch circuitry 1206, data write back circuitry 1208, and/or input/output circuitry 1210.

The one or more bit line input circuitry 1204 may couple the data sense amplifier latch circuitry 1206 to one or more memory cell arrays 10. Also, the one or more bit line input circuitry 1204 may apply a hold voltage to the memory cell arrays 10 in order to hold data states (e.g., logic high (binary "1" data state) and logic low (binary "0" data state)) stored in the memory cell arrays 10.

The data sense amplifier latch circuitry 1206 may sample, sense, read, and/or determine a logic low (binary "0" data state) or a logic high (binary "1" data state) stored in one or more memory cells 12 (shown in FIG. 3) of one or more memory cell arrays 10. A reference voltage and/or current may be applied to pre-charge the data sense amplifier latch circuitry 1206 before a sample, sense, read, and/or data state determining operation. For example, during a sample, sense, read, and/or data state determining operation, the data sense amplifier latch circuitry 1206 may compare a current generated by a memory cell with an applied pre-charged reference current. In an exemplary embodiment, the pre-charged reference voltage and/or current applied to the data sense amplifier latch circuitry 1206 may have a magnitude between a magnitude of voltage/current that may represent a logic low (binary "0" data state) and a magnitude of voltage/current that may represent a logic high (binary "1" data state) stored in the memory cell 12.

The data write back circuitry 1208 may modify and/or write back a data state determined by the data sense amplifier latch circuitry 1206. In an exemplary embodiment, the data write back circuitry 1208 may restore and/or refresh data states for the plurality of memory cells 12 of the memory cell array 10.

The input/output circuitry 1210 may allow external access to the plurality of memory cells 12 in the plurality of memory cell arrays 10 via the data sense amplifier latch circuitry 1206. The input/output circuitry 1208 may selectively and/or controllably output a data state stored in the memory cells 12 of the memory cell arrays 10. In an exemplary embodiment, the input/output circuitry 1208 may include pass gates and/or column switch circuitry to facilitate and/or implement various operations on the memory cells 12 of the memory cell arrays 10.

The memory cell selection and control circuitry 38 may control one or more selected memory cells 12 of the memory cell arrays 10 coupled to the data sense circuitry 1202. In an exemplary embodiment, the memory cell selection and control circuitry 38 may include a plurality of word lines (WL) 28, a plurality of source lines (SL) 30, word line (WL) decoders and/or drivers, and/or source line (SL) decoders and/or drivers. The memory cell selection and control circuitry 38 may apply one or more control signals via the plurality of word lines (WL) 28 and/or the plurality of source lines (SL) 30. Also, the memory cell selection and control circuitry 38 may include pass gates and/or row switch circuitry (not shown) to selectively activate the memory cells 12 in order to perform various operations.

Figure 13:
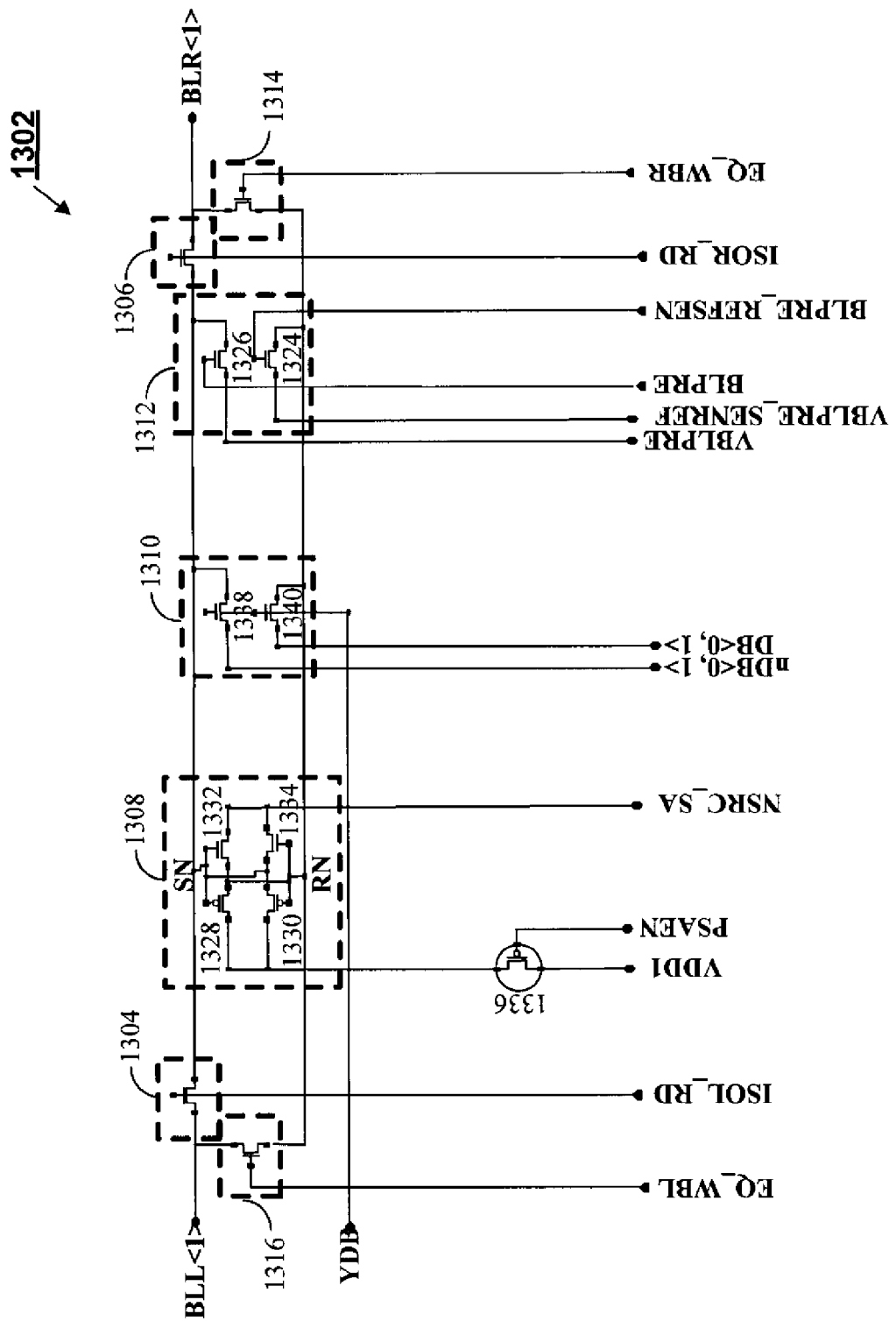
FIG. 13 shows a schematic diagram of data sense circuitry in accordance with an alternate embodiment of the present disclosure.

Referring to FIG. 13, there is shown a schematic diagram of data sense circuitry 1302 in accordance with an embodiment of the present disclosure. The data sense circuitry 1302 may include one or more bit line input circuitry 1304 and 1306 coupled to one or more memory cells 12 (not shown), data sense amplifier latch circuitry 1308, input/output circuitry 1310, pre-charge circuitry 1312, and/or writeback circuitry 1314 and 1316.

Each bit line input circuitry 1304 and 1306 may include a switching transistor coupling the data sense amplifier latch circuitry 1308 to the one or more memory cells 12 (not shown). In an exemplary embodiment, the bit line input circuitry 1304 may be coupled to a memory cell 12 (not shown) via bit line (BL) 32 (e.g., BLL<1>). Also, the bit line input circuitry 1306 may be coupled to a memory cell 12 (not shown) via bit line (BL) 32 (e.g., BLR<1>).

The pre-charge circuitry 1312 may include one or more transistors 1324 and 1326 for setting and/or charging the data sense amplifier latch circuitry 1308 to a reference voltage and/or current before a sample, sense, read, and/or data state determining operation. In an exemplary embodiment, the transistors 1324 and 1326 of the pre-charge circuitry 1312 are biased via different voltage and/or current signals. For example, the transistor 1324 may be biased via inputs VBLPRE_SENREF and/or BLPRE_REFSEN, and the transistor 1326 may be biased via inputs VBLPRE and/or BLPRE.

During operation, the transistors 1324 and 1326 of the pre-charge circuitry 1312 may be biased to "clear" or "reset" the data sense amplifier latch circuitry 1308. In an exemplary embodiment, the data sense amplifier latch circuitry 1308 may have a "history" (residual charges in the data sense amplifier latch circuitry 1308 from previous operations) and the transistors 1324 and 1326 may be biased to "clear" the "history" of the data sense amplifier latch circuitry 1308. After "clearing" or "resetting" the data sense amplifier latch circuitry 1308, the transistor 1324 may be biased in order to provide a reference voltage and/or current to the data sense amplifier latch circuitry 1308.

The data sense amplifier latch circuitry 1308 may include a sense node (SN) coupled to a bit line 32 (e.g., BLL<1> and/or BLR<1>) and a reference node (RN) coupled to the transistor 1324 of the pre-charge circuitry 1312. The sense node (SN) may be set to and/or maintained at a voltage and/or current provided by a memory cell 12 (not shown), while the reference node (RN) may be set to and/or maintained at a reference voltage and/or current provided by the pre-charge circuitry 1312. In an exemplary embodiment, the bit line input circuitry 1306 may turn off and block voltage and/or current from a memory cell 12 (not shown) via a bit line 32 (e.g., BLR<1>). Meanwhile, the bit line input circuitry 1304 may turn on and the sense node (SN) may receive voltage and/or current from a memory cell 12 (not shown) via a bit line 32 (e.g., BLL<1>). In another embodiment, the bit line input circuitry 1304 may turn off and block voltage and/or current from a memory cell 12 (not shown) via a bit line (e.g., BLL<1>). Meanwhile, the bit line input circuitry 1306 may turn on and the sense node (SN) may receive voltage and/or current from a memory cell 12 (not shown) via a bit line 32 (e.g., BLR<1>). The data sense amplifier latch circuitry 1308 may determine a data state based on the voltage and/or current at the sense node (SN) and the voltage and/or current at the reference node (RN).

The voltage and/or current provided by a memory cell 12 at the sense node (SN) and the reference voltage and/or current provided by the pre-charge circuitry 1312 at the reference node (RN) may produce a voltage and/or current differential between the sense node (SN) and the reference node (RN). The data sense amplifier latch circuitry 1308 may include a plurality of transistors 1328-1334 arranged in a cross-coupled configuration that may amplify the voltage and/or current difference between the sense node (SN) and the reference node (RN) in order to determine a data state stored in a memory cell 12 (not shown).

In an exemplary embodiment, in the event that a logic high (binary "1" data state) is stored in a memory cell 12, the voltage and/or current provided by the memory cell 12 at the sense node (SN) may be higher than the reference voltage and/or current provided by the pre-charge circuitry 1312 at the reference node (RN). The voltage and/or current provided by the memory cell 12 may be received at the sense node (SN) and may turn on transistor 1332 to "pull" the reference node (RN) low and may turn off transistor 1334 and may turn on transistor 1330. The sense node (SN) may be "pulled" to a voltage potential (e.g., VDD1 voltage potential) when transistor 1336 is turned on via signal line (PSAEN). In other exemplary embodiments, the transistor 1330 may not turn on until the transistor 1336 is turned on. The signal applied via the signal line (PSAEN) may be pulsed low before the sense node (SN) is switched above a threshold voltage level. In an exemplary embodiment, the voltage potential (VDD1) may be supplied by an independently variable voltage source in order to perform a read operation and/or a write operation. Also, a voltage potential (NSRC_SA) applied to the data sense amplifier latch circuitry 1308 may be coupled via a variable voltage source to an appropriate voltage to perform one or more operations.

In another exemplary embodiment, in the event that a logic low (binary "0" data state) is stored in a memory cell 12, the voltage and/or current provided by the memory cell 12 at the sense node (SN) may be lower than the reference voltage and/or current provided by the pre-charge circuitry 1312 at the reference node (RN). The reference voltage and/or current provided by the pre-charge circuitry 1312 at the reference node (RN) may turn on transistor 1334 to "pull" the sense node (SN) low and may turn off transistor 1332 and may turn on transistor 1328. In an exemplary embodiment, transistor 1328 may not turn on until transistor 1336 is turned on. The reference node (RN) may be "pulled" to a voltage potential (e.g., VDD1 voltage potential) via a signal line (VDD1). The signal applied via the signal line (PSAEN) may be pulsed low before the reference node (RN) is switched above a threshold voltage level.

The data sense amplifier latch circuitry 1308 may sense, sample, and/or determine the data state of a memory cell 12 (not shown), and store the data state in the data sense amplifier latch circuitry 1308. The data state stored in the data sense amplifier latch circuitry 1308 may be read and/or accessed via transistors 1338 and 1340 of the input/output circuitry 1310.

The data state stored in the data sense amplifier latch circuitry 1308 may be written back to a memory cell 12 (not shown) via the writeback circuitry 1314 and/or 1316. In an exemplary embodiment, the data sense amplifier latch circuitry 1308 may output via the reference node (RN) an opposite data state of the data state stored at the sense node (SN) of the data sense amplifier latch circuitry 1308. For example, if a logic low (binary "0" data state) is detected at the sense node (SN) of the data sense amplifier latch circuitry 1308, the data sense amplifier latch circuitry 1308 may output an opposite data state (logic high (binary "1" data state)) via the reference node (RN). In particular, a logic low (binary "0" data state) may be inputted via the one or more bit line input circuitries 1304 and 1306 and/or the input/output circuitry 1310 to the sense node (SN) of the data sense amplifier latch circuitry 1308. The logic low (binary "0" data state) may be detected at the sense node (SN) of the data sense amplifier latch circuitry 1308 and stored. The data sense amplifier latch circuitry 1308 may store and/or output an opposite data state (logic high (binary "1" data state)) at the reference node (RN). The output opposite data state may be written back to a memory cell 12 (not shown) via the writeback circuitry 1314 and/or 1316 and/or input/output circuitry 1310.

Figure 14:
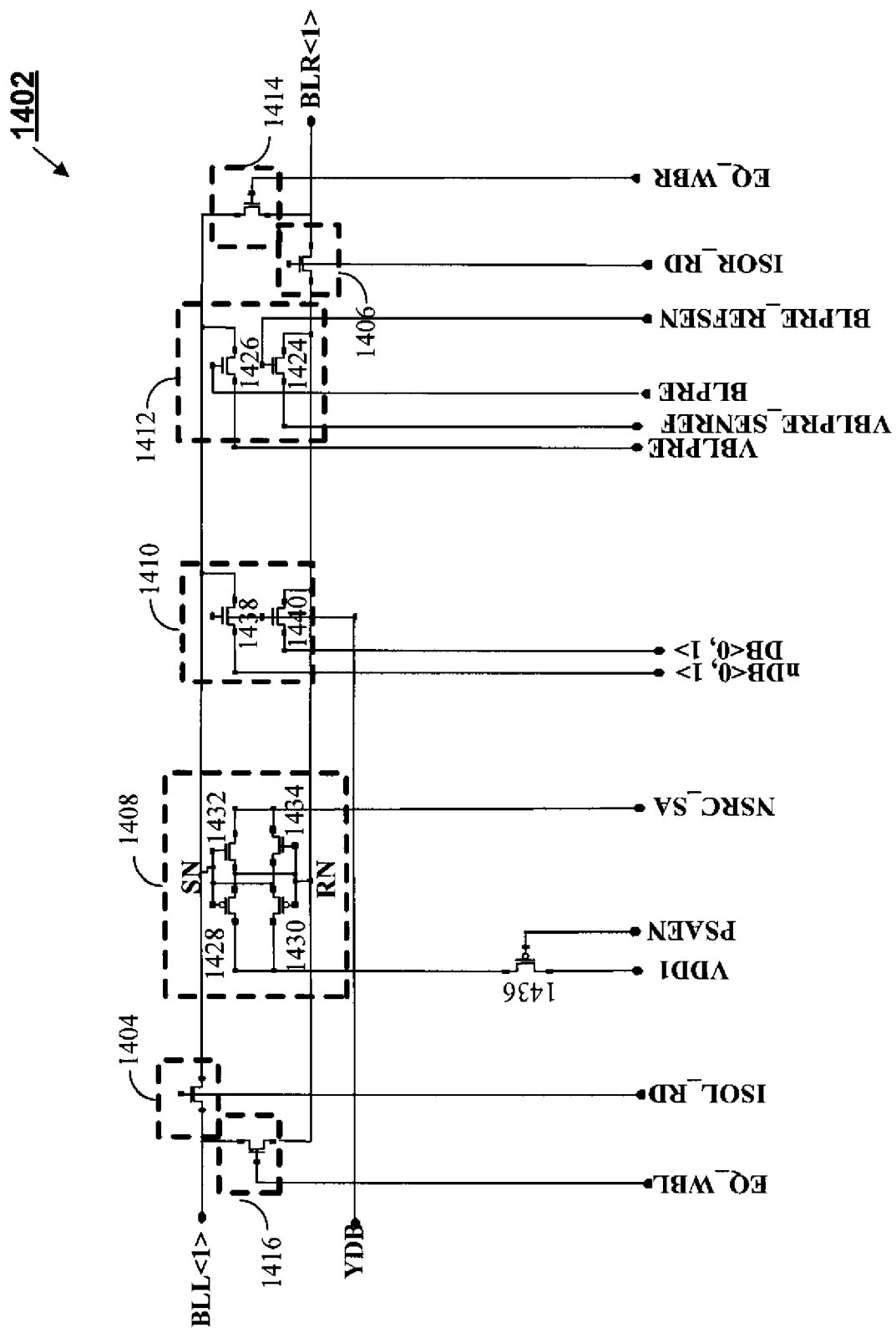
FIG. 14 shows a schematic diagram of data sense circuitry in accordance with an alternate embodiment of the present disclosure.

Referring to FIG. 14, there is shown a schematic diagram of data sense circuitry 1402 in accordance with an alternate embodiment of the present disclosure. The data sense circuitry 1402 may include one or more bit line input circuitry 1404 and 1406 coupled to one or more memory cells 12 (not shown), data sense amplifier latch circuitry 1408, input/output circuitry 1410, pre-charge circuitry 1412, and/or writeback circuitry 1414 and 1416. The data sense circuitry 1402 has a similar schematic configuration and/or components as the data sense circuitry 1302, except that the memory cells 12 (not shown) are coupled to the data sense amplifier circuitry 1408 via different bit lines 32 (e.g., BLL<1> and BLR<1>).

Each bit line input circuitry 1404 and 1406 may include a switching transistor coupling the data sense amplifier latch circuitry 1408 to the one or more memory cells 12 (not shown). In an exemplary embodiment, the bit line input circuitry 1404 may be coupled to a memory cell 12 (not shown) via bit line (BL) (e.g., BLL<1>). Also, the bit line input circuitry 1406 may be coupled to a memory cell 12 (not shown) via a disparate bit line (BL) 32 (e.g., BLR<1>).

The pre-charge circuitry 1412 may include one or more transistors 1424 and 1426 for setting and/or charging the data sense amplifier latch circuitry 1408 to a reference voltage and/or current before a sample, sense, read, and/or data state determining operation. In an exemplary embodiment, the transistors 1424 and 1426 of the pre-charge circuitry 1412 are biased via different voltage and/or current signals. For example, the transistor 1424 may be biased via inputs VBLPRE_SENREF and/or BLPRE_REFSEN, and the transistor 1426 may be biased via inputs VBLPRE and/or BLPRE.

During operation, the transistors 1424 and 1426 of the pre-charge circuitry 1412 may be biased to "clear" or "reset" the data sense amplifier latch circuitry 1408. In an exemplary embodiment, the data sense amplifier latch circuitry 1408 may have a "history" (or residual charges within the data sense amplifier latch circuitry 1408 from previous operations) and the transistors 1424 and 1426 may be biased to "clear" the "history" of the data sense amplifier latch circuitry 1408. After "clearing" or "resetting" the data sense amplifier latch circuitry 1408, the transistor 1424 and/or 1426, may be biased in order to provide a reference voltage and/or current to the data sense amplifier latch circuitry 1408. For example, in the event that the data sense amplifier latch circuitry 1408 receives voltage and/or current from the memory cell 12 (not shown) via bit line 32 (e.g., BLL<1>), the transistor 1424 may be biased in order to provide a reference voltage and/or current to the data sense amplifier latch circuitry 1408. Also, in the event that the data sense amplifier latch circuitry 1408 receives voltage and/or current from the memory cell 12 (not shown) via bit line 32 (e.g., BLR<1>), the transistor 1426 may be biased in order to provide a reference voltage and/or current to the data sense amplifier latch circuitry 1408.

The data sense amplifier latch circuitry 1408 may include a sense node (SN) coupled to a bit line 32 (e.g., BLL<1>) and a reference node (RN) coupled to a bit line 32 (e.g., BLR<1>). The sense node (SN) may be set to and/or maintained at a voltage and/or current provided by a memory cell 12 (not shown), while the reference node (RN) may be set to and/or maintained at a reference voltage and/or current provided by the pre-charge circuitry 1412, and vice-versa. In an exemplary embodiment, the bit line input circuitry 1406 may turn off and block voltage and/or current from a memory cell 12 (not shown) via a bit line 32 (e.g., BLR<1>). Meanwhile, the bit line input circuitry 1404 may turn on and the sense node (SN) may receive voltage and/or current from a memory cell 12 (not shown) via a bit line 32 (e.g., BLL<1>). In another embodiment, the bit line input circuitry 1404 may turn off and block voltage and/or current from a memory cell 12 (not shown) via a bit line 32 (e.g., BLL<1>). Meanwhile, the bit line input circuitry 1406 may turn on and the reference node (RN) may receive voltage and/or current from a memory cell 12 (not shown) via a bit line 32 (e.g., BLR<1>). The data sense amplifier latch circuitry 1408 may determine a data state based on the voltage and/or current at the sense node (SN) and the voltage and/or current at the reference node (RN).

The voltage and/or current at the sense node (SN) and the voltage and/or current at the reference node (RN) may produce a voltage and/or current differential between the sense node (SN) and the reference node (RN) of the data sense amplifier latch circuitry 1408. The data sense amplifier latch circuitry 1408 may include a plurality of transistors 1428-1434 arranged in a cross-coupled configuration that may amplify the voltage and/or current difference between the sense node (SN) and the reference node (RN) in order to determine a data state stored in a memory cell 12 (not shown).

In an exemplary embodiment, in the event that a logic high (binary "1" data state) is stored in a memory cell 12, the voltage and/or current provided by the memory cell 12 at the sense node (SN) may be higher than the reference voltage and/or current provided by the pre-charge circuitry 1412 at the reference node (RN). The voltage and/or current provided by the memory cell 12 may be received at the sense node (SN) and may turn on transistor 1432 to "pull" the reference node (RN) low and may turn off transistor 1434 and may turn on transistor 1430. The sense node (SN) may be "pulled" to a voltage potential (e.g., VDD1 voltage potential) when transistor 1436 is turned on via signal line (PSAEN). In other exemplary embodiments, the transistor 1430 may not turn on until the transistor 1436 is turned on. The signal applied via the signal line (PSAEN) may be pulsed low before the sense node (SN) is switched above a threshold voltage level. In an exemplary embodiment, the voltage potential (VDD1) may be supplied by an independently variable voltage source in order to perform a read operation and/or a write operation. Also, a voltage potential (NSRC_SA) applied to the data sense amplifier latch circuitry 1408 may be coupled via a variable voltage source to an appropriate voltage to perform one or more operations.

In another exemplary embodiment, in the event that a logic low (binary "0" data state) is stored in a memory cell 12, the voltage and/or current provided by the memory cell 12 at the sense node (SN) may be lower than the reference voltage and/or current provided by the pre-charge circuitry 1412 at the reference node (RN). The reference voltage and/or current provided by the pre-charge circuitry 1412 at the reference node (RN) may turn on transistor 1434 to "pull" the sense node (SN) low and may turn off transistor 1432 and may turn on transistor 1428. In an exemplary embodiment, transistor 1428 may not turn on until transistor 1436 is turned on. The reference node (RN) may be "pulled" to a voltage potential (e.g., VDD1 voltage potential) via a signal line (VDD1). The signal applied via the signal line (PSAEN) may be pulsed low before the reference node (RN) is switched above a threshold voltage level. Also, the reference node (RN) of the data sense amplifier latch circuitry 1408 may sense, sample, and/or determine the data state of a memory cell 12 (not shown) and output the detected data state (or opposite of the detected data state) via the sense node (SN).

The data sense amplifier latch circuitry 1408 may sense, sample, and/or determine the data state of a memory cell 12 (not shown), and store the data state in the data sense amplifier latch circuitry 1408. The data state stored in the data sense amplifier latch circuitry 1408 may be read and/or accessed via transistors 1438 and 1440 of the input/output circuitry 1410.

The data state stored in the data sense amplifier latch circuitry 1408 may be written back to a memory cell 12 (not shown) via the writeback circuitry 1414 and/or 1416. In an exemplary embodiment, the data sense amplifier latch circuitry 1408 may output via the reference node (RN) an opposite data state of the data state stored at the sense node (SN) of the data sense amplifier latch circuitry 1408. For example, if a logic low (binary "0" data state) is detected at the sense node (SN) of the data sense amplifier latch circuitry 1408, the data sense amplifier latch circuitry 1408 may output an opposite data state (logic high (binary "1" data state)) via the reference node (RN). In particular, a logic low (binary "0" data state) may be inputted via the one or more bit line input circuitries 1404 and 1406 and/or the input/output circuitry 1410 to the sense node (SN) of the data sense amplifier latch circuitry 1408. The logic low (binary "0" data state) may be detected at the sense node (SN) of the data sense amplifier latch circuitry 1408 and stored. The data sense amplifier latch circuitry 1408 may store and/or output an opposite data state (logic high (binary "1" data state)) at the reference node (RN). The output opposite data state may be written back to a memory cell 12 (not shown) via the writeback circuitry 1414 and/or 1416 and/or input/output circuitry 1410.

Figure 15:
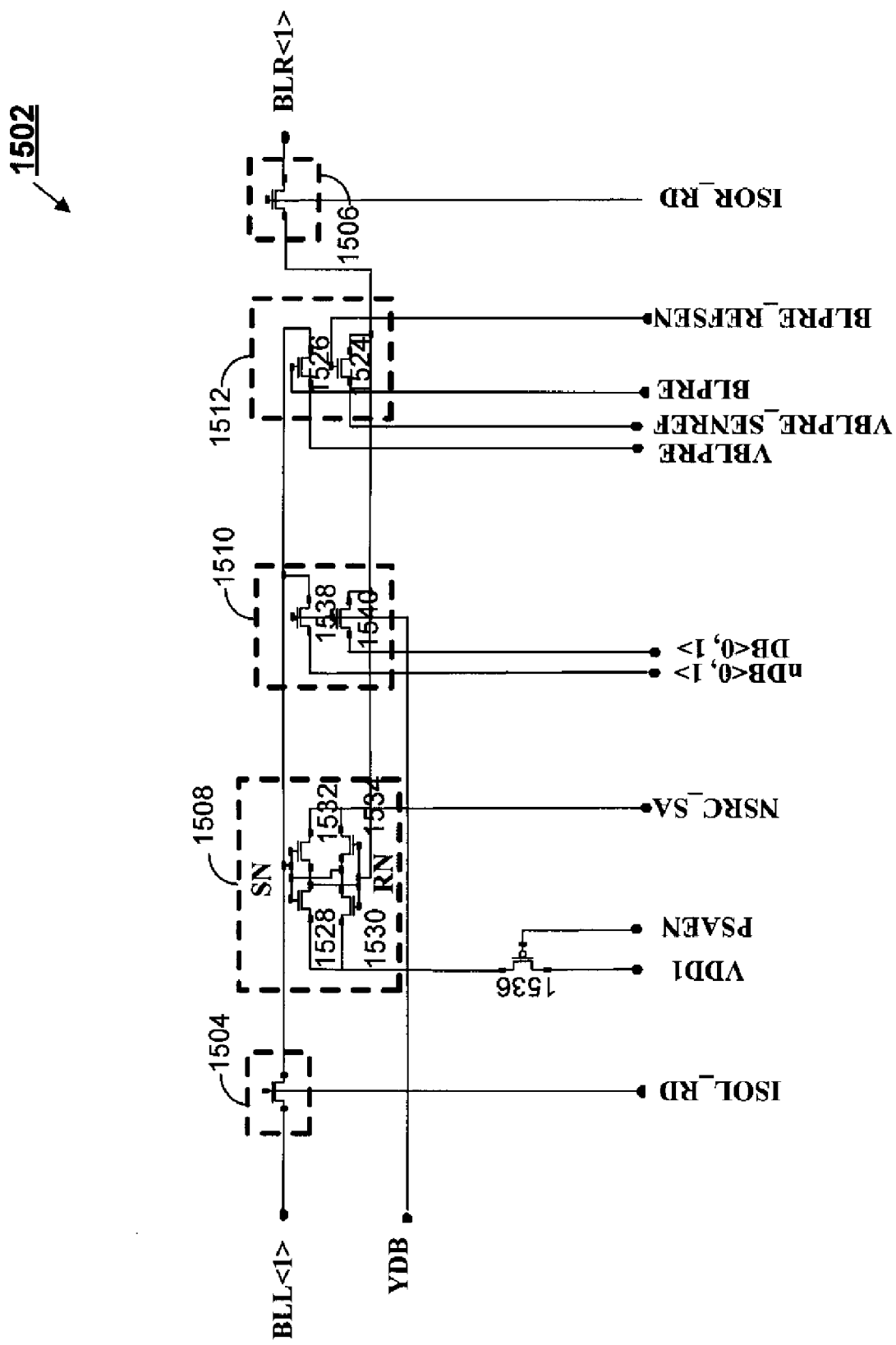
FIG. 15 shows a schematic diagram of data sense circuitry in accordance with an alternate embodiment of the present disclosure.

Referring to FIG. 15, there is shown a schematic diagram of data sense circuitry 1502 in accordance with an alternate embodiment of the present disclosure. The data sense circuitry 1502 may include one or more bit line input circuitry 1504 and 1506 coupled to one or more memory cells 12 (not shown), data sense amplifier latch circuitry 1508, input/output circuitry 1510, and/or pre-charge circuitry 1512. The data sense circuitry 1502 has a similar schematic configuration and/or components as the data sense circuitry 1402, except that the data sense circuitry 1502 does not have writeback circuitry.

Each bit line input circuitry 1504 and 1506 may include a switching transistor coupling the data sense amplifier latch circuitry 1508 to the one or more memory cells 12 (not shown). In an exemplary embodiment, the bit line input circuitry 1504 may be coupled to a memory cell 12 (not shown) via bit line (BL) (e.g., BLL<1>). Also, the bit line input circuitry 1506 may be coupled to a memory cell 12 (not shown) via a disparate bit line (BL) 32 (e.g., BLR<1>).

The pre-charge circuitry 1512 may include one or more transistors 1524 and 1526 for setting and/or charging the data sense amplifier latch circuitry 1508 to a reference voltage and/or current before a sample, sense, read, and/or data state determining operation. In an exemplary embodiment, the transistors 1524 and 1526 of the pre-charge circuitry 1512 are biased via different voltage and/or current signals. For example, the transistor 1524 may be biased via inputs VBL-PRE_SENREF, and/or BLPRE_REFSEN and the transistor 1526 may be biased via inputs VBLPRE and/or BLPRE.

During operation, the transistors 1524 and 1526 of the pre-charge circuitry 1512 may be biased to "clear" or "reset" the data sense amplifier latch circuitry 1508. In an exemplary embodiment, the data sense amplifier latch circuitry 1508 may have a "history" (or residual charges within the data sense amplifier latch circuitry 1508 from previous operations) and the transistors 1524 and 1526 may be biased to "clear" the "history" of the data sense amplifier latch circuitry 1508. After "clearing" or "resetting" the data sense amplifier latch circuitry 1508, the transistor 1524 and/or 1526, may be biased in order to provide a reference voltage and/or current to the data sense amplifier latch circuitry 1508. For example, in the event that the data sense amplifier latch circuitry 1508 receives voltage and/or current from the memory cell 12 (not shown) via bit line 32 (e.g., BLL<1>), the transistor 1524 may be biased in order to provide a reference voltage and/or current to the data sense amplifier latch circuitry 1508. Also, in the event that the data sense amplifier latch circuitry 1508 receives voltage and/or current from the memory cell 12 (not shown) via bit line 32 (e.g., BLR<1>), the transistor 1526 may be biased in order to provide a reference voltage and/or current to the data sense amplifier latch circuitry 1508.

The data sense amplifier latch circuitry 1508 may include a sense node (SN) coupled to a bit line 32 (e.g., BLL<1>) and a reference node (RN) coupled to a bit line 32 (e.g., BLR<1>). The sense node (SN) may be set to and/or maintained at a voltage and/or current provided by a memory cell 12 (not shown), while the reference node (RN) may be set to and/or maintained at a reference voltage and/or current provided by the pre-charge circuitry 1512, and vice-versa. In an exemplary embodiment, the bit line input circuitry 1506 may turn off and block voltage and/or current from a memory cell 12 (not shown) via a bit line (e.g., BLR<1<). Meanwhile, the bit line input circuitry 1504 may turn on and the sense node (SN) may receive voltage and/or current from a memory cell 12 (not shown) via a bit line 32 (e.g., BLL<1>). In another embodiment, the bit line input circuitry 1504 may turn off and block voltage and/or current from a memory cell 12 (not shown) via a bit line 32 (e.g., BLL<1>). Meanwhile, the bit line input circuitry 1506 may turn on and the reference node (RN) may receive voltage and/or current from a memory cell 12 (not shown) via a bit line 32 (e.g., BLR<1>). The data sense amplifier latch circuitry 1508 may determine a data state based on the voltage and/or current at the sense node (SN) and the voltage and/or current at the reference node (RN).

The voltage and/or current at the sense node (SN) and the voltage and/or current at the reference node (RN) may produce a voltage and/or current differential between the sense node (SN) and the reference node (RN) of the data sense amplifier latch circuitry 1508. The data sense amplifier latch circuitry 1508 may include a plurality of transistors 1528-1534 arranged in a cross-coupled configuration that may amplify the voltage and/or current difference between the sense node (SN) and the reference node (RN) in order to determine a data state stored in a memory cell 12 (not shown).

In an exemplary embodiment, in the event that a logic high (binary "1" data state) is stored in a memory cell 12, the voltage and/or current provided by the memory cell 12 at the sense node (SN) may be higher than the reference voltage and/or current provided by the pre-charge circuitry 1512 at the reference node (RN). The voltage and/or current provided by the memory cell 12 may be received at the sense node (SN) and may turn on transistor 1532 to "pull" the reference node (RN) low and may turn off transistor 1534 and may turn on transistor 1530. The sense node (SN) may be "pulled" to a voltage potential (e.g., VDD1 voltage potential) when transistor 1536 is turned on via signal line (PSAEN). In other exemplary embodiments, the transistor 1530 may not turn on until the transistor 1536 is turned on. The signal applied via the signal line (PSAEN) may be pulsed low before the sense node (SN) is switched above a threshold voltage level. In an exemplary embodiment, the voltage potential (VDD1) may be supplied by an independently variable voltage source in order to perform a read operation and/or a write operation. Also, a voltage potential (NSRC_SA) applied to the data sense amplifier latch circuitry 1508 may be coupled via a variable voltage source to an appropriate voltage to perform one or more operations.

In another exemplary embodiment, in the event that a logic low (binary "0" data state) is stored in a memory cell 12, the voltage and/or current provided by the memory cell 12 at the sense node (SN) may be lower than the reference voltage and/or current provided by the pre-charge circuitry 1512 at the reference node (RN). The reference voltage and/or current provided by the pre-charge circuitry 1512 at the reference node (RN) may turn on transistor 1534 to "pull" the sense node (SN) low and may turn off transistor 1532 and may turn on transistor 1528. In an exemplary embodiment, transistor 1528 may not turn on until transistor 1536 is turned on. The reference node (RN) may be "pulled" to a voltage potential (e.g., VDD1 voltage potential) via a signal line (VDD1). The signal applied via the signal line (PSAEN) may be pulsed low before the reference node (RN) is switched above a threshold voltage level. Also, the reference node (RN) of the data sense amplifier latch circuitry 1408 may sense, sample, and/or determine the data state of a memory cell 12 (not shown) and output the detected data state (or opposite of the detected data state) via the sense node (SN).

The data sense amplifier latch circuitry 1508 may sense, sample, and/or determine the data state of a memory cell 12 (not shown), and store the data state in the data sense amplifier latch circuitry 1508. The data state stored in the data sense amplifier latch circuitry 1508 may be read and/or accessed via transistors 1538 and 1540 of the input/output circuitry 1510. Also, the data sense amplifier latch circuitry 1508 may writeback a data state detected. In an exemplary embodiment, the data sense amplifier latch circuitry 1508 may detect a data state of a memory cell 12 (not shown) at the sense node (SN) coupled to the one or more bit line input circuitry 1504 and/or 1506 and stored. Thereafter, the data sense amplifier latch circuitry 1508 may output the data state detected via the sense node (SN) and written back to the memory cell 12 (not shown) via the one or more bit line input circuitry 1504 and 1506.

Referring to FIGS. 16A, 16B, 16C, and 16D there are shown control signal voltage waveforms for various operations in accordance with an embodiment of the present disclosure. The control signal voltage waveforms may be described with reference to the components of the data sense circuitry 1302 as illustrated in FIG. 13. However, it should be appreciated that the control signals voltage waveforms illustrated in FIGS. 16A, 16B, 16C, and 16D may be implemented by the data sense circuitry 1302 illustrated in FIG. 13, the data sense circuitry 1402 illustrated in FIG. 14 and/or the data sense circuitry 1502 illustrated in FIG. 15. For example, one or more data states from data buses (e.g., DB<0,1> and/or nDB<0,1>) may be written to the sense node (SN) and/or the reference node (RN) of a data sense amplifier latch circuitry 1308. The input/output circuitry 1310 may couple the data sense amplifier latch circuitry 1308 to the data buses (e.g., DB<0,1> and/or nDB<0,1>). A voltage potential (YDB) may be applied to the gate of the transistors 1338 and 1340 of the input/output circuitry 1310 to couple the one or more data states on the data buses (e.g., DB<0,1> and/or nDB<0,1>) to the data sense amplifier latch circuitry 1308. In an exemplary embodiment, a logic high (binary "1" data state) may be written to the data sense amplifier latch circuitry 1308 (shown in FIG. 16B). For example, the voltage potential (YDB) applied to the input/output circuitry 1310 may raise to approximately 1.4V from 0V to bias the transistors 1338 and 1340 for coupling the one or more data buses (e.g., DB<0,1> and/or nDB<0,1>) to the data sense amplifier latch circuitry 1308. The sense node (SN) of the data sense amplifier latch circuitry 1308 may receive the data states (e.g., logic high (binary "1" data state)) on the data buses (e.g., DB<0,1> and/or nDB<0,1>). The voltage potential at sense node (SN) of the data sense amplifier latch circuitry 1308 may raise to approximately 1.4V from 0V. The reference node (RN) of the data sense amplifier latch circuitry 1308 may receive a voltage potential opposite/complement of a data state stored in the memory cell 12. For example, when a logic low (binary "0" data state) is stored in the memory cell 12, the reference node (RN) may receive a voltage potential of a logic high (binary "1" data state).

Figure 16A:
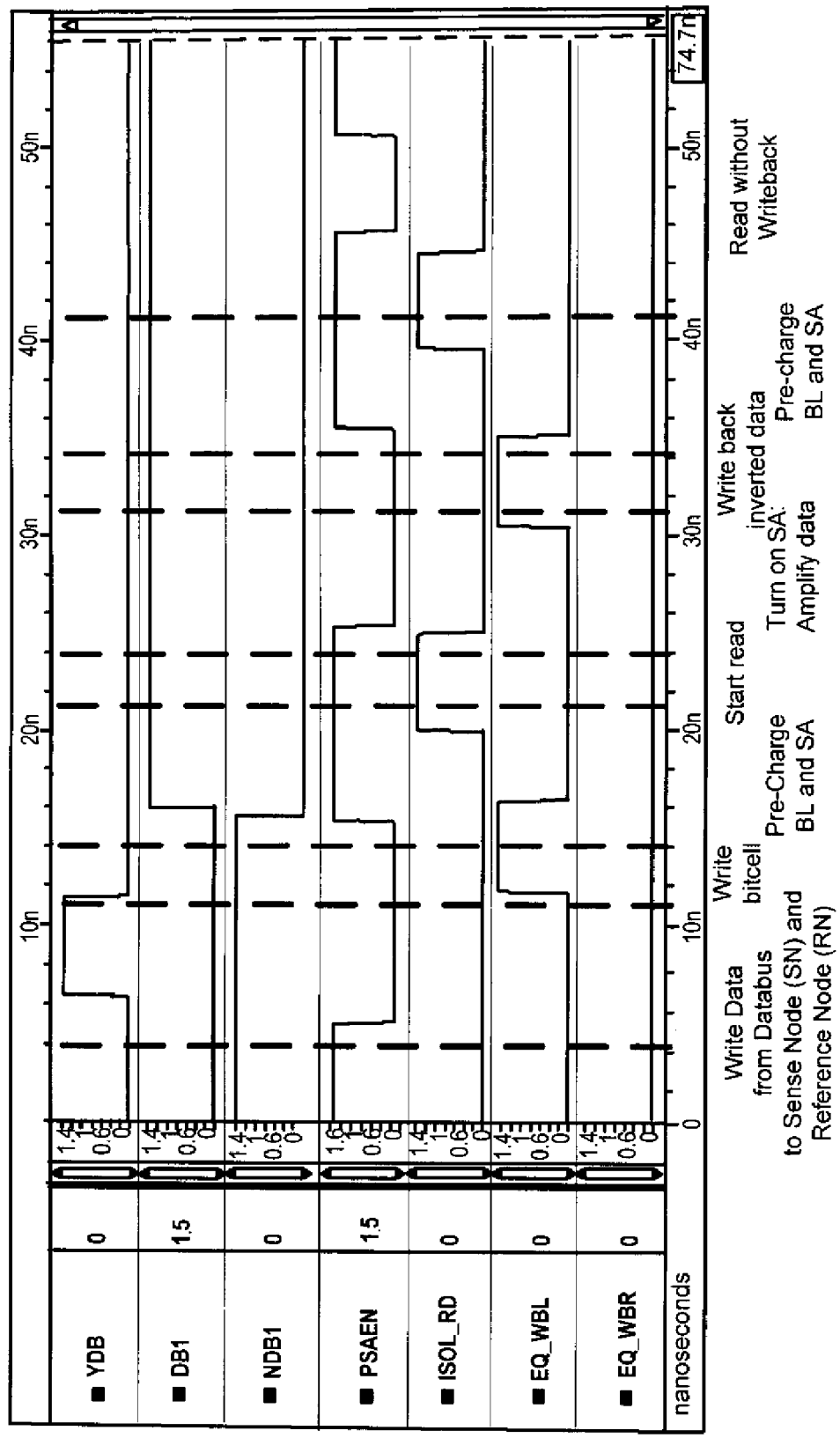
FIGS. 16A, 16B, 16C, and 16D show control signal voltage waveforms for various operations in accordance with an embodiment of the present disclosure.
Figure 16B:
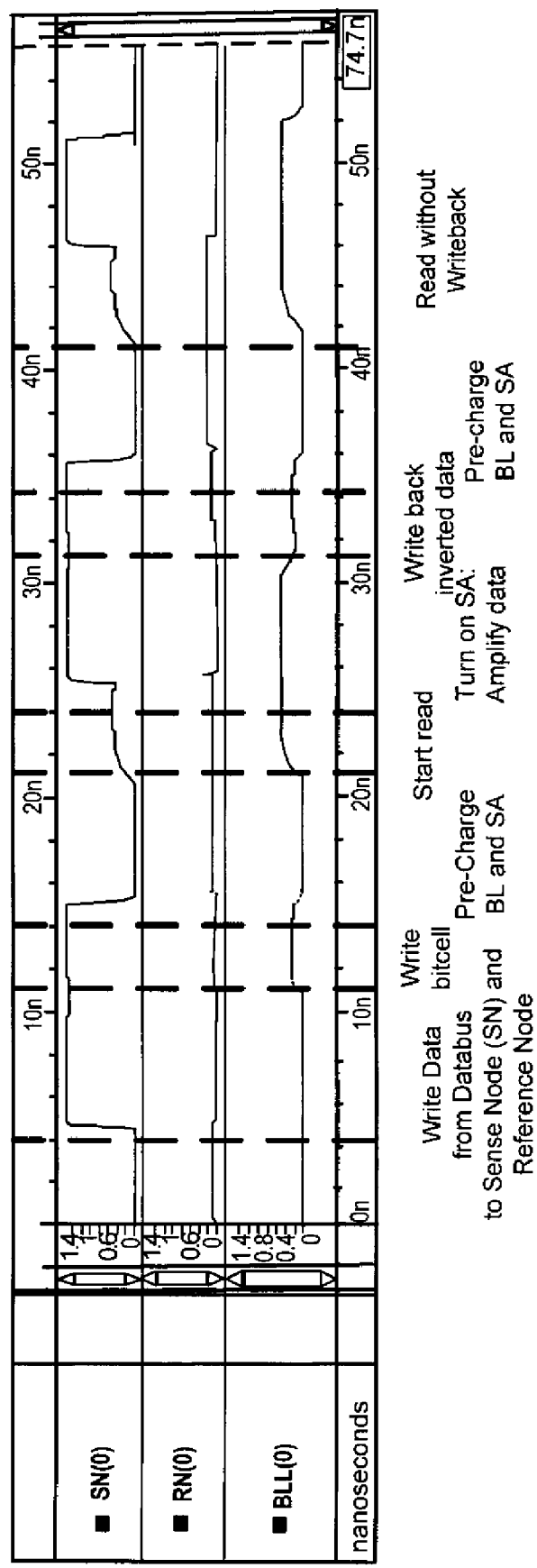
Figure 16C:
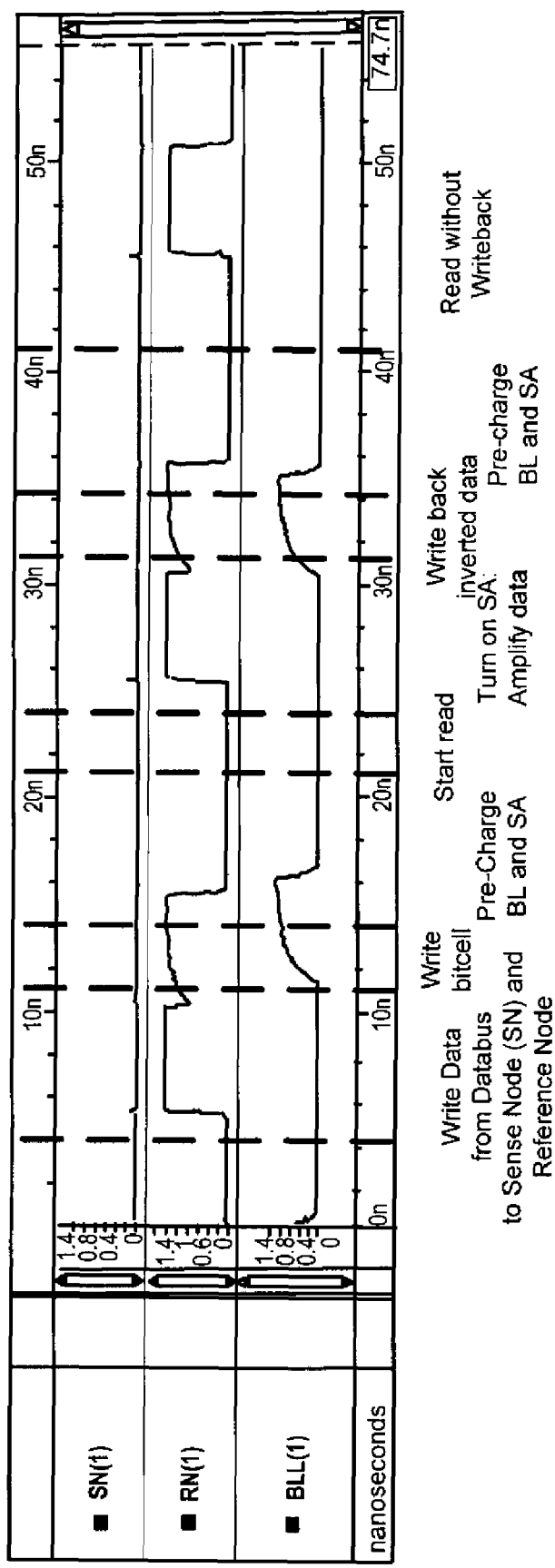
Figure 16D:
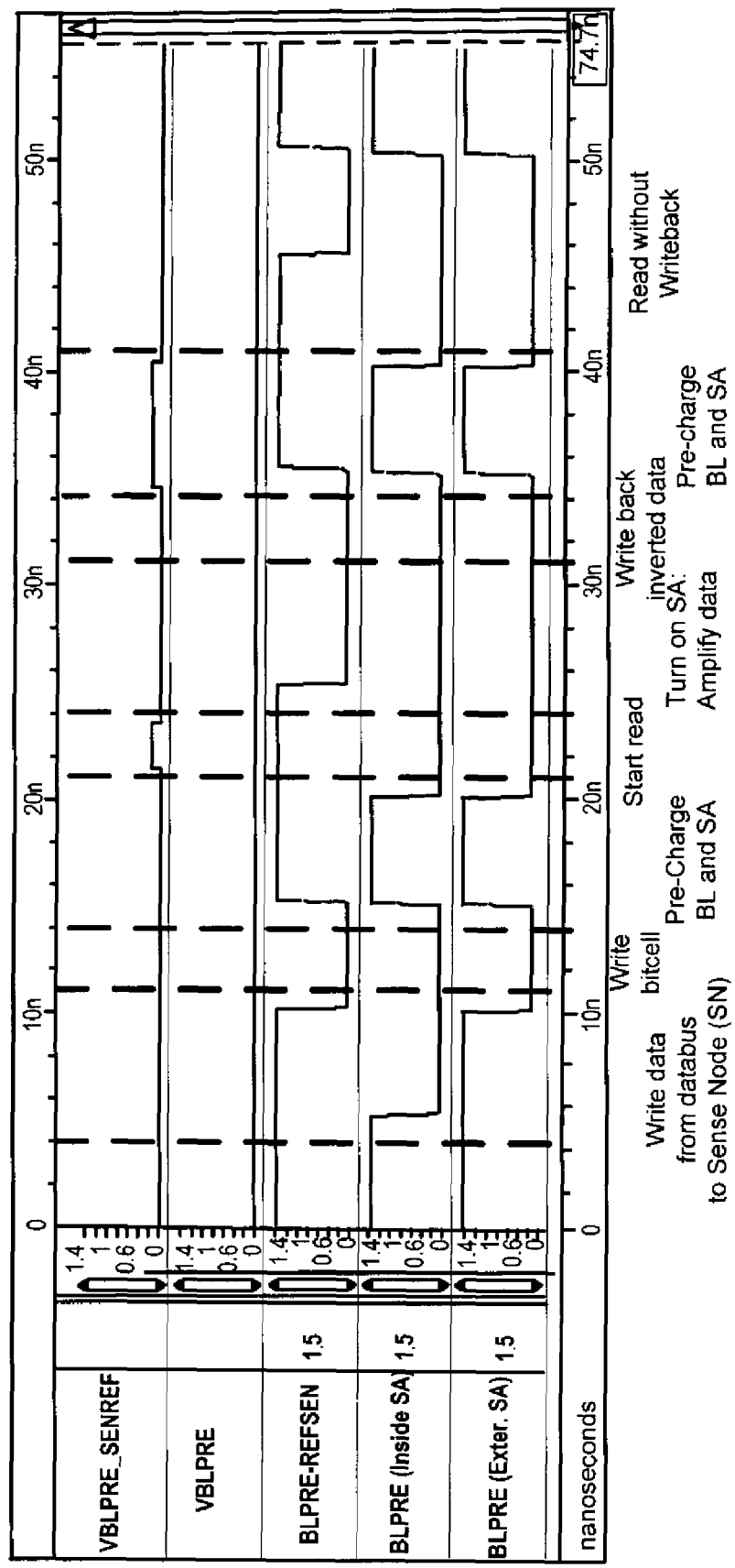

In another exemplary embodiment, a logic low (binary "0" data state) may be written to the data sense amplifier latch circuitry 1308 (as shown in FIG. 16C). As discussed above, the voltage potential (YDB) applied to the input/output circuitry 1310 may raise to approximately 1.4V from 0V for coupling the one or more data buses (e.g., DB<0,1> and/or nDB<0,1> to the data sense amplifier latch circuitry 1308. The sense node (SN) of the data sense amplifier latch circuitry 1308 may receive the data states (e.g., logic low (binary "0" data state)) on the data buses (e.g., DB<0,1> and/or nDB<0,1>). The reference node (RN) data sense amplifier latch circuitry 1308 may receive the opposite/complement data state (e.g., logic high (binary "1" data state)) on the data buses (e.g., DB<0,1> and/or nDB<0,1>). The voltage potential at reference node (RN) of the data sense amplifier latch circuitry 1308 may raise to approximately 1.2V from 0V.

The one or more data states received at the sense node (SN) and/or the reference node (RN) of the data sense amplifier latch circuitry 1308 may be written to one or more memory cells 12. The one or more writeback circuitries 1314 and 1316 may write the one or more data states received at the data sense amplifier latch circuitry 1308 to the one or more memory cells 12. For example, a voltage potential (EQ_WBL) may be applied to the gate 16 of the writeback circuitry 1316. In an exemplary embodiment, the voltage potential (EQ_WBL) may raise to approximately 1.4V from 0V to write the one or more data states from the data sense amplifier latch circuitry 1308 to the memory cell 12. In an exemplary embodiment, when writing a logic low (binary "0" data state), the voltage potential at the sense node (SN) at the data sense amplifier latch circuitry 1308 may be maintained approximately at 0V. The voltage potential at the reference node (RN) may be written to the bit line (BL) 32 (BLL<1>) (as shown in FIG. 16C). As shown in FIG. 16C, the voltage potential on the bit line (BL) 32 (BLL<1>) may gradually raise to approximately 1V. In another exemplary embodiment, when writing a logic high (binary "1" data state), the voltage potential at the sense node (SN) may be maintained approximately at 1.4V and the voltage potential at the reference node (RN) at the data sense amplifier latch circuitry 1308 may be maintained at approximately 0V. The voltage potential at the reference node (RN) of the data sense amplifier latch circuitry 1308 may be written to the bit line (BL) 32 (BLL<1>). As shown in FIG. 16B, the voltage potential on the bit line (BL) 32 (BLL<0>) may be raised to approximately 0.3V and a logic high (binary "1" data state) may be written to the memory cell 12.

The bit line (BL) 32 (e.g., BLL<1> and/or BLR<1>) and the data sense amplifier latch circuitry 1308 may be pre-charged to perform a read operation. The pre-charge circuitry 1312 may precharge the bit line (BL) 32 (e.g., BLL<1> and/or BLR<1>) and/or the data sense amplifier latch circuitry 1308. The transistors 1324 and 1326 of the pre-charge circuitry 1312 may be independently controlled. For example, the transistor 1324 of the pre-charge circuitry 1312 may be independently controlled by a voltage potential (VBLPRE_SENREF) applied to the source region 20 of the transistor 1324 and a voltage potential (BLPRE_REFSEN) applied to the gate 16 of the transistor 1324. Also, the transistor 1326 of the pre-charge circuitry 1312 may be independently controlled by a voltage potential (VBLPRE) applied to the source region 20 of the transistor 1326 and a voltage potential (BLPRE) applied to the gate 16 of the transistor 1326. In an exemplary embodiment, the voltage potential (VBLPRE_SENREF) applied to the source region 20 of the transistor 1324 may remain constant at 0V and the voltage potential (BLPRE_REFSEN) applied to the gate 16 of the transistor 1324 may raise to approximately 1.4V from 0V. Also, the voltage potential (VBLPRE) applied to the source region 20 of the transistor 1326 may remain constant at 0V and a voltage potential (BLPRE) applied to the gate 16 of the transistor 1326 may raise to approximately 1.4V from 0V.

For example, the voltage potential (BLPRE) may be external to the data sense amplifier latch circuitry 1308 wherein the voltage potential (BLPRE) may be isolated from the data sense amplifier latch circuitry 1308 by the one or more bit line input circuitries 1304 and 1306. The external voltage potential (BLPRE) may precharge bit lines (BL) 32 coupled to one or more memory cells 12. Also, the voltage potential (BLPRE) may be internal to the data sense amplifier latch circuitry 1308 wherein the voltage potential (BLPRE) may not be isolated from the data sense amplifier latch circuitry 1308 by the one or more bit line input circuitries 1304 and 1306. The internal voltage potential (BLPRE) may precharge the data sense amplifier latch circuitry 1308 and/or set a reference voltage/current for the data sense amplifier latch circuitry 1308. For example, the internal voltage potential (BLPRE) may set the voltage potential at sense node (SN) and/or the reference node (RN) of the data sense amplifier latch circuitry 1308 to 0V.

A voltage potential (PSAEN) may be applied to the data sense amplifier latch circuitry 1308 via the transistor 1336. The voltage potential (PSAEN) may bias the data amplifier latch circuitry 1308 to perform various functions. For example, the voltage potential (PSAEN) may precharge the data sense amplifier latch circuitry 1308 by raise to approximately 1.6V from 0V.

After precharging the data sense amplifier latch circuitry 1308, the data sense amplifier latch circuitry 1308 may begin read one or more data states from the memory cell 12. A voltage potential (ISOL_RD) may be applied to the bit line input circuitry 1304 in order to couple the data sense amplifier latch circuitry 1308 to the memory cells 12. In an exemplary embodiment, the voltage potential (ISOL_RD) may raise to approximately 1.4V from 0V to couple the data sense amplifier latch circuitry 1308 to the one or more memory cells 12. During the read operation, the voltage potential (PSAEN) applied to the data sense amplifier latch circuitry 1308 may be varied. In an exemplary embodiment, the voltage potential (PSAEN) applied to the data sense amplifier latch circuitry 1308 may fall to approximately 0V from 1.6V. In an exemplary embodiment, when a logic high (binary "1" data state) is stored in a memory cell 12, the voltage potential at the sense node (SN) of the data sense amplifier latch circuitry 1308 may raise from 0V to approximately 1.4V, while the voltage potential at the reference node (RN) may be maintained at approximately 0V and a logic high (binary "1" data state) may be written to the memory cell 12 (see FIG. 16B). Also, the voltage potential on the bit line (BL) 32 (BLL<1>) may remain at approximately 0V. In another exemplary embodiment, when a logic low (binary "0" data state) is stored in a memory cell 12, the voltage potential at the reference node (RN) of the data sense amplifier latch circuitry 1308 may raise from 0V to approximately 1.4V, while the voltage potential at the sense node (SN) may be maintained at approximately 0V. Also, the voltage potential on the bit line (BL) 32 (BLL<0>) may increase to approximately 0.8V. The voltage potential (VBLPRE_SENREF) may be applied to the reference node (RN) of the data sense amplifier latch circuitry 1308 via the transistor 1524 of the pre-charge circuitry 1512 to set a reference voltage potential. For example, the voltage potential (VBLPRE_SENREF) applied to the reference node (RN) of the data sense amplifier latch circuitry 1308 may be 100 mV.

The one or more data states stored in the memory cells 12 may be detected by the data sense amplifier latch circuitry 1308, a writeback operation may be performed to write the detected data states or an opposite of the detected data state back to the memory cells 12. For example, the voltage potential (EQ_WBL) may be applied to the writeback circuitry 1316 to write the detected data states back to the memory cells 12. In an exemplary embodiment, the voltage potential (EQ_WBL) may raise to approximately 1.4V from 0V to enable the writeback circuitry 1316 to perform the writeback operation. The writeback circuitry 1316 may write a detected data state or an inverted detected data state back to the memory cell 12 via bit line (BL) 32. In an exemplary embodiment, when writing a logic high (binary "1" data state) back to a memory cell 12 (e.g., invert of detected logic high (binary "1" data state)), the voltage potential on the bit line (BL) 32 (e.g., BLL<0>) may remain at approximately between 0V to 0.4V. In another exemplary embodiment, when writing a logic low (binary "0" data state) back to a memory cell 12 (e.g., invert of detected logic low (binary "0" data state)), the voltage potential on the bit line (BL) 32 (e.g., BLL<1>) may gradually raise to approximately 0.8V to 1V to write the data state back to the memory cell 12.

The data sense amplifier latch circuitry 1308 may be pre-charged for the second time in order to perform a read operation. The data sense amplifier latch circuitry 1308 may be precharged in a similar manner (e.g., similar voltage potentials) as discussed above. Also, the data sense amplifier latch circuitry 1308 may detect one or more data states of the memory cells 12 in a similar manner as discussed above, however a write back operation does not have to be performed after the read operation.

At this point it should be noted that reading from and/or writing to a semiconductor memory device in accordance with the present disclosure as described above typically involves the generation of control signals to some extent. This control signal generation may be implemented in hardware or software. For example, specific electronic components may be employed in a semiconductor memory device or similar or related circuitry for implementing the functions associated with reading from and/or writing to the semiconductor memory device in accordance with the present disclosure as described above. Alternatively, one or more processors operating in accordance with instructions may implement the functions associated with reading from and/or writing to a semiconductor memory device in accordance with the present disclosure as described above. If such is the case, it is within the scope of the present disclosure that such instructions may be stored on one or more processor readable storage media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. An apparatus comprising:
a first memory cell array comprising a first plurality of memory cells arranged in a matrix of rows and columns;
a second memory cell array comprising a second plurality of memory cells arranged in a matrix of row and columns;
a data sense amplifier latch circuitry comprising a first input node and a second input node;
a first bit line input circuitry configured to couple the first memory cell array to the first input node of the data sense amplifier latch circuitry;
a second bit line input circuitry configured to couple the second memory cell array to the second input node of the data sense amplifier latch circuitry;
a precharge circuitry coupled to the first input node and the second input node for precharging the first input node and the second input node to a first pre-charged voltage level and a second pre-charged voltage level; and
a keeper circuitry coupled to the first bit line input circuitry and the second bit line input circuitry for maintaining the first pre-charged voltage level at the first input node and the second pre-charged voltage level at the second input node, respectively.

2. The apparatus according to claim 1, wherein the data sense amplifier latch circuitry further comprises a plurality of transistors arranged in a cross-coupled configuration that are configured to amplify a voltage or current difference between the first input node and the second input node.

3. The apparatus according to claim 1, wherein the first bit line input circuitry is configured to couple the first memory cell array to the first input node of the data sense amplifier latch circuitry via a first bit line.

4. The apparatus according to claim 3, wherein the second bit line input circuitry is configured to couple the second memory cell array to the second input node of the data sense amplifier latch circuitry via a second bit line.

5. The apparatus according to claim 1, wherein the first bit line input circuitry comprises a switch circuitry configured to couple the data sense amplifier latch circuitry to the first memory cell array and a hold circuitry coupled to the first memory cell array to maintain one or more data states stored in the first memory cell array.

6. The apparatus according to claim 5, wherein the second bit line input circuitry comprises a switch circuitry configured to couple the data sense amplifier latch circuitry to the second memory cell array and a hold circuitry coupled to the second memory cell array to maintain one or more data states stored in the second memory cell array.

7. The apparatus according to claim 1, wherein the precharge circuitry has a first transistor configured to pre-charge the first input node of the data sense amplifier latch circuitry and a second transistor configured to pre-charge the second input node of the data sense amplifier latch circuitry.

8. The apparatus according to claim 1, further comprising an input/output circuitry coupled to the data sense amplifier latch circuitry configured to output one or more data states of at least one of the first memory cell array and the second memory cell array detected by the data sense amplifier latch circuitry.

9. The apparatus according to claim 8, wherein the input/output circuitry comprises a first transistor coupled to the first input node of the data sense amplifier latch circuitry and a second transistor coupled to the second input node of the data sense amplifier latch circuitry.

10. The apparatus according to claim 1, wherein the keeper circuitry comprises a first transistor coupled to the first bit line input circuitry and the first memory cell array and a second transistor coupled to the second bit line input circuitry and the second memory cell array.

11. The apparatus according to claim 1, further comprising a first writeback circuitry coupled to the first memory cell array and the data sense amplifier latch circuitry.

12. The apparatus according to claim 11, further comprising a second writeback circuitry coupled to the second memory cell array and the data sense amplifier latch circuitry.

13. The apparatus according to claim 1, wherein the first bit line input circuitry is configured to couple the first memory cell array to the data sense amplifier latch circuitry via a bit line and the second bit line input circuitry is configured to couple the second memory cell array to the data sense amplifier latch circuitry via the bit line.

14. A method for reading from and writing to a semiconductor memory device comprising:
arranging a first plurality of memory cells in a matrix of rows and columns in a first memory cell array;
arranging a second plurality of memory cells in a matrix of row and columns in a second memory cell array;

coupling the first memory cell array to a first input node of a data sense amplifier latch circuitry via a first bit line input circuitry;

coupling the second memory cell array to a second input node of the data sense amplifier latch circuitry via a second bit line input circuitry;

coupling a precharge circuitry to the first input node and the second input node for precharging the first input node and the second input node to a first pre-charged voltage level and a second pre-charged voltage level, respectively; and coupling a keeper circuitry to the first bit line input circuitry and the second bit line input circuitry for maintaining the first pre-charged voltage level at the first input node and the second pre-charged voltage level at the second input node, respectively.

15. The method according to claim 14, further comprising coupling an input/output circuitry to the data sense amplifier latch circuitry to output one or more data states of at least one of the first memory cell array and the second memory cell array detected by the data sense amplifier latch circuitry.

16. The method according to claim 14, further comprising coupling a first writeback circuitry to the first memory cell array and the data sense amplifier latch circuitry to perform a write operation.

17. The method according to claim 16, further comprising coupling a second writeback circuitry to the second memory cell array and the data sense amplifier latch circuitry to perform a write operation.

18. The method according to claim 14, wherein coupling the first memory cell array to the first input node of the data sense amplifier latch circuitry is via a bit line and coupling the second memory cell array to the second input node of the data sense amplifier latch circuitry is via the bit line.

19. An apparatus comprising:
a first memory cell array comprising a first plurality of memory cells arranged in a matrix of rows and columns;
a second memory cell array comprising a second plurality of memory cells arranged in a matrix of row and columns;
a data sense amplifier latch circuitry comprising a first input node and a second input node;
a first bit line input circuitry configured to couple the first memory cell array to the first input node of the data sense amplifier latch circuitry;
a second bit line input circuitry configured to couple the second memory cell array to the second input node of the data sense amplifier latch circuitry;
a precharge circuitry coupled to the first input node and the second input node for precharging the first input node and the second input node to a first pre-charged voltage level and a second pre-charged voltage level, respectively; and
a writeback circuitry coupled to the first bit line input circuitry and the second bit line input circuitry for writing a data state stored in the data sense amplifier latch circuitry back to at least one first memory cell in the first plurality of memory cells and at least one second memory cell in the second plurality of memory cells, respectively.

20. A method for reading from and writing to a semiconductor memory device comprising:
arranging a first plurality of memory cells in a matrix of rows and columns in a first memory cell array;
arranging a second plurality of memory cells in a matrix of row and columns in a second memory cell array;
coupling the first memory cell array to a first input node of a data sense amplifier latch circuitry via a first bit line input circuitry;
coupling the second memory cell array to a second input node of the data sense amplifier latch circuitry via a second bit line input circuitry;
coupling a precharge circuitry to the first input node and the second input node for precharging the first input node and the second input node to a first pre-charged voltage level and a second pre-charged voltage level, respectively; and
coupling a writeback circuitry to the first bit line input circuitry and the second bit line input circuitry for writing a data state stored in the data sense amplifier latch circuitry back to at least one first memory cell in the first plurality of memory cells and at least one second memory cell in the second plurality of memory cells, respectively.

21. The apparatus according to claim 5, wherein the hold circuitry in the first bit line input circuitry comprises a transistor to provide a predetermined retention time for a data state stored in the first memory cell array.

22. The apparatus according to claim 6, wherein the hold circuitry in the second bit line input circuitry comprises a transistor to provide a predetermined retention time for a data state stored in the second memory cell array.

* * * * *